US012588475B2

(12) United States Patent
Bhadauriya et al.

(10) Patent No.: US 12,588,475 B2
(45) Date of Patent: Mar. 24, 2026

(54) HIGH SELECTIVITY DOPED HARDMASK FILMS

(71) Applicant: Lam Research Corporation, Fremont, CA (US)

(72) Inventors: Sonal Bhadauriya, Beaverton, OR (US); Ragesh Puthenkovilakam, Portland, OR (US); Kapu Sirish Reddy, Portland, OR (US); Seshasayee Varadarajan, Lake Oswego, OR (US); Shruti Vivek Thombare, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 133 days.

(21) Appl. No.: 18/559,783

(22) PCT Filed: May 11, 2022

(86) PCT No.: PCT/US2022/028845
§ 371 (c)(1),
(2) Date: Nov. 8, 2023

(87) PCT Pub. No.: WO2022/241042
PCT Pub. Date: Nov. 17, 2022

(65) Prior Publication Data

US 2025/0132157 A1 Apr. 24, 2025

Related U.S. Application Data

(60) Provisional application No. 63/201,839, filed on May 14, 2021.

(51) Int. Cl.
*H01L 21/033* (2006.01)
*C23C 16/06* (2006.01)
(Continued)

(52) U.S. Cl.
CPC .... *H01L 21/0332* (2013.01); *H01J 37/32926* (2013.01); *C23C 16/06* (2013.01); *C23C 16/505* (2013.01); *H01J 2237/3321* (2013.01)

(58) Field of Classification Search
None
See application file for complete search history.

(56) References Cited

U.S. PATENT DOCUMENTS 1,012,671 A 12/1911 Long
5,502,005 A 3/1996 Mikagi
(Continued)

FOREIGN PATENT DOCUMENTS

CN 1332267 A 1/2002
CN 1675402 A 9/2005
(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
(Continued)

*Primary Examiner* — Shamim Ahmed
(74) *Attorney, Agent, or Firm* — Weaver Austin Villeneuve & Sampson LLP

(57) ABSTRACT

The present disclosure relates to high selectivity doped hardmask films, as well as methods of providing and using such films. In particular examples, the high selectivity doped hardmask film can be employed as a hardmask, an intermediate layer, or a coverage layer.

20 Claims, 7 Drawing Sheets

(51) Int. Cl.
*H01J 37/32* (2006.01)
*C23C 16/505* (2006.01)

(56) References Cited

U.S. PATENT DOCUMENTS

| | | | |
|---|---|---|---|
| 5,612,254 | A | 3/1997 | Mu et al. |
| 5,643,394 | A | 7/1997 | Maydan et al. |
| 5,863,836 | A | 1/1999 | Jones |
| 6,103,609 | A | 8/2000 | Lee et al. |
| 6,271,084 | B1 | 8/2001 | Tu et al. |
| 6,284,653 | B1 | 9/2001 | Tseng |
| 6,306,216 | B1 | 10/2001 | Kim et al. |
| 6,359,160 | B1 | 3/2002 | Sun et al. |
| 6,635,965 | B1 | 10/2003 | Lee et al. |
| 6,794,287 | B2 | 9/2004 | Saanila et al. |
| 6,844,258 | B1 | 1/2005 | Fair et al. |
| 6,905,543 | B1 | 6/2005 | Fair et al. |
| 6,958,174 | B1 | 10/2005 | Klaus et al. |
| 6,979,625 | B1 | 12/2005 | Woo et al. |
| 7,005,372 | B2 | 2/2006 | Levy et al. |
| 7,141,494 | B2 | 11/2006 | Lee et al. |
| 7,250,367 | B2 | 7/2007 | Vaartstra et al. |
| 7,262,125 | B2 | 8/2007 | Wongsenakhum et al. |
| 7,560,581 | B2 | 7/2009 | Gordon et al. |
| 7,589,017 | B2 | 9/2009 | Chan et al. |
| 7,691,749 | B2 | 4/2010 | Levy et al. |
| 7,772,114 | B2 | 8/2010 | Chan et al. |
| 7,955,972 | B2 | 6/2011 | Chan et al. |
| 7,993,457 | B1 | 8/2011 | Krotov et al. |
| 8,053,365 | B2 | 11/2011 | Humayun et al. |
| 8,058,170 | B2 | 11/2011 | Chandrashekar et al. |
| 8,089,128 | B2 | 1/2012 | Ramaswamy et al. |
| 8,101,521 | B1 | 1/2012 | Gao et al. |
| 8,119,527 | B1 | 2/2012 | Chadrashekar et al. |
| 8,278,216 | B1 | 10/2012 | Alers et al. |
| 9,076,646 | B2 | 7/2015 | Sims et al. |
| 9,082,826 | B2 | 7/2015 | Chandrashekar et al. |
| 9,159,571 | B2 | 10/2015 | Humayun et al. |
| 9,175,023 | B2 | 11/2015 | Odedra et al. |
| 9,236,297 | B2 | 1/2016 | Chen et al. |
| 9,548,266 | B2 | 1/2017 | Ajuria et al. |
| 9,583,385 | B2 | 2/2017 | Lee et al. |
| 9,595,470 | B2 | 3/2017 | Bamnolker et al. |
| 9,613,818 | B2 | 4/2017 | Ba et al. |
| 9,653,353 | B2 | 5/2017 | Chandrashekar et al. |
| 9,659,998 | B1 | 5/2017 | Lung |
| 9,899,372 | B1 | 2/2018 | Bi et al. |
| 9,978,605 | B2 | 5/2018 | Bamnolker et al. |
| 10,014,185 | B1 | 7/2018 | Wu et al. |
| 10,079,144 | B2 | 9/2018 | Kim et al. |
| 10,094,021 | B2 | 10/2018 | Lansalot-Matras et al. |
| 10,096,475 | B1 * | 10/2018 | Shaikh .............. H01L 21/31144 |
| 10,121,671 | B2 | 11/2018 | Fu et al. |
| 10,283,404 | B2 | 5/2019 | Na et al. |
| 10,395,984 | B2 | 8/2019 | Backes et al. |
| 10,505,111 | B1 | 12/2019 | Ok et al. |
| 10,510,590 | B2 | 12/2019 | Thombare et al. |
| 10,510,951 | B1 | 12/2019 | Yu et al. |
| 10,566,211 | B2 | 2/2020 | Chandrashekar et al. |
| 10,573,522 | B2 | 2/2020 | Jandl et al. |
| 10,622,375 | B2 | 4/2020 | Chun et al. |
| 10,643,826 | B2 | 5/2020 | Kim et al. |
| 10,643,904 | B2 | 5/2020 | Xie et al. |
| 10,731,250 | B2 | 8/2020 | Kim et al. |
| 10,734,238 | B2 | 8/2020 | Zhou et al. |
| 10,777,453 | B2 | 9/2020 | Thombare et al. |
| 10,995,405 | B2 | 5/2021 | Dezelah et al. |
| 11,211,253 | B2 | 12/2021 | Zhou et al. |
| 11,295,980 | B2 * | 4/2022 | Zope ................. H01L 21/76876 |
| 11,355,345 | B2 | 6/2022 | Jandl et al. |
| 11,549,175 | B2 | 1/2023 | Butail et al. |
| 11,821,071 | B2 | 11/2023 | Blakeney |
| 11,970,776 | B2 | 4/2024 | Collins et al. |
| 12,074,029 | B2 | 8/2024 | Van Cleemput et al. |
| 12,148,623 | B2 | 11/2024 | Van Cleemput et al. |
| 12,327,762 | B2 | 6/2025 | Schloss et al. |
| 12,334,351 | B2 | 6/2025 | Na et al. |
| 12,351,914 | B2 | 7/2025 | Collins et al. |
| 12,362,188 | B2 | 7/2025 | Jandl et al. |
| 2001/0002326 | A1 | 5/2001 | Yang et al. |
| 2002/0009872 | A1 | 1/2002 | Hoshino et al. |
| 2002/0024140 | A1 | 2/2002 | Nakajima et al. |
| 2002/0045355 | A1 | 4/2002 | Chong et al. |
| 2003/0019428 | A1 | 1/2003 | Ku et al. |
| 2003/0082296 | A1 | 5/2003 | Elers et al. |
| 2003/0194825 | A1 | 10/2003 | Law et al. |
| 2003/0209193 | A1 | 11/2003 | Van Wijck |
| 2004/0087143 | A1 | 5/2004 | Norman et al. |
| 2004/0202786 | A1 | 10/2004 | Wongsenakhum et al. |
| 2005/0031786 | A1 | 2/2005 | Lee et al. |
| 2005/0186342 | A1 | 8/2005 | Sager et al. |
| 2005/0212139 | A1 | 9/2005 | Leinikka et al. |
| 2005/0277296 | A1 | 12/2005 | Adetutu et al. |
| 2005/0282384 | A1 | 12/2005 | Nawafune et al. |
| 2006/0040052 | A1 | 2/2006 | Fang et al. |
| 2006/0046521 | A1 | 3/2006 | Vaartstra et al. |
| 2006/0102950 | A1 | 5/2006 | Takebuchi et al. |
| 2006/0115590 | A1 | 6/2006 | Suzuki et al. |
| 2007/0009658 | A1 | 1/2007 | Yoo et al. |
| 2007/0066060 | A1 | 3/2007 | Wang |
| 2007/0077712 | A1 | 4/2007 | Joo et al. |
| 2007/0190780 | A1 | 8/2007 | Chung et al. |
| 2007/0215852 | A1 | 9/2007 | Lung |
| 2007/0232015 | A1 | 10/2007 | Liu |
| 2008/0014352 | A1 | 1/2008 | Xi et al. |
| 2008/0061282 | A1 | 3/2008 | Sato et al. |
| 2008/0116437 | A1 | 5/2008 | Oh et al. |
| 2008/0124926 | A1 | 5/2008 | Chan et al. |
| 2008/0170984 | A1 | 7/2008 | Tenne et al. |
| 2008/0197335 | A1 | 8/2008 | Yu |
| 2008/0206987 | A1 | 8/2008 | Gelatos et al. |
| 2008/0227291 | A1 | 9/2008 | Lai et al. |
| 2008/0254623 | A1 | 10/2008 | Chan et al. |
| 2008/0268642 | A1 | 10/2008 | Yanagita et al. |
| 2008/0274617 | A1 | 11/2008 | Milligan |
| 2008/0280390 | A1 | 11/2008 | Kim et al. |
| 2008/0303014 | A1 | 12/2008 | Goux et al. |
| 2008/0317972 | A1 | 12/2008 | Hendriks et al. |
| 2009/0004848 | A1 | 1/2009 | Kim et al. |
| 2009/0053893 | A1 | 2/2009 | Khandelwal et al. |
| 2009/0081374 | A1 | 3/2009 | Yang et al. |
| 2009/0149022 | A1 | 6/2009 | Chan et al. |
| 2009/0212280 | A1 | 8/2009 | Werner et al. |
| 2009/0239368 | A1 | 9/2009 | Park et al. |
| 2009/0304914 | A1 | 12/2009 | Nalla et al. |
| 2010/0107927 | A1 | 5/2010 | Stewart et al. |
| 2010/0159694 | A1 | 6/2010 | Chandrashekar et al. |
| 2010/0167527 | A1 | 7/2010 | Wu et al. |
| 2010/0168404 | A1 | 7/2010 | Girolami et al. |
| 2010/0176512 | A1 | 7/2010 | Yang et al. |
| 2010/0207245 | A1 | 8/2010 | Cheng et al. |
| 2010/0213541 | A1 | 8/2010 | Jeon et al. |
| 2010/0227473 | A1 | 9/2010 | Matsuda et al. |
| 2010/0320607 | A1 | 12/2010 | Suzuki |
| 2011/0020546 | A1 | 1/2011 | Hamalainen et al. |
| 2011/0021024 | A1 | 1/2011 | Calvo-Munoz et al. |
| 2011/0146568 | A1 | 6/2011 | Haukka et al. |
| 2011/0151615 | A1 | 6/2011 | Gordon et al. |
| 2011/0155993 | A1 | 6/2011 | Chen |
| 2011/0223763 | A1 | 9/2011 | Chan et al. |
| 2011/0256645 | A1 | 10/2011 | Tam et al. |
| 2011/0256726 | A1 | 10/2011 | LaVoie et al. |
| 2011/0287184 | A1 | 11/2011 | Shenai-Khatkhate et al. |
| 2012/0045589 | A1 | 2/2012 | Ivanov et al. |
| 2012/0119177 | A1 | 5/2012 | Erbetta |
| 2012/0187305 | A1 | 7/2012 | Elam et al. |
| 2012/0231626 | A1 | 9/2012 | Lee et al. |
| 2012/0305872 | A1 | 12/2012 | Yoon |
| 2013/0109172 | A1 | 5/2013 | Collins et al. |
| 2013/0164928 | A1 | 6/2013 | Lim et al. |
| 2013/0189837 | A1 | 7/2013 | Haukka et al. |
| 2013/0270703 | A1 | 10/2013 | Zierath et al. |
| 2013/0302980 | A1 | 11/2013 | Chandrashekar et al. |
| 2014/0106083 | A1 | 4/2014 | Wu et al. |

(56) References Cited

U.S. PATENT DOCUMENTS

2014/0138604 A1 5/2014 Liu et al.
2014/0147589 A1 5/2014 Khandelwal et al.
2014/0217590 A1 8/2014 Nalla et al.
2014/0284801 A1 9/2014 Kitamura et al.
2014/0370192 A1 12/2014 Odedra et al.
2015/0170961 A1 6/2015 Romero et al.
2015/0179461 A1 6/2015 Bamnolker et al.
2015/0262939 A1 9/2015 Sakata
2015/0325475 A1 11/2015 Bamnolker et al.
2015/0348840 A1 12/2015 Bamnolker et al.
2015/0354064 A1 12/2015 Kolics et al.
2016/0027614 A1 1/2016 Manna et al.
2016/0040289 A1 2/2016 Gatineau et al.
2016/0056074 A1 2/2016 Na et al.
2016/0064409 A1 3/2016 Yaegashi
2016/0077435 A1 3/2016 Ban et al.
2016/0104624 A1 4/2016 Fu et al.
2016/0109800 A1 4/2016 Bae et al.
2016/0118345 A1 4/2016 Chen et al.
2016/0141419 A1 5/2016 Baenninger et al.
2016/0168699 A1 6/2016 Fukazawa et al.
2016/0172211 A1 6/2016 Demos et al.
2016/0181149 A1 6/2016 Deng
2016/0181272 A1 6/2016 Rabkin et al.
2016/0225632 A1 8/2016 Shaikh et al.
2016/0233220 A1 8/2016 Danek et al.
2016/0300952 A1 10/2016 Toriumi et al.
2016/0309596 A1 10/2016 Shaviv et al.
2016/0343612 A1 11/2016 Wang et al.
2016/0351401 A1 12/2016 Ba et al.
2016/0351444 A1 12/2016 Schloss et al.
2017/0040214 A1 2/2017 Lai et al.
2017/0062224 A1 3/2017 Fu et al.
2017/0062714 A1 3/2017 Kau
2017/0069527 A1 3/2017 Haukka et al.
2017/0117155 A1 4/2017 Bamnolker et al.
2017/0125548 A1 5/2017 Hung et al.
2017/0170026 A1 6/2017 Hudson et al.
2017/0178899 A1 6/2017 Kabansky et al.
2017/0213901 A1 7/2017 Ho et al.
2017/0229341 A1 8/2017 Chang et al.
2017/0268107 A1 9/2017 Lansalot-Matras et al.
2017/0294381 A1 10/2017 Briggs et al.
2017/0306479 A1 10/2017 Raisanen et al.
2017/0306490 A1 10/2017 Chan et al.
2017/0350008 A1 12/2017 Collins et al.
2017/0358482 A1 12/2017 Chen et al.
2018/0019165 A1 1/2018 Baum et al.
2018/0053660 A1 2/2018 Jandl et al.
2018/0142345 A1 5/2018 Meng et al.
2018/0151497 A1 5/2018 Makala et al.
2018/0166276 A1 6/2018 Nakao et al.
2018/0218902 A1* 8/2018 Venkatasubramanian .................. H01L 21/31111
2018/0240675 A1 8/2018 Bamnolker et al.
2018/0240676 A1 8/2018 Chan et al.
2018/0247832 A1 8/2018 Fischer et al.
2018/0261503 A1 9/2018 Meng et al.
2018/0286668 A1 10/2018 Baum et al.
2018/0294187 A1 10/2018 Thombare et al.
2018/0342390 A1 11/2018 Xiao et al.
2018/0347041 A1 12/2018 Kim et al.
2018/0355484 A1 12/2018 Lansalot-Matras et al.
2019/0003050 A1 1/2019 Dezelah et al.
2019/0006226 A1 1/2019 Khare et al.
2019/0019725 A1 1/2019 Chandrashekar et al.
2019/0067003 A1 2/2019 Zope et al.
2019/0067014 A1 2/2019 Shrestha et al.
2019/0067094 A1 2/2019 Zope et al.
2019/0067095 A1 2/2019 Zhu et al.
2019/0088474 A1 3/2019 Macdonald et al.
2019/0088555 A1 3/2019 Xie et al.
2019/0157102 A1 5/2019 Jian et al.
2019/0157141 A1 5/2019 Liao et al.
2019/0161853 A1 5/2019 Aoyama et al.
2019/0177838 A1 6/2019 Cadot et al.
2019/0189456 A1 6/2019 Mullick et al.
2019/0189688 A1 6/2019 Lille
2019/0226086 A1 7/2019 Wright, Jr. et al.
2019/0256467 A1 8/2019 Anthis et al.
2019/0273019 A1 9/2019 Mullick et al.
2019/0282384 A1 9/2019 Phillips
2019/0368039 A1 12/2019 Arteaga et al.
2019/0371662 A1 12/2019 Chen et al.
2020/0006073 A1 1/2020 Smith et al.
2020/0010954 A1 1/2020 Bhuyan et al.
2020/0075403 A1 3/2020 Thombare et al.
2020/0105515 A1 4/2020 Maes et al.
2020/0111675 A1 4/2020 Takatsuki et al.
2020/0115798 A1 4/2020 Wright, Jr. et al.
2020/0144066 A1 5/2020 Jandl et al.
2020/0152870 A1 5/2020 Lin et al.
2020/0194670 A1 6/2020 Allegra
2020/0199743 A1 6/2020 Wright, Jr. et al.
2020/0219933 A1 7/2020 Cheng
2020/0227275 A1 7/2020 Mullick et al.
2020/0242209 A1 7/2020 Bowes et al.
2020/0332416 A1 10/2020 Fluit
2020/0343136 A1 10/2020 Yu et al.
2020/0365456 A1 11/2020 Thombare et al.
2020/0402846 A1 12/2020 Collins et al.
2021/0047726 A1 2/2021 Liu et al.
2021/0057223 A1 2/2021 Stevens et al.
2021/0082750 A1 3/2021 Yu et al.
2021/0098532 A1 4/2021 Wu
2021/0123136 A1 4/2021 Kalutarage et al.
2021/0140043 A1 5/2021 Thombare et al.
2021/0151352 A1 5/2021 Zope et al.
2021/0238736 A1 8/2021 Butail et al.
2021/0277517 A1 9/2021 Liu et al.
2021/0285102 A1 9/2021 Yoon et al.
2021/0313183 A1 10/2021 Ba et al.
2021/0320034 A1 10/2021 Lei et al.
2021/0348271 A1 11/2021 Mishra et al.
2021/0407809 A1 12/2021 Zope et al.
2022/0013365 A1 1/2022 Van Cleemput et al.
2022/0018017 A1 1/2022 Kim et al.
2022/0037163 A1 2/2022 Yang et al.
2022/0044929 A1 2/2022 Xiao et al.
2022/0139713 A1 5/2022 Färm et al.
2022/0170155 A1 6/2022 Blakeney
2022/0195598 A1 6/2022 Collins et al.
2022/0220136 A1 7/2022 Leoncini et al.
2022/0220139 A1 7/2022 Leoncini et al.
2022/0220607 A1 7/2022 Leoncini et al.
2022/0223471 A1 7/2022 Thombare et al.
2022/0262640 A1 8/2022 Jandl et al.
2022/0285211 A1 9/2022 Färm et al.
2022/0298624 A1 9/2022 Blakeney et al.
2022/0325410 A1 10/2022 Yoon et al.
2022/0328317 A1 10/2022 Na et al.
2022/0356579 A1 11/2022 Collins et al.
2022/0359211 A1 11/2022 Van Cleemput et al.
2022/0375792 A1 11/2022 Schloss et al.
2022/0389579 A1 12/2022 Thombare et al.
2023/0290680 A1 9/2023 Collins et al.
2023/0298896 A1 9/2023 Veber et al.
2023/0326790 A1 10/2023 Tarafdar et al.
2024/0052486 A1 2/2024 Blakeney
2024/0136192 A1 4/2024 Schloss et al.
2024/0234152 A9 7/2024 Schloss et al.
2024/0271281 A1 8/2024 Collins et al.
2024/0297075 A1 9/2024 Thombare et al.
2024/0401196 A1 12/2024 Thombare et al.
2025/0029840 A1 1/2025 Van Cleemput et al.
2025/0038003 A1 1/2025 Mandia et al.
2025/0069948 A1 2/2025 Mandia et al.
2025/0179635 A1 6/2025 Thombare et al.
2025/0183097 A1 6/2025 Lai et al.
2025/0226227 A1 7/2025 Austin et al.
2025/0246434 A1 7/2025 Lee et al.
2025/0259894 A1 8/2025 Griffiths et al.
2025/0285920 A1 9/2025 Schloss et al.
2025/0287675 A1 9/2025 Mahenderkar et al.

(56) References Cited

U.S. PATENT DOCUMENTS

2025/0323045 A1 10/2025 Jandl et al.
2025/0323046 A1 10/2025 Na et al.
2025/0382703 A1 12/2025 Fox et al.

FOREIGN PATENT DOCUMENTS

CN 1957446 A 5/2007
CN 101308794 A 11/2008
CN 101752299 A 6/2010
CN 101207019 B 12/2010
CN 102206387 A 10/2011
CN 102206387 B 4/2014
CN 104272441 A 1/2015
CN 104752339 A 7/2015
CN 105097446 A 11/2015
CN 105280549 A 1/2016
CN 106575626 A 4/2017
CN 107305838 A 10/2017
CN 107710443 A 2/2018
CN 107768304 A 3/2018
CN 108597983 A 9/2018
CN 109072424 A 12/2018
CN 109563621 A 4/2019
CN 109661481 A 4/2019
EP 1167567 A1 1/2002
EP 1728894 A1 12/2006
EP 1806352 A1 7/2007
JP S595246 A 1/1984
JP H02231714 A 9/1990
JP H03131023 A 6/1991
JP H10176273 A 6/1998
JP H11238736 A 8/1999
JP 2001172049 A 6/2001
JP 2001257177 A 9/2001
JP 2001274105 A 10/2001
JP 2001284360 A 10/2001
JP 3302108 B2 7/2002
JP 2003528215 A 9/2003
JP 2005150416 A 6/2005
JP 2006511716 A 4/2006
JP 2007019375 A 1/2007
JP 2007182443 A 7/2007
JP 2008205219 A 9/2008
JP 2008211183 A 9/2008
JP 2011035366 A 2/2011
JP 2012246531 A 12/2012
JP 2014074190 A 4/2014
JP 2014511380 A 5/2014
JP 2015021175 A 2/2015
JP 2016072587 A 5/2016
JP 2016098406 A 5/2016
JP 2016516892 A 6/2016
JP 2016164131 A 9/2016
JP 2017053024 A 3/2017
JP 2017525156 A 8/2017
JP 2018035375 A 3/2018
JP 2019502253 A 1/2019
JP 2019044266 A 3/2019
JP 2019527302 A 9/2019
JP 2019186508 A 10/2019
JP 2019192906 A 10/2019
JP 2020029618 A 2/2020
JP 2020043139 A 3/2020
JP 2020059916 A 4/2020
JP 2020513065 A 4/2020
JP 2021503551 A 2/2021
JP 2021523983 A 9/2021
JP 2021535575 A 12/2021
JP 7485736 B2 5/2024
KR 0138381 B1 6/1998
KR 20030043201 A 6/2003
KR 100477840 B1 6/2005
KR 20050054122 A 6/2005
KR 20070073636 A 7/2007
KR 20100068845 A 6/2010
KR 20100096488 A 9/2010
KR 20110014069 A 2/2011
KR 20110024932 A 3/2011
KR 20140034081 A 3/2014
KR 20150005533 A 1/2015
KR 20150063562 A 6/2015
KR 20150077376 A 7/2015
KR 20150108780 A 9/2015
KR 20150128615 A 11/2015
KR 20160015157 A 2/2016
KR 20160072054 A 6/2016
KR 20160098986 A 8/2016
KR 20170042297 A 4/2017
KR 101745074 B1 6/2017
KR 20170095801 A 8/2017
KR 20170120498 A 10/2017
KR 20180009702 A 1/2018
KR 20180018372 A 2/2018
KR 20180019487 A 2/2018
KR 20180114159 A 10/2018
KR 20180118055 A 10/2018
KR 20190009245 A 1/2019
KR 20190024823 A 3/2019
KR 20190024834 A 3/2019
KR 20190024841 A 3/2019
KR 20190028743 A 3/2019
KR 20190086054 A 7/2019
KR 20190130046 A 11/2019
KR 20200026711 A 3/2020
KR 20200056543 A 5/2020
KR 20200076757 A 6/2020
KR 20200078423 A 7/2020
KR 20200090108 A 7/2020
KR 20200140923 A 12/2020
KR 20210016063 A 2/2021
KR 20210156444 A 12/2021
TW 201123305 A 7/2011
TW 201542857 A 11/2015
TW 201705490 A 2/2017
TW 201710543 A 3/2017
TW 201718942 A 6/2017
TW 201738405 A 11/2017
TW 201741325 A 12/2017
TW 201812069 A 4/2018
TW 201812070 A 4/2018
TW 201907037 A 2/2019
TW 201911378 A 3/2019
TW 201920736 A 6/2019
TW 201920740 A 6/2019
TW 202030861 A 8/2020
TW 202039911 A 11/2020
WO WO-2006036865 A2 4/2006
WO WO-2007005088 A2 1/2007
WO WO-2012047591 A1 4/2012
WO WO-2014052642 A1 4/2014
WO WO-2015023404 A1 2/2015
WO WO-2016191432 A1 12/2016
WO WO-2017070634 A1 4/2017
WO WO-2017091571 A1 6/2017
WO WO-2017143246 A1 8/2017
WO WO-2018191183 A1 10/2018
WO WO-2019036214 A1 2/2019
WO WO-2019099233 A1 5/2019
WO WO-2019118684 A1 6/2019
WO WO-2019232344 A1 12/2019
WO WO-2020023790 A1 1/2020
WO WO-2020028587 A1 2/2020
WO WO-2020101336 A1 5/2020
WO WO-2020106649 A1 5/2020
WO WO-2020159882 A1 8/2020
WO WO-2020185618 A1 9/2020
WO WO-2021035236 A1 2/2021
WO WO-2021046058 A1 3/2021
WO WO-2021076636 A1 4/2021
WO WO-2021178399 A1 9/2021
WO WO-2021237032 A1 11/2021
WO WO-2022108762 A1 5/2022

(56) References Cited

FOREIGN PATENT DOCUMENTS

WO WO-2022150270 A1 7/2022
WO WO-2022221210 A1 10/2022
WO WO-2023114648 A1 6/2023

OTHER PUBLICATIONS

Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
Chinese First Office Action dated Jan. 4, 2021 issued in Application No. CN 201710700258.6.
Chinese Second Office Action dated Jun. 17, 2021 issued in Application No. CN 201710700258.6.
Chiu, H. et al., "Deposition of Molybdenum Carbonitride Thin Films from $Mo(NBu^t)_2(NHBu^t)_2$", J. Mater. Res, Jul. 1994, vol. 9, No. 7, pp. 1622-1624.
CN Office Action dated Dec. 28, 2023 in CN Application No. 202080059499.7 with EnglishTranslation.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Jan. 18, 2024 in CN Application No. 202080020646.X with English translation.
CN Office Action dated Nov. 17, 2022, in Application No. CN202080011300.3 with English translation.
CN Office Action dated Sep. 24, 2023, in Application No. CN202080020646.X with English translation.
CN Office Action dated Sep. 28, 2023, in application No. CN201980049916.7 with English translation.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Coventor Brochure "3D NAND: Challenges Beyond 96-Layer Memory Arrays", Oct. 12, 2018, pp. 1-4.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
Dominique, S. et al., "An alternative to Tungsten in 3D-NAND technology", IEEE International Interconnect Technology Conference (IITC), 2021, pp. 1-3.
EP Extended European Search report dated Dec. 14, 2023, in Application No. EP20854552.5.
EP Partial Supplementary European Search report dated Sep. 13, 2023, in Application No. EP20854552.5.
Final Office Action dated May 23, 2019 issued in U.S. Appl. No. 15/948,143.
Final Office Action dated Sep. 2, 2021 issued in U.S. Appl. No. 16/947,286.
Gall D., "Electron Mean Free Path in Elemental Metals," Journal of Applied Physics, Feb. 23, 2016, vol. 119, 6 Pages.
International Preliminary Report on Patentability dated Dec. 1, 2022, in PCT Application No. PCT/US2021/033564.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Search Report and Written Opinion dated Sep. 9, 2021 in Application No. PCT/US2021/033564.
International Preliminary Report on Patentability and Written Opinion dated Nov. 23, 2023 in PCT Application No. PCT/US2022/028845.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jul. 20, 2023, in PCT Application No. PCT/US2022/011053.
International Preliminary Report on Patentability dated Jun. 1, 2023, in Application No. PCT/US2021/058099.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Preliminary Report on Patentability dated Sep. 23, 2021 issued in Application No. PCT/US2020/021543.
International Search Report and Written Opinion dated Apr. 7, 2023 in PCT Application No. PCT/US2022/080705.
International Search Report and Written Opinion dated Apr. 25, 2022, for International Application No. PCT/US2022/011053.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in Application No. PCT/US2023/019000.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Jul. 1, 2020 in Application No. PCT/US2020/021543.
International Search Report and Written Opinion dated Jul. 27, 2018 in Application No. PCT/US2018/026746.

(56) References Cited

OTHER PUBLICATIONS

International Search Report and Written Opinion dated Jun. 19, 2023, in Application No. PCT/US2023/062877.
International Search Report and Written Opinion dated Jun. 3, 2020, issued in Application No. PCT/US2020/015241.
International Search Report and Written Opinion dated Mar. 3, 2022, in Application No. PCT/US2021/058099.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
International Search Report and Written Opinion dated Oct. 17, 20223 in PCT Application No. PCT/US2023/069018.
International Search Report and Written Opinion dated Sep. 6, 2023, in Application No. PCT/US2023/023023.
International Search Report and Written Opinion dated Sep. 7, 2022 in Application No. PCT/US2022/028845.
Ishihara, S., et al., "MOCVD of Monolayer MoS2 using Novel Molybdenum Precursor i-Pr2DADMo(CO)3," Materials Research Society, 2018, vol. 3, pp. 379-384.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
JP Office Action dated Dec. 12, 2023 in JP Application No. 2021-527153 with English Translation.
JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jun. 6, 2023 in Application No. JP2020561743 With English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 5, 2023, in Application No. JP2022-145721 with English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Office Action dated Dec. 15, 2023 in KR Application No. 10-2023-7028915, with English Translation.
KR Office Action dated Feb. 21, 2022, in Application No. KR10-2017-0102113 with English Translation.
KR Office Action dated Jan. 27, 2023 in Application No. KR10-2017-0102113 with English Translation.
KR Office Action dated Jul. 28, 2023, in Application No. KR10-2023-0081299 with English Translation.
KR Office Action dated Mar. 1, 2024 in KR Application No. 10-2021-7018803, with English Translation.
KR Office Action dated May 30, 2022, in Application No. KR10-2019-7033130 With English Translation.
KR Office Action dated Nov. 14, 2023, in KR Application No. 10-2022-7031314 with English Translation.
KR Office Action dated Oct. 27, 2022 in Application No. KR10-2022-7026373 with English translation.
KR Office Action dated Sep. 27, 2022, in Application No. KR10-2017-0102113 with English translation.
Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.
Lee, B. et al., "ALD Tungsten Solves Capacity Challenges in 3D NAND Device Manufacturing", Lam Brochure, Jan. 2019, pp. 1-4.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W—N thin films in Cu interconnects," Applied Physics Letters, vol. 91 (2007), pp. 162108-1-162108-3.
Makela, M., et al., "Thermal Atomic Layer Deposition of Continuous and Highly Conducting Gold Thin Films," Chemistry of Materials, 2017, vol. 29, pp. 6130-6136.
Mccain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Muhtade, M., et al., "Time Influence on Thickness and Grains for Molybdenum Thin Film," 2017, e-ISSN: 2289-8131, vol. 9, No. 2-13.

(56) References Cited

OTHER PUBLICATIONS

Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.
Ouyang, T., et al., "A Surface Chemistry Route to Molybdenum Sulfide and Germanide Films Using the Single-Source Precursor Tetrakis(diethylaminodithiocarbomato)molybdate(IV), " The Journal of Physical Chemistry B, 2004, vol. 108(5), pp. 17537-17545.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Seghete, D et al., Molybdenum Atomic Layer Deposition Using MoF6 and Si2H6 As the Reactants, Chemistry of Materials, 2011, vol. 23 No. 7, pp. 1668-1678.
SG Office Action dated Oct. 11, 2023, in application No. SG11202201453T.
SG Office Action dated Sep. 19, 2023, in application No. SG11202202087P.
SG Search Report and Written Opinion dated Feb. 10, 2023 in Application No. SG11202109796Q.
SG Written Opinion dated Oct. 4, 2023 in Application No. SG11202109796Q.
Shimizu, H. et al., "Precursor-based designs of nano-structures and their processing for Co(W) alloy films as a single layered barrier/ liner layer in future Cu-interconnect", Journal of Materials Chemistry C, 2015, vol. 3, pp. 2500-2510.
Shirazi, M., et al., "Initial Stage of Atomic Layer Deposition of 2D-MoS2 on a SiO2 surface: a DFT study," Physical Chemistry Chemical Physics, 2018, vol. 20 (24), pp. 1-18.
Singapore Written Opinion dated Mar. 15, 2023 issued in Application No. SG11202108217U.
Specification of U.S. Appl. No. 62/425,704, (filed Nov. 23, 2016).
Stephenson T A., et al., "487. Molybdenum(II) Carboxylates," Journal of the Chemical Society, 1964, pp. 2538-2541.
Sun Yicai, et al., "Design Manufacturing and Application," Metallurgical Industry Publishing House, Apr. 30, 2000, p. 166.
TW Office Action dated Aug. 16, 2022, in Application No. TW107141042 with English translation.
TW Office Action dated Aug. 31, 2023, in Application No. TW109102778 with English translation.
TW Office Action dated Dec. 5, 2023 in TW Application No. 109107661 with English translation.
TW Office Action dated Dec. 21, 2023 in Application No. TW108126326 with English translation.
TW Office Action dated Feb. 10, 2023 in Application No. TW107112210 with English translation.
TW Office Action dated Feb. 23, 2023 in Application No. TW108126326 with English translation.
TW Office Action dated May 24, 2022, in Application No. TW20180112210 with English translation.
TW Office Action dated Oct. 18, 2021, in application No. TW107112210 with English translation.
TW Office Action dated Oct. 19, 2023 in Application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Advisory Action dated Oct. 18, 2022, in U.S. Appl. No. 17/250,452.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Feb. 2, 2023 in U.S. Appl. No. 17/436,944.
U.S. Final Office Action dated Feb. 12, 2024 in U.S. Appl. No. 17/589,416.
U.S. Final Office Action dated Jan. 31, 2022 in U.S. Appl. No. 16/764,812.
U.S. Final office Action dated Jun. 26, 2023 in U.S. Appl. No. 17/589,416.
U.S. Final Office Action dated Mar. 1, 2023 in U.S. Appl. No. 17/250,452.
US Final Office Action dated Mar. 29, 2021 issued in U.S. Appl. No. 16/724,231.
U.S. Final Office Action dated May 31, 2023, in U.S. Appl. No. 17/814,207.
U.S. Final Office Action dated Nov. 30, 2022 in U.S. Appl. No. 16/764,812.
U.S. Final office Action dated Sep. 14, 2023 in U.S. Appl. No. 17/662,220.
U.S. Non Final Office Action dated Mar. 21, 2022, in U.S. Appl. No. 17/250,452.
U.S. Non-Final Office Action dated Aug. 29, 2023, in U.S. Appl. No. 17/310,293.
U.S. Non-Final Office Action dated Dec. 15, 2021 in U.S. Appl. No. 17/250,014.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Non-Final Office Action dated Jul. 20, 2023, in U.S. Appl. No. 17/814,209.
U.S. Non-Final Office Action dated Jun. 20, 2023, in U.S. Appl. No. 17/250,452.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated Nov. 6, 2023, in U.S. Appl. No. 17/814,206.
U.S. Non-Final Office Action dated Nov. 19, 2021, in U.S. Appl. No. 17/250,452.
U.S. Non-Final Office Action dated Nov. 30, 2022 in U.S. Appl. No. 17/814,207.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Notice of Allowance dated Aug. 3, 2023, in U.S. Appl. No. 17/436,944.
U.S. Notice of Allowance dated Feb. 2, 2022 in U.S. Appl. No. 16/724,231.
U.S. Notice of Allowance dated Jan. 2, 2024 in U.S. Appl. No. 17/310,293.
U.S. Notice of Allowance dated Jul. 14, 2023 in U.S. Appl. No. 17/436,944.

(56) References Cited

OTHER PUBLICATIONS

U.S. Notice of Allowance dated Jun. 7, 2022 in U.S. Appl. No. 17/250,014.
U.S. Notice of Allowance dated Nov. 14, 2023 in U.S. Appl. No. 17/814,209.
U.S. Notice of Allowance dated Oct. 4, 2023, in U.S. Appl. No. 17/436,944.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action dated Sep. 22, 2020 issued in U.S. Appl. No. 16/724,231.
US Office Action Restriction/Election dated Sep. 9, 2021 issued in U.S. Appl. No. 17/250,014.
U.S. Appl. No. 18/253,038, inventors Lai C.S, et al., filed May 16, 2023.
U.S. Appl. No. 18/258,973, inventors Na J S, et al., filed Jun. 22, 2023.
U.S. Appl. No. 18/286,994, inventors Thombare S V, et al., filed Oct. 13, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
Zhao, Y., et al., "Synthesis and Structures of Mono- and Dinuclear Molybdenum Complexes with Reduced $\alpha$-Diimine Ligands," European Journal of Inorganic Chemistry, 2016, pp. 5411-5417.
CAS Registry No. 500120-09-2, CAS SciFinder, 2025, 2 Pages.
CAS Registry No. 749862-34-8, CAS SciFinder, 2025, 2 Pages.
CN Office Action dated Feb. 20, 2025 in CN Application No. 201980038600.8, with English Translation.
CN Office Action dated Feb. 20, 2025 in CN Application No. 201980076277.3 with English translation.
CN Office Action dated Feb. 28, 2025 in CN Application No. 201980049916.7, with English Translation.
CN Office Action dated Mar. 6, 2025 in CN Application No. 202080059499.7, with English Translation.
CN Office Action dated May 28, 2025 in CN Application No. 201880074995.2 with English translation.
CN Office Action dated May 28, 2025 in CN Application No. 201980038600.8 with English translation.
CN Office Action dated May 29, 2025 in CN Application No. 202080072306.1, with English Translation.
CN Office Action dated May 30, 2025 in CN Application No. 202080059499.7, with English Translation.
CN Office Action dated May 30, 2025 in CN Application No. 202080062173.X, with English Translation.
Hartley F R., et al., "Foundations of Metal-Organic Chemistry", Chemical Industry Press, Nov. 1982, pp. 58-59 (5 Pages).
International Preliminary Report on Patentability and Written Opinion dated Apr. 24, 2025 in PCT Application No. PCT/US2023/034858.
International Preliminary Report on Patentability and Written Opinion dated May 8, 2025 in PCT Application No. PCT/US2023/035873.
International Search Report and Written Opinion dated Jun. 11, 2025 in PCT Application No. PCT/US2025/017720.
Jiang P., et al., "Dependence of Crystal Structure and Work Function of WNX Films on the Nitrogen Content," Applied Physics Letters, 2006, vol. 89, (Dec. 21, 2007) pp. 1-3.
JP Decision to Grant and Search Report dated Jul. 1, 2025 in JP Application No. 2021-527153, with English translation.
JP Office Action dated Jan. 28, 2025 in JP Application No. 2022-571128, with English Translation.
JP Office Action dated Jul. 8, 2025 in JP Application No. 2022-514153, with English Translation.
JP Office Action dated Jun. 3, 2025 in JP Application No. 2022141888, with English Translation.
JP Office Action dated Jun. 3, 2025 in JP Application No. 2022509591, with English Translation.
JP Office Action dated Mar. 4, 2025 in JP Application No. 2022-514153, with English Translation.
JP Office Action dated May 7, 2025 in JP Application No. 2022-141887, with English Translation.
Keyan Z., "Essays on Organic Chemistry: Homogeneous Catalytic Reaction of Unsaturated Hydrocarbons," Higher Education Press, May 1989, vol. 3, p. 11 (4 Pages).
KR Decision to Grant and Search Report dated Aug. 26, 2025 in KR Application No. 10-2021-7032632, with English translation.
KR Notice of Allowance dated Feb. 11, 2025 in KR Application No. 10-2020-7034800, with English Translation.
KR Office Action dated Apr. 21, 2025 in KR Application No. 10-2021-7018803, with English Translation.
KR Office Action dated Apr. 22, 2025 in KR Application No. 10-2021-7026960, with English Translation.
KR Office Action dated Aug. 26, 2025 in KR Application No. 10-2021-7005949, with English Translation.
KR Office Action dated Feb. 21, 2025 in KR Application No. 10-2022-7009362, with English Translation.
KR Office Action dated Feb. 26, 2025 in KR Application No. 10-2020-7017697, with English Translation.
KR Office Action dated Jul. 8, 2025 in KR Application No. 10-2022-7045710, with English Translation.
KR Office Action dated Jul. 9, 2025 in KR Application No. 10-2022-7011026, with English Translation.
KR Office Action dated Jul. 17, 2025 in KR Application No. 10-2022-7045707, with English Translation.
SG Written Opinion dated Jan. 9, 2025 in SG Application No. 11202202087P.
SG Written Opinion dated Mar. 4, 2025 in SG Application No. 11202201453T.
SG Written Opinion dated Mar. 28, 2025 in SG Application No. 11202203845.
Stoffelbach F., et al., "A Bis(Diazadiene) Adduct of MoCl2: Mononuclear, Octahedral, Undistorted and Diamagnetic," European Journal of Inorganic Chemistry, 2004, (4), pp. 726-731.
Stoffelback F., et al., "Half-Sandwich Molybdenum(III) Compounds Containing Diazadiene Ligands and Their Use in the Controlled Radical Polymerization of Styrene," Journal of Organometallic Chemistry, Dec. 2002, vol. 663 (1-2), pp. 269-276.
TW Office Action and Search Report dated Aug. 28, 2025 in TW Application No. 111113974, with English Translation.
TW Office Action and Search Report dated Jul. 2, 2025 in TW Application No. 110142342, with English Translation.
TW Office Action and Search Report dated May 13, 2025 in TW Application No. 111100209, with English Translation.
TW Office Action dated Apr. 15, 2025 in TW Application No. 110118417, with English Translation.
U.S. Corrected Notice of Allowance dated Mar. 6, 2025 in U.S. Appl. No. 17/639,846.
U.S. Final Office Action dated Aug. 29, 2025 in U.S. Appl. No. 18/799,905.
U.S. Final Office Action dated Feb. 4, 2025 in U.S. Appl. No. 18/310,523.
U.S. Non-Final Office Action dated Apr. 9, 2025 in U.S. Appl. No. 18/286,994.
U.S. Non-Final Office Action dated Aug. 27, 2025 in U.S. Appl. No. 18/253,038.
US Non-Final Office Action dated Jul. 29, 2025 in U.S. Appl. No. 17/999,255.
U.S. Non-Final Office Action dated Mar. 21, 2025 in U.S. Appl. No. 18/379,397.
US Non-Final Office Action dated May 6, 2025 in U.S. Appl. No. 18/799,905.
U.S. Non-Final Office Action dated May 23, 2025 in U.S. Appl. No. 18/310,523.

(56) References Cited

OTHER PUBLICATIONS

U.S. Notice of Allowance dated Feb. 11, 2025 in U.S. Appl. No. 17/763,529.
U.S. Notice of Allowance dated Feb. 21, 2025 in U.S. Appl. No. 17/763,529.
U.S. Notice of Allowance dated Feb. 26, 2025 in U.S. Appl. No. 17/639,846.
U.S. Notice of Allowance dated Mar. 5, 2025 in U.S. Appl. No. 17/814,206.
U.S. Notice of Allowance dated Mar. 21, 2025 in U.S. Appl. No. 17/662,220.
U.S. Appl. No. 19/119,205, inventors Mandia D.J et al., filed Apr. 8, 2025.
U.S. Appl. No. 19/124,236, Inventors Lee et al., filed Apr. 24, 2025.
U.S. Appl. No. 19/204,379, inventors Schloss L et al., filed May 9, 2025.
U.S. Appl. No. 19/217,348, inventors Na J.S et al., filed May 23, 2025.
U.S. Appl. No. 19/249,964, inventors Jandl A et al., filed Jun. 25, 2025.
U.S. Restriction Requirement dated Apr. 10, 2025 in U.S. Appl. No. 17/999,255.
U.S. Restriction Requirement dated Jun. 13, 2025 in U.S. Appl. No. 18/626,278.
CN Office Action dated Jul. 9, 2024 in CN Application No. 201980049916.7 with English translation.
CN Office Action dated Jun. 7, 2024 in CN Application No. 201880074995.2, with EnglishTranslation.
CN Office Action dated Jun. 27, 2024 in CN Application No. 201980076277.3 with English translation.
CN Office Action dated May 31, 2024 in CN Application No. 201980038600.8 with English translation.
CN Office Action dated Nov. 29, 2024 in CN Application No. 201880074995.2, with English Translation.
CN Office Action dated Oct. 17, 2024 in CN Application No. 202080059499.7 with English translation.
International Preliminary Report on Patentability and Written Opinion dated Jan. 2, 2025 in PCT Application No. PCT/US2023/069018.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated Nov. 14, 2024 in PCT Application No. PCT/US2023/019795.
International Preliminary Report on Patentability and Written Opinion dated Oct. 17, 2024 in PCT Application No. PCT/US2023/017635.
International Preliminary Report on Patentability and Written Opinion dated Oct. 31, 2024 in PCT Application No. PCT/US2023/019000.
International Preliminary Report on Patentability and Written Opinion dated Sep. 6, 2024 in PCT Application No. PCT/US2023/062877.
International Preliminary Reporton Patentability and Written Opinion dated Dec. 5, 2024 in PCT Application No. PCT/US2023/023023.
International Preliminary Reporton Patentability and Written Opinion dated Nov. 7, 2024 in PCT Application No. PCT/US2023/019800.
International Search Report and Written Opinion dated Jul. 23, 2024 in PCT Application No. PCT/US2024/023361.
International Search Report and Written Opinion dated Oct. 22, 2024 in PCT Application No. PCT/US2024/037234.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Jan. 7, 2025 in JP Application No. 2021-527153 with English translation.
JP Office Action dated Jul. 16, 2024 in JP Application No. 2021-527153, with English Translation.
JP Office Action dated Jun. 11, 2024 in JP Application No. 2023-95239, with English Translation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Mar. 26, 2024 in JP Application No. 2022-524041 with English translation.
JP Office Action dated Nov. 12, 2024 in JP Application No. 2022-522581 with English translation.
JP Office Action dated Oct. 29, 2024 in JP Application No. 2022-141887 with English translation.
JP Office Action dated Sep. 3, 2024 in JP Application No. 2022-141888 with English translation.
JP Office Action dated Sep. 3, 2024 in JP Application No. 2022-509591, with English Translation.
KR Notice of Allowance dated Nov. 25, 2024 in KR Application No. 10-2023-0081299, with English Translation.
KR Notice of Allowances dated Aug. 28, 2024 in KR Application No. 10-2023-7028915 with English Translation.
KR Notice of Allowances dated Jan. 8, 2025 in KR Application No. 10-2022-7031314 with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Jun. 27, 2024 in KR Application No. 10-2023-0081299, with English Translation.
KR Office Action dated Mar. 29, 2024 in KR Application No. 10-2020-7017697 with English translation.
KR Office Action dated May 7, 2024 in KR Application No. 10-2020-7034800, with English Translation.
KR Office Action dated Nov. 21, 2024 in KR Application No. 10-2021-7005949 with English Translation.
KR Office Action dated Oct. 28, 2024 in KR Application No. 10-2021-7018803 with English Translation.
KR Office Action dated Sep. 26, 2024 in KR Application No. 10-2022-7031314, with English Translation.
SG Search Report and Written Opinion dated Aug. 22, 2024 in SG Application No. 11202203845Q.
TW Office Action dated Apr. 24, 2024 in TW Application No. 109130013, With English Translation.
TW Office Action dated May 9, 2024 in TW Application No. 109107661 with English translation.
TW Office Action dated May 22, 2024 in TW Application No. 109135654, with English Translation.
U.S. Final Office Action dated Apr. 12, 2024 in U.S. Appl. No. 17/814,206.
U.S. Final Office Action dated Jan. 3, 2025 in U.S. Appl. No. 17/662,220.
U.S. Final Office Action dated May 8, 2024 in U.S. Appl. No. 17/250,452.
U.S. Final Office Action dated May 9, 2024 in U.S. Appl. No. 17/814,207.
U.S. Final Office Action dated Nov. 22, 2024 in U.S. Appl. No. 17/639,846.
U.S. Final Office Action dated Oct. 10, 2024 in U.S. Appl. No. 18/379,397.
U.S. Non-Final Office Action dated Aug. 7, 2024 in U.S. Appl. No. 18/310,523.
U.S. Non-Final Office Action dated Jul. 24, 2024 in U.S. Appl. No. 17/763,529.

(56) References Cited

OTHER PUBLICATIONS

U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated May 23, 2024 in U.S. Appl. No. 17/662,220.
U.S. Non-Final Office Action dated Sep. 5, 2024 in U.S. Appl. No. 17/814,206.
U.S. Notice of Allowance dated Apr. 4, 2024 in U.S. Appl. No. 17/310,293.
U.S. Notice of Allowance dated Jul. 3, 2024 in U.S. Appl. No. 17/294,378.
U.S. Notice of Allowance dated Mar. 27, 2024 in U.S. Appl. No. 17/814,209.
U.S. Appl. No. 18/714,506, inventors Mandia D.J., et al., filed May 29, 2024.
U.S. Appl. No. 18/716,846, inventors Mandia D.J, et al., filed Jun. 5, 2024.
U.S. Appl. No. 18/837,560, inventors Hsieh Y, et al., filed Aug. 9, 2024.
U.S. Appl. No. 18/852,644; inventors Austin D.Z et al., filed Sep. 30, 2024.
U.S. Appl. No. 18/857,125, inventors Griffiths M.B, et al., filed Oct. 15, 2024.
U.S. Appl. No. 18/859,971, inventors Mahenderkar N.K, et al., filed Oct. 24, 2024.
U.S. Appl. No. 18/866,057, inventors Wongsenakhum P, et al., filed Nov. 14, 2024.
U.S. Appl. No. 18/877,501, inventors Fox A.R et al., filed Dec. 20, 2024.
U.S. Appl. No. 18/907,394, inventors Van Cleemput P.A, et al., filed Oct. 4, 2024.
U.S. Restriction requirement dated May 13, 2024, in U.S. Appl. No. 18/310,523.
International Preliminary Report on Patentability and Written Opinion dated Oct. 23, 2025 in PCT Application No. PCT/US2024/023361.
JP Office Action dated Nov. 4, 2025 in JP Application No. 2023-528357, with English Translation.
JP Office Action dated Sep. 2, 2025 in JP Application No. 2020-561743, with English Translation.
JP Office Action dated Sep. 9, 2025 in JP Application No. 2022-571128, with English Translation.
JP Office Action dated Sep. 16, 2025 in JP Application No. 2024-114404, with English Translation.
KR Decision to Grant and Search Report dated Oct. 24, 2025 in KR Application No. 10-2022-7009362, with English translation.
KR Office Action dated Oct. 20, 2025 in KR Application No. 10-2022-7044687, with English Translation.
KR Office Action dated Sep. 16, 2025 in KR Application No. 10-2022-7015736, with English Translation.
KR Office Action dated Sep. 23, 2025 in KR Application No. 10-2022-7044028, with English Translation.
TW Office Action and Search Report dated Sep. 15, 2025 in TW Application No. 111106158, with English Translation.
U.S. Final Office Action dated Oct. 7, 2025 in U.S. Appl. No. 18/379,397.
U.S. Final Office Action dated Sep. 2, 2025 in U.S. Appl. No. 18/286,994.
U.S. Non-Final Office Action dated Sep. 4, 2025 in U.S. Appl. No. 18/626,278.
U.S. Appl. No. 19/473,869, inventors Mandia D.J et al., filed on Oct. 9, 2025.
JP Office Action dated Dec. 2, 2025 in JP Application No. 2023-539751, with English Translation.
KR Decision to Grant and Search Report dated Dec. 24, 2025 in KR Application No. 10-2022-7011026, with English translation.
KR Office Action dated Dec. 18, 2025 in KR Application No. 10-2021-7026960, with English Translation.
KR Office Action dated Dec. 29, 2025 in KR Application No. 10-2020-7017697, with English Translation.
U.S. Corrected Notice of Allowance dated Jan. 9, 2026 in U.S. Appl. No. 18/547,481.
U.S. Final Office Action dated Dec. 9, 2025 in U.S. Appl. No. 17/999,255.
U.S. Notice of Allowance dated Dec. 4, 2025 in U.S. Appl. No. 18/286,994.
U.S. Notice of Allowance dated Dec. 12, 2025 in U.S. Appl. No. 18/547,481.
U.S. Appl. No. 19/413,563, inventors Thombare S.V et al., filed on Dec. 9, 2025.
U.S. Appl. No. 19/500,039, inventors Mandia D.J et al., filed on Jan. 7, 2026.
U.S. Restriction requirement dated Dec. 23, 2025, in U.S. Appl. No. 18/837,560.
JP Office Action dated Jan. 6, 2026 in JP Application No. 2023568487, with English Translation.
KR Office Action dated Dec. 16, 2025 in KR Application No. 10-2022-7044688, with English Translation.

* cited by examiner

Provide substrate
having a material layer        310

Deposit molybdenum-containing layer
on the material layer        330

Form defined pattern within
molybdenum-containing layer        350

Transfer the defined pattern to the
material layer        370

Provide substrate
having a material layer                    310

Provide interfacial layer and/or
pretreat surface of the substrate          320

Deposit molybdenum-containing layer
on the material layer                      330

Deposit resist layer to form a resist
mask having a pattern                      351

Transfer the pattern to the
molybdenum-containing layer to form a
defined pattern in a hardmask             352

Transfer the defined pattern to the
material layer using the hardmask         391

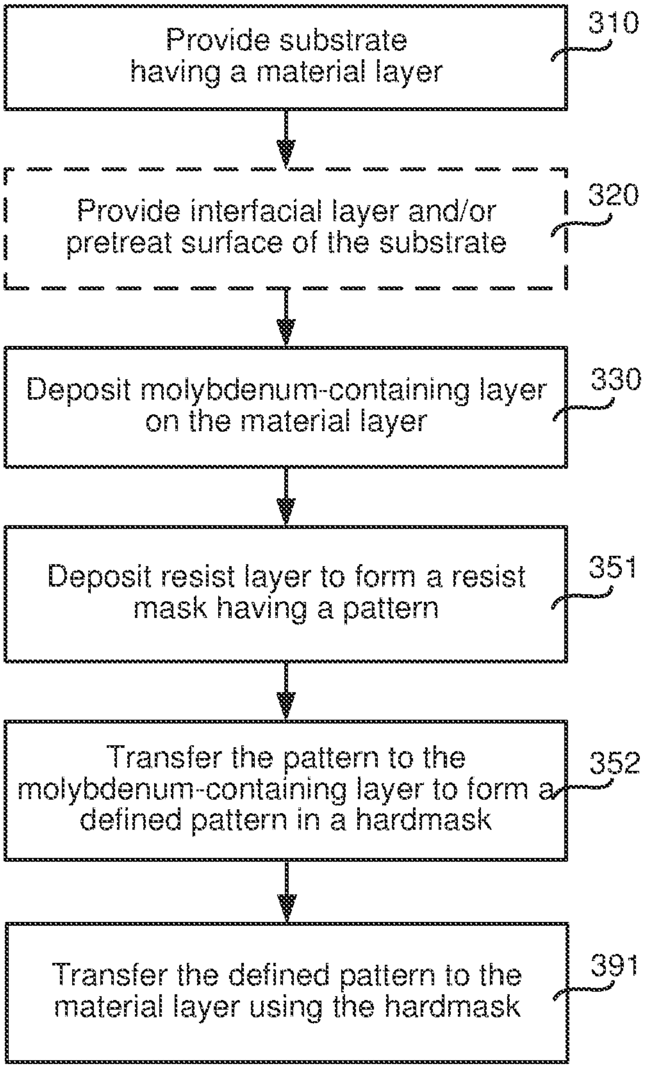

*FIG. 3B*

HIGH SELECTIVITY DOPED HARDMASK FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

The present disclosure relates to high selectivity doped hardmask films, as well as methods of providing and using such films. In particular examples, the high selectivity doped hardmask film can be employed as a hardmask, an intermediate layer, or a coverage layer.

BACKGROUND

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

Certain technology nodes require advanced semiconductor processing to implement desired features. In particular, films can be used as hardmasks for etching high aspect ratio features during substrate processing. In three dimensional (3D) memory applications, the hardmask film should possess high etch selectivity.

SUMMARY

The present disclosure relates to molybdenum (Mo)-containing layers (e.g., such as Mo-doped layers), as well as methods of providing and using such layers. In certain non-limiting embodiments, the Mo-containing layer is provided by way of a plasma enhanced chemical vapor deposition (PECVD) process. In use, such Mo-containing layers can serve as at least one of a hardmask, an intermediate layer (e.g., an etch stop layer), or a coverage layer (e.g., a conformal layer or a step coverage layer) within a stack. In particular embodiments, the Mo-containing layer allows for improved etch selectivity within a stack, which can further extend technology scaling.

In a first aspect, the present disclosure encompasses a method for providing a metal containing layer (e.g., a Mo-containing layer). In some embodiments, the method includes: providing a substrate on a substrate holder in a processing chamber; exposing a top surface portion of the substrate to a metal-containing precursor (e.g., a Mo-containing precursor) and one or more optional deposition precursors; and depositing a metal-containing layer (e.g., a Mo-containing layer) on the top surface portion of the substrate in a presence or an absence of a plasma within the processing chamber. In some embodiments, said depositing includes use of the plasma. As used herein, the terms "Mo-containing layer," "molybdenum-containing layer," and "metal-containing layer" can be used interchangeably.

In some embodiments, the processing chamber includes a plasma-enhanced chemical vapor deposition (PECVD)

chamber, a chemical vapor deposition (CVD) chamber, a plasma-enhanced atomic layer deposition (PEALD) chamber, or an atomic layer deposition (ALD) chamber.

In particular embodiments, said exposing includes delivering the Mo-containing precursor and the one or more deposition precursors either sequentially or simultaneously. In other embodiments, said exposing further includes delivering a reactant gas, a reducing agent, or a carrier gas to the processing chamber.

In further embodiments, the method includes (e.g., before said depositing): providing an interfacial layer on the top surface portion of the substrate. In some embodiments, said providing thereby disposes the interfacial layer between the substrate and the Mo-containing layer after said depositing. In other embodiments, the interfacial layer includes an adhesion layer, an initiation layer, or a growth layer. In yet other embodiments, the interfacial layer includes boron (B), carbon (C), titanium (Ti), tungsten (W), tantalum (Ta), nickel (Ni), molybdenum (Mo), a nitride thereof, a silicide thereof, an oxynitride thereof, a carbide thereof, or a carbonitride thereof.

In some embodiments, the method further includes (e.g., before said depositing): pretreating the top surface portion of the substrate. In particular embodiments, said pretreating thereby provides a pretreated surface being disposed between the substrate and the Mo-containing layer after said depositing.

In other embodiments, the substrate further includes a material layer disposed on the top surface portion of the substrate, wherein said depositing includes depositing the Mo-containing layer on a top surface portion of the material layer. In some embodiments, the material layer includes at least one of an oxide or a nitride (e.g., any described herein).

In some embodiments, said depositing includes applying at least one of a low frequency (LF) radiofrequency component or a high frequency (HF) radiofrequency component.

In a second aspect, the present disclosure encompasses a method for providing a Mo-containing layer. In some embodiments, the method includes: providing a substrate in a processing chamber; and depositing by a plasma enhanced chemical vapor deposition (PECVD) process the Mo-containing layer on a surface portion of the substrate.

In a third aspect, the present disclosure encompasses a method for processing a substrate. In some embodiments, the method includes: depositing a Mo-containing layer on a top surface portion of a substrate; forming a defined pattern within the Mo-containing layer; and transferring the defined pattern to a material layer disposed beneath the Mo-containing layer.

In some embodiments, said depositing includes: exposing the top surface portion of the substrate to a Mo-containing precursor and one or more optional deposition precursors, thereby forming the Mo-containing layer. In other embodiments, said exposing includes delivering the Mo-containing precursor and the one or more deposition precursors sequentially. Optionally, the method can include purging at least one of: after delivery of the Mo-containing precursor or after the delivery of the one or more deposition precursors. In yet other embodiments, said exposing includes delivering the Mo-containing precursor and the one or more deposition precursors simultaneously. In some embodiments, said depositing includes chemical vapor deposition, atomic layer deposition, or a plasma-enhanced form thereof.

In some embodiments, said exposing further includes delivering a reactant gas, a reducing agent, or an inert gas.

In some embodiments, said forming the defined pattern includes: depositing a resist layer on a top surface portion of the Mo-containing layer to form a resist mask having a pattern; and transferring the pattern of the resist mask to the top surface portion of the Mo-containing layer. In particular embodiments, said transferring thereby forms a hardmask having one or more openings to provide the defined pattern. In other embodiments, said transferring the defined pattern includes: etching the material layer through the one or more openings of the hardmask. In yet other embodiments, said transferring the defined pattern includes: etching the material layer through a defined pattern within the Mo-containing layer.

In further embodiments, the method includes (e.g., before said depositing the Mo-containing layer): providing an interfacial layer on the top surface portion of the substrate, thereby disposing the interfacial layer between the substrate and the Mo-containing layer.

In any embodiment herein, an interfacial layer is present on a top surface portion of the substrate. In particular embodiments, deposition of the Mo-containing layer provides a stack in which the interfacial layer is disposed between the substrate and the Mo-containing layer. In some embodiments, the interfacial layer includes an adhesion layer, an initiation layer, or a growth layer. In other embodiments, the interfacial layer includes boron (B), carbon (C), titanium (Ti), tungsten (W), tantalum (Ta), nickel (Ni), molybdenum (Mo), a nitride thereof, a silicide thereof, an oxynitride thereof, a carbide thereof, or a carbonitride thereof.

In some embodiments, the method further includes (e.g., before said transferring the defined pattern to the material layer): etching the interfacial layer through the defined pattern within the Mo-containing layer.

In other embodiments, the method further includes (e.g., before said depositing the Mo-containing layer): pretreating the top surface portion of the substrate, thereby providing a pretreated surface being disposed between the substrate and the Mo-containing layer.

In yet other embodiments, the method further includes (e.g., before said transferring the defined pattern to the material layer): etching the pretreated surface through the defined pattern within the Mo-containing layer.

In a fourth aspect, the present disclosures encompasses a method for processing a substrate. In some embodiments, the method includes: providing a substrate having a material layer disposed on a top surface portion of the substrate; depositing a Mo-containing layer on a top surface portion of the material layer, wherein said depositing includes delivering a Mo-containing precursor and one or more optional deposition precursors; forming a patterned mask over the Mo-containing layer; transferring a pattern of the patterned mask to the Mo-containing layer, thereby forming a defined pattern within the Mo-containing layer; and transferring the defined pattern to the material layer.

In a fifth aspect, the present disclosures encompasses an apparatus for processing a substrate. In some embodiments, the apparatus includes: a processing chamber including a substrate holder; a process gas source connected with the processing chamber and associated flow-control hardware; and substrate handling hardware connected with the process chamber.

In some embodiments, the apparatus further includes a controller having a processor and a memory, wherein the processer and the memory are communicatively connected with one another. In particular embodiments, the processor is at least operatively connected with the flow-control hardware and substrate handling hardware. In other embodiments, the memory stores computer-executable instructions for conducting the operations in any method described herein.

In yet other embodiments, the computer-executable instructions includes instructions configured to: cause exposure of a top surface portion of a substrate to a Mo-containing precursor and one or more deposition precursors within the processing chamber; and cause deposition of a Mo-containing layer on the top surface portion of the substrate.

In further embodiments, the apparatus includes: a plasma source connected with the processing chamber.

In other embodiments, the computer-executable instructions includes instructions configured to: cause exposure of a top surface portion of a substrate to a Mo-containing precursor and one or more deposition precursors within the processing chamber; cause supply of a plasma to the processing chamber; and cause deposition of a Mo-containing layer on the top surface portion of the substrate.

In any embodiment herein, the Mo-containing precursor includes an organomolybdenum compound, a molybdenum halide compound, a molybdenum oxyhalide compound, an inorganic molybdenum compound, or a compound including a structure having one of formulas (I)-(V) or a salt thereof.

In any embodiment herein, the one or more deposition precursors is selected from the group consisting of a carbon-containing precursor, a silicon-containing precursor, and a boron-containing precursor.

In any embodiment herein, the carbon-containing precursor includes at least one of a hydrocarbon, methane ($CH_4$), acetylene ($C_2H_2$), ethylene ($C_2H_4$), propylene ($C_3H_6$), propyne ($C_3H_4$), allene ($C_3H_4$), cyclopropene ($C_3H_4$), butane ($C_4H_{10}$), cyclohexane ($C_6H_{12}$), benzene ($C_6H_6$), or toluene ($C_7H_8$).

In any embodiment herein, the silicon-containing precursor includes a silane compound, an organosilane compound, an alkyl silane compound, an alkoxy silane compound, a silanol compound, a siloxane compound, an aminosilane compound, a cyclic azasilane compound, a halosilane compound, or an inorganic silane compound.

In any embodiment herein, the boron-containing precursor includes an organoborane compound, a boron halide compound, a borate compound, or an inorganic boron compound.

In any embodiment herein, the Mo-containing layer includes $Mo_xC_y$, $Mo_xSi_y$, $Mo_xB_y$, $Mo_xC_yO_z$, $Mo_xSi_yB_z$, $Mo_xC_yN_z$, $Mo_xSi_yC_z$, $Mo_xB_yC_z$, $Mo_xN_y$, or $Mo_xO_yN_z$, as well as combinations thereof.

In any embodiment herein, the Mo-containing layer is a hardmask, an etch stop layer, a conformal layer, or a step coverage layer.

In any embodiment herein, the Mo-containing layer has a low fluorine (F) content. Non-limiting fluorine content can include about 0-2 at. % or less than about 2 at. %.

In any embodiment herein, the Mo-containing layer has a low hydrogen (H) content. Non-limiting hydrogen content can include about 0-5 at. % or less than about 5 at. %.

In any embodiment herein, the Mo-containing layer has a high molybdenum (Mo) content. Non-limiting molybdenum content can include about 5-65 at. %, about 3-60 at. %, or greater than about 3 at. %.

In any embodiment herein, the Mo-containing layer has a low stress. Non-limiting stress can include +/−100 MPa, +/−500 MPa, or ranges therebetween, e.g., as determined by measuring the wafer bow before and after deposition of the Mo-containing layer.

In any embodiment herein, the Mo-containing layer has a high etch selectivity. Non-limiting high etch selectivity can be determined by assessing blanket etch rates, which can be collected by measuring the etch amount after a fixed time etch. Additional embodiments are described herein.

Definitions

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

As used herein, the term "surface portion" can include the entirety of the surface or a part of the surface.

The term "acyl," or "alkanoyl," as used interchangeably herein, represents groups of 1, 2, 3, 4, 5, 6, 7, 8 or more carbon atoms of a straight, branched, cyclic configuration, saturated, unsaturated and aromatic, and combinations thereof, or hydrogen, attached to the parent molecular group through a carbonyl group, as defined herein. This group is exemplified by formyl, acetyl, propionyl, isobutyryl, butanoyl, and the like. In some embodiments, the acyl or alkanoyl group is —C(O)—R, in which R is hydrogen, an aliphatic group, or an aromatic group, as defined herein.

By "acyl halide" is meant —C(O)X, where X is a halogen, such as Br, F, I, or Cl.

By "aldehyde" is meant a —C(O)H group or a compound including such a group. An example of an aldehyde can include RC(O)H, in which R is selected from aliphatic, haloaliphatic, haloheteroaliphatic, heteroaliphatic, aromatic, aliphatic-aromatic, heteroaliphatic-aromatic, as defined herein, or any combination thereof.

By "aldehydealkyl" is meant an aldehyde group, as defined herein, attached to the parent molecular group through an alkyl group, as defined herein. In some embodiments, the aldehydealkyl group is -L-C(O)H, in which L is an alkyl group, as defined herein.

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well.

By "aliphatic-aryl" is meant an aryl group that is or can be coupled to a compound disclosed herein, where the aryl group is or becomes coupled through an aliphatic group, as defined herein. In some embodiments, the aliphatic-aryl group is -L-R, in which L is an aliphatic group, as defined herein, and R is an aryl group, as defined herein.

By "aliphatic-heteroaryl" is meant a heteroaryl group that is or can be coupled to a compound disclosed herein, wherein the heteroaryl group is or becomes coupled through an aliphatic group, as defined herein. In some embodiments, the aliphatic-heteroaryl group is -L-R, in which L is an aliphatic group, as defined herein, and R is a heteroaryl group, as defined herein.

By "alkyl-aryl," "alkenyl-aryl," and "alkynyl-aryl" is meant an aryl group, as defined herein, that is or can be coupled (or attached) to the parent molecular group through an alkyl, alkenyl, or alkynyl group, respectively, as defined herein. The alkyl-aryl, alkenyl-aryl, or alkynyl-aryl group can be substituted or unsubstituted. For example, the alkyl-aryl, alkenyl-aryl, or alkynyl-aryl group can be substituted with one or more substitution groups, as described herein for alkyl, alkenyl, alkynyl, or aryl. Exemplary unsubstituted alkyl-aryl groups are of from 7 to 16 carbons ($C_{7-16}$ alkyl-aryl), as well as those having an alkyl group with 1 to 6 carbons and an aryl group with 4 to 18 carbons (i.e., $C_{1-6}$ alkyl-$C_{4-18}$ aryl). Exemplary unsubstituted alkenyl-aryl groups are of from 7 to 16 carbons ($C_{7-16}$ alkenyl-aryl), as well as those having an alkenyl group with 2 to 6 carbons and an aryl group with 4 to 18 carbons (i.e., $C_{2-6}$ alkenyl-$C_{4-18}$ aryl). Exemplary unsubstituted alkynyl-aryl groups are of from 7 to 16 carbons ($C_{7-16}$ alkynyl-aryl), as well as those having an alkynyl group with 2 to 6 carbons and an aryl group with 4 to 18 carbons (i.e., $C_{2-6}$ alkynyl-$C_{4-18}$ aryl). In some embodiments, the alkyl-aryl group is -L-R, in which L is an alkyl group, as defined herein, and R is an aryl group, as defined herein. In some embodiments, the alkenyl-aryl group is -L-R, in which L is an alkenyl group, as defined herein, and R is an aryl group, as defined herein. In some embodiments, the alkynyl-aryl group is -L-R, in which L is an alkynyl group, as defined herein, and R is an aryl group, as defined herein.

By "alkyl-cycloalkyl" is meant a cycloalkyl group, as defined herein, attached to the parent molecular group through an alkyl group, as defined herein. The alkyl-cycloalkyl group can be substituted or unsubstituted. For example, the alkyl-cycloalkyl group can be substituted with one or more substitution groups, as described herein for alkyl. In some embodiments, the alkyl-cycloalkyl group is -L-R, in which L is an alkyl group, as defined herein, and R is a cycloalkyl group, as defined herein.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An exemplary alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl.

By "alkyl-heteroaryl" is meant a heteroaryl group, as defined herein, attached to the parent molecular group through an alkyl group, as defined herein. In some embodiments, the alkyl-heteroaryl group is -L-R, in which L is an alkyl group, as defined herein, and R is a heteroaryl group, as defined herein.

By "alkyl-heterocyclyl," "alkenyl-heterocyclyl," and "alkynyl-heterocyclyl" is meant a heterocyclyl group, as defined herein, that is or can be coupled (or attached) to the parent molecular group through an alkyl, alkenyl, or alkynyl group, respectively, as defined herein. The alkyl-heterocyclyl, alkenyl-heterocyclyl, or alkynyl-heterocyclyl group can be substituted or unsubstituted. For example, the alkyl-heterocyclyl, alkenyl-heterocyclyl, or alkynyl-heterocyclyl group can be substituted with one or more substitution groups, as described herein for alkyl, alkenyl, alkynyl, or heterocyclyl. Exemplary unsubstituted alkyl-heterocyclyl groups are of from 2 to 16 carbons ($C_{2-16}$ alkyl-heterocyclyl), as well as those having an alkyl group with 1 to 6 carbons and a heterocyclyl group with 1 to 18 carbons (i.e., $C_{1-6}$ alkyl-$C_{1-18}$ heterocyclyl). Exemplary unsubstituted alkenyl-heterocyclyl groups are of from 3 to 16 carbons ($C_{3-16}$ alkenyl-heterocyclyl), as well as those having an alkenyl group with 2 to 6 carbons and a heterocyclyl group with 1 to 18 carbons (i.e., $C_{2-6}$ alkenyl-$C_{1-18}$ heterocyclyl). Exemplary unsubstituted alkynyl-heterocyclyl groups are of from 3 to 16 carbons ($C_{3-16}$ alkynyl-heterocyclyl), as well as those having an alkynyl group with 2 to 6 carbons and a heterocyclyl group with 1 to 18 carbons (i.e., $C_{2-6}$ alkynyl-$C_{1-18}$ heterocyclyl). In some embodiments, the alkyl-heterocyclyl group is -L-R, in which L is an alkyl group, as defined herein, and R is a heterocyclyl group, as defined herein. In some embodiments, the alkenyl-heterocyclyl group is -L-R, in which L is an alkenyl group, as defined herein, and R is a heterocyclyl group, as defined herein. In some embodiments, the alkynyl-heterocyclyl group is -L-R, in which L is an alkynyl group, as defined herein, and R is a heterocyclyl group, as defined herein.

By "alkoxy" is meant —OR, where R is an optionally substituted aliphatic group, as described herein. Exemplary alkoxy groups include, but are not limited to, methoxy, ethoxy, n-propoxy, isopropoxy, n-butoxy, t-butoxy, sec-butoxy, n-pentoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

By "alkoxyalkyl" is meant an alkyl group, as defined herein, which is substituted with an alkoxy group, as defined herein. Exemplary unsubstituted alkoxyalkyl groups include between 2 to 12 carbons ($C_{2-12}$ alkoxyalkyl), as well as those having an alkyl group with 1 to 6 carbons and an alkoxy group with 1 to 6 carbons (i.e., $C_{1-6}$ alkoxy-$C_{1-6}$ alkyl). In some embodiments, the alkoxyalkyl group is -L-O—R, in which each of L and R is, independently, an alkyl group, as defined herein.

By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An exemplary alkyl includes a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —$SO_2$—R, in which R is $C_{1-6}$ alkyl); (4) amine (e.g., —C(O)$NR^1R^2$ or —$NHCOR^1$, where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, can form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —$N_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —$NO_2$); (19) oxo (e.g., =O); (20) $C_{1-6}$ thioalkoxy (e.g., —S—R, in which R is alkyl); (21) thiol (e.g., —SH); (22) —$CO_2R^1$, where $R^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (23) —C(O)$NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (24) —$SO_2R^1$, where $R^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (25) —$SO_2NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); and (26) —$NR^1R^2$, where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

The term "alkylamino," as used herein, refers to —$NR_1R_2$ group, wherein $R_1$ is optionally substituted alkyl, and $R^2$ is H or optionally substituted alkyl. Examples of alkylamino substituents include dimethylamino and diethylamino substituents.

By "alkylene" is meant a multivalent (e.g., bivalent form) of an alkyl group, alkenyl group, or alkynyl group, as described herein. Exemplary alkylene groups include methylene, ethylene, ethenylene, ethynylene, propylene, propenylene, propynylene, butylene, butenylene, butynylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

The term "alkylsilyl," as used herein, refers to —$SiR_1R_2R_3$ group, wherein $R_1$ is an optionally substituted alkyl, and wherein each of $R_2$ and $R_3$ is independently selected from H and an optionally substituted alkyl. Alkylsilyls include mono, bis, and tris alkylsilyls. Examples of alkylsilyls include trimethylsilyl, dimethylsilyl, methylsilyl, triethylsilyl, diethylsilyl, ethylsilyl, and the like.

By "alkylsulfinyl" is meant an alkyl group, as defined herein, attached to the parent molecular group through an —S(O)— group. In some embodiments, the unsubstituted alkylsulfinyl group is a $C_{1-6}$ or $C_{1-12}$ alkylsulfinyl group. In other embodiments, the alkylsulfinyl group is —S(O)—R, in which R is an alkyl group, as defined herein.

By "alkylsulfinylalkyl" is meant an alkyl group, as defined herein, substituted by an alkylsulfinyl group. In some embodiments, the unsubstituted alkylsulfinylalkyl group is a $C_{2-12}$ or $C_{2-24}$ alkylsulfinylalkyl group (e.g., $C_{1-6}$ alkylsulfinyl-$C_{1-6}$ alkyl or $C_{1-12}$ alkylsulfinyl-$C_{1-12}$ alkyl). In other embodiments, the alkylsulfinylalkyl group is -L-S(O)—R, in which each of L and R is, independently, an alkyl group, as defined herein.

By "alkylsulfonyl" is meant an alkyl group, as defined herein, attached to the parent molecular group through an —$SO_2$— group. In some embodiments, the unsubstituted alkylsulfonyl group is a $C_{1-6}$ or $C_{1-12}$ alkylsulfonyl group. In other embodiments, the alkylsulfonyl group is —$SO_2$—R, where R is an optionally substituted alkyl (e.g., as described herein, including optionally substituted $C_{1-12}$ alkyl, haloalkyl, or perfluoroalkyl).

By "alkylsulfonylalkyl" is meant an alkyl group, as defined herein, substituted by an alkylsulfonyl group. In some embodiments, the unsubstituted alkylsulfonylalkyl group is a $C_{2-12}$ or $C_{2-24}$ alkylsulfonylalkyl group (e.g., $C_{1-6}$ alkylsulfonyl-$C_{1-6}$ alkyl or $C_{1-12}$ alkylsulfonyl-$C_{1-12}$ alkyl). In other embodiments, the alkylsulfonylalkyl group is -L-$SO_2$—R, in which each of L and R is, independently, an alkyl group, as defined herein.

By "alkynyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An exemplary alkynyl includes an optionally substituted $C_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "ambient temperature" is meant a temperature ranging from 16° C. to 26° C., such as from 19° C. to 25° C. or from 20° C. to 25° C.

By "amide" is mean —C(O)$NR^1R^2$ or —$NHCOR^1$, where each of $R^1$ and $R^2$ is, independently, selected from hydrogen, aliphatic, heteroaliphatic, haloaliphatic, haloheteroaliphatic, aromatic, as defined herein, or any combination thereof, or where $R^1$ and $R^2$, taken together with the nitrogen atom to which each are attached, can form a heterocyclyl group, as defined herein.

By "amine" is meant —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof; or where $R^1$ and $R^2$, taken together with the nitrogen atom to which each are attached, can form a heterocyclyl group, as defined herein.

By "aminoalkyl" is meant an alkyl group, as defined herein, substituted by an amine group, as defined herein. In some embodiments, the aminoalkyl group is -L-$NR^1R^2$, in which L is an alkyl group, as defined herein, and each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein. In other embodiments, the aminoalkyl group is -L-C($NR^1R^2$)($R^3$)—$R^4$, in which L is a covalent bond or an alkyl group, as defined herein; each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein; and each of $R^3$ and $R^4$ is, independently, H or alkyl, as defined herein.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system.

By "aryl" is meant an aromatic carbocyclic group comprising at least five carbon atoms to 15 carbon atoms ($C_{5-15}$), such as five to ten carbon atoms ($C_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Exemplary aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) $C_{1-6}$ alkanoyl (e.g., —C(O)—R, in which R is $C_{1-6}$ alkyl); (2) $C_{1-6}$ alkyl; (3) $C_{1-6}$ alkoxy (e.g., —O—R, in which R is $C_{1-6}$ alkyl); (4) $C_{1-6}$ alkoxy-$C_{1-6}$ alkyl (e.g., -L-O—R, in which each of L and R is, independently, $C_{1-6}$ alkyl); (5) $C_{1-6}$ alkylsulfinyl (e.g., —S(O)—R, in which R is $C_{1-6}$ alkyl); (6) $C_{1-6}$ alkylsulfinyl-$C_{1-6}$ alkyl (e.g., -L-S(O)—R, in which each of L and R is, independently, $C_{1-6}$ alkyl); (7) $C_{1-6}$ alkylsulfonyl (e.g., —$SO_2$—R, in which R is $C_{1-6}$ alkyl); (8) $C_{1-6}$ alkylsulfonyl-$C_{1-6}$ alkyl (e.g., -L-$SO_2$—R, in which each of L and R is, independently, $C_{1-6}$ alkyl); (9) aryl; (10) amine (e.g., —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein); (11) $C_{1-6}$ aminoalkyl (e.g., -$L^1$-$NR^1R^2$ or -$L^2$-C($NR^1R^2$)($R^3$)—$R^4$, in which $L^1$ is $C_{1-6}$ alkyl; $L^2$ is a covalent bond or $C_{1-6}$ alkyl; each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein; and each of $R^3$ and $R^4$ is, independently, H or $C_{1-6}$ alkyl); (12) heteroaryl; (13) $C_{1-6}$ alkyl-$C_{4-18}$ aryl (e.g., -L-R, in which L is $C_{1-6}$ alkyl and R is $C_{4-18}$ aryl); (14) aryloyl (e.g., —C(O)—R, in which R is aryl); (15) azido (e.g., —$N_3$); (16) cyano (e.g., —CN); (17) $C_{1-6}$ azidoalkyl (e.g., -L-$N_3$, in which L is $C_{1-6}$ alkyl); (18) aldehyde (e.g., —C(O)H); (19) aldehyde-$C_{1-6}$ alkyl (e.g., -L-C(O)H, in which L is $C_{1-6}$ alkyl); (20) $C_{3-8}$ cycloalkyl; (21) $C_{1-6}$ alkyl-$C_{3-8}$ cycloalkyl (e.g., -L-R, in which L is $C_{1-6}$ alkyl and R is $C_{3-8}$ cycloalkyl); (22) halo; (23) $C_{1-6}$ haloalkyl (e.g., -$L^1$-X or -$L^2$-C(X)($R^1$)—$R^2$, in which $L^1$ is $C_{1-6}$ alkyl; $L^2$ is a covalent bond or $C_{1-6}$ alkyl; X is fluoro, bromo, chloro, or iodo; and each of $R^1$ and $R^2$ is, independently, H or $C_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) $C_{1-6}$ hydroxyalkyl (e.g., -$L^1$-OH or -$L^2$-C(OH)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (29) nitro; (30) $C_{1-6}$ nitroalkyl (e.g., -$L^1$-NO or -$L^2$-C(NO)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (31) N-protected amino; (32) N-protected amino-$C_{1-6}$ alkyl; (33) oxo (e.g., ═O); (34) $C_{1-6}$ thioalkoxy (e.g., —S—R, in which R is $C_{1-6}$ alkyl); (35) thio-$C_{1-6}$ alkoxy-$C_{1-6}$ alkyl (e.g., -L-S—R, in which each of L and R is, independently, $C_{1-6}$ alkyl); (36) —$(CH_2)_rCO_2R^1$, where r is an integer of from zero to four, and $R^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (37) —$(CH_2)_rCONR^1R^2$, where r is an integer of from zero to four and where each $R^1$ and $R^2$ is independently selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (38) —$(CH_2)_rSO_2R^1$, where r is an integer of from zero to four and where $R^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (39) —$(CH_2)_rSO_2NR^1R^2$, where r is an integer of from zero to four and where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (40) —$(CH_2)_rNR^1R^2$, where r is an integer of from zero to four and where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —$(CF_2)_nCF_3$, in which n is an integer from 0 to 10); (43) perfluoroalkoxy (e.g., —O—$(CF_2)_nCF_3$, in which n is an integer from 0 to 10); (44) aryloxy (e.g., —O—R, in which R is aryl); (45) cycloalkoxy (e.g., —O—R, in which R is cycloalkyl); (46) cycloalkylalkoxy (e.g., —O-L-R, in which L is alkyl and R is cycloalkyl); and (47) arylalkoxy (e.g., —O-L-R, in which L is alkyl and R is aryl). In particular embodiments, an unsubstituted aryl group is a $C_{4-18}$, $C_{4-14}$, $C_{4-12}$, $C_{4-10}$, $C_{6-14}$, $C_{6-14}$, $C_{6-12}$, or $C_{6-10}$ aryl group.

By "arylalkoxy" is meant an alkyl-aryl group, as defined herein, attached to the parent molecular group through an oxygen atom. In some embodiments, the arylalkoxy group is —O-L-R, in which L is an alkyl group, as defined herein, and R is an aryl group, as defined herein.

By "aryloxy" is meant —OR, where R is an optionally substituted aryl group, as described herein. In some embodiments, an unsubstituted aryloxy group is a $C_{4-18}$ or $C_{6-18}$ aryloxy group.

By "aryloxycarbonyl" is meant an aryloxy group, as defined herein, that is attached to the parent molecular group through a carbonyl group. In some embodiments, an unsubstituted aryloxycarbonyl group is a $C_{5-19}$ aryloxycarbonyl group. In other embodiments, the aryloxycarbonyl group is —C(O)O—R, in which R is an aryl group, as defined herein.

By "aryloyl" is meant an aryl group that is attached to the parent molecular group through a carbonyl group. In some embodiments, an unsubstituted aryloyl group is a $C_{7-11}$ aryloyl or $C_{5-19}$ aryloyl group. In other embodiments, the aryloyl group is —C(O)—R, in which R is an aryl group, as defined herein.

By "azido" is meant an —$N_3$ group.

By "azidoalkyl" is meant an azido group attached to the parent molecular group through an alkyl group, as defined herein. In some embodiments, the azidoalkyl group is -L-$N_3$, in which L is an alkyl group, as defined herein.

By "azo" is meant an —N═N— group.

By "carbonyl" is meant a —C(O)— group, which can also be represented as >C═O.

By "carboxyl" is meant a —$CO_2$H group or an anion thereof.

By "cyano" is meant a —CN group.

By "cycloaliphatic" is meant an aliphatic group, as defined herein, that is cyclic.

By "cycloalkoxy" is meant a cycloalkyl group, as defined herein, attached to the parent molecular group through an oxygen atom. In some embodiments, the cycloalkoxy group is —O—R, in which R is a cycloalkyl group, as defined herein.

By "cycloalkylalkoxy" is meant an alkyl-cycloalkyl group, as defined herein, attached to the parent molecular group through an oxygen atom. In some embodiments, the cycloalkylalkoxy group is —O-L-R, in which L is an alkyl group, as defined herein, and R is a cycloalkyl group, as defined herein.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.heptyl], and the like. The cycloalkyl group can also be substituted or unsubstituted. For example, the cycloalkyl group can be substituted with one or more groups including those described herein for alkyl.

By "cycloheteroaliphatic" is meant a heteroaliphatic group, as defined herein, that is cyclic.

By "disulfide" is meant —SSR, where R is selected from hydrogen, aliphatic, heteroaliphatic, haloaliphatic, haloheteroaliphatic, aromatic, as defined herein, or any combination thereof.

By "ester" is meant —C(O)OR or —OC(O)R, where R is selected from aliphatic, heteroaliphatic, haloaliphatic, haloheteroaliphatic, aromatic, as defined herein, or any combination thereof.

By "halo" is meant F, Cl, Br, or I.

By "haloaliphatic" is meant an aliphatic group, as defined herein, in which one or more hydrogen atoms, such as one to 10 hydrogen atoms, independently is replaced with a halogen atom, such as fluoro, bromo, chloro, or iodo.

By "haloaliphatic-aryl" is meant an aryl group, as defined herein, that is or can be coupled to a compound disclosed herein, where the aryl group is or becomes coupled through a haloaliphatic group, as defined herein. In some embodiments, the haloaliphatic-aryl group is -L-R, in which L is a haloaliphatic group, as defined herein, and R is an aryl group, as defined herein.

By "haloaliphatic-heteroaryl" is meant an heteroaryl group, as defined herein, that is or can be coupled to a compound disclosed herein, where the heteroaryl group is or becomes coupled through a haloaliphatic group, as defined herein. In some embodiments, the haloaliphatic-heteroaryl group is -L-R, in which L is a haloaliphatic group, as defined herein, and R is a heteroaryl group, as defined herein.

By "haloalkyl" is meant an alkyl group, as defined herein, where one or more hydrogen atoms, such as one to 10 hydrogen atoms, independently is replaced with a halogen atom, such as fluoro, bromo, chloro, or iodo. In an independent embodiment, haloalkyl can be a —$CX_3$ group, wherein each X independently can be selected from fluoro, bromo, chloro, or iodo. In some embodiments, the haloalkyl group is -L-X, in which L is an alkyl group, as defined herein, and X is fluoro, bromo, chloro, or iodo. In other embodiments, the haloalkyl group is -L-C(X)($R^1$)—$R^2$, in which L is a covalent bond or an alkyl group, as defined herein; X is fluoro, bromo, chloro, or iodo; and each of $R^1$ and $R^2$ is, independently, H or alkyl, as defined herein.

By "haloheteroaliphatic" is meant a heteroaliphatic, as defined herein, in which one or more hydrogen atoms, such as one to 10 hydrogen atoms, independently is replaced with a halogen atom, such as fluoro, bromo, chloro, or iodo.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroaliphatic-aryl" is meant an aryl group, as defined herein, that is or can be coupled to a compound disclosed herein, where the aryl group is or becomes coupled through a heteroaliphatic group, as defined herein. In some embodiments, the heteroaliphatic-aryl group is -L-R, in which L is a heteroaliphatic group, as defined herein, and R is an aryl group, as defined herein.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group.

By "heteroalkylene" is meant a multivalent (e.g., bivalent form) of a heteroalkyl group, heteroalkenyl group, or heteroalkynyl group, as described herein. The heteroalkylene group can be branched or unbranched. The heteroalkylene group can also be substituted or unsubstituted. For example, the heteroalkylene group can be substituted with one or more substitution groups, as described herein for alkyl.

By "heteroalkyl-aryl," "heteroalkenyl-aryl," and "heteroalkynyl-aryl" is meant an aryl group, as defined herein, that is or can be coupled to a compound disclosed herein, where the aryl group is or becomes coupled through a heteroalkyl, heteroalkenyl, or heteroalkynyl group, respectively, as defined herein. In some embodiments, the heteroalkyl-aryl group is -L-R, in which L is a heteroalkyl group, as defined herein, and R is an aryl group, as defined herein. In some embodiments, the heteroalkenyl-aryl group is -L-R, in which L is a heteroalkenyl group, as defined herein, and R is an aryl group, as defined herein. In some embodiments, the heteroalkynyl-aryl group is -L-R, in which L is a heteroalkynyl group, as defined herein, and R is an aryl group, as defined herein.

By "heteroalkyl-heteroaryl," "heteroalkenyl-heteroaryl," and "heteroalkynyl-heteroaryl" is meant a heteroaryl group, as defined herein, that is or can be coupled to a compound disclosed herein, where the heteroaryl group is or becomes coupled through a heteroalkyl, heteroalkenyl, or heteroalkynyl group, respectively, as defined herein. In some embodiments, the heteroalkyl-heteroaryl group is -L-R, in which L is a heteroalkyl group, as defined herein, and R is a heteroaryl group, as defined herein. In some embodiments, the heteroalkenyl-heteroaryl group is -L-R, in which L is a heteroalkenyl group, as defined herein, and R is a heteroaryl group, as defined herein. In some embodiments, the heteroalkynyl-heteroaryl group is -L-R, in which L is a heteroalkynyl group, as defined herein, and R is a heteroaryl group, as defined herein.

By "heteroaromatic" is meant an aromatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroaryl" is meant an aryl group including at least one heteroatom to six heteroatoms, such as one to four heteroatoms, which can be selected from, but not limited to, oxygen, nitrogen, sulfur, silicon, boron, selenium, phosphorous, and oxidized forms thereof within the ring. Such heteroaryl groups can have a single ring or multiple condensed rings, where the condensed rings may or may not be aromatic or may contain a heteroatom, provided that the point of attachment is through an atom of the aromatic heteroaryl group. Heteroaryl groups may be substituted with one or more groups other than hydrogen, such as aliphatic, heteroaliphatic, aromatic, other functional groups, or any combination thereof. An exemplary heteroaryl includes a subset of heterocyclyl groups, as defined herein, which are aromatic, i.e., they contain 4n+2 pi electrons within the mono- or multicyclic ring system.

By "heteroatom" is meant an atom other than carbon, such as oxygen, nitrogen, sulfur, silicon, boron, selenium, or phosphorous. In particular disclosed embodiments, such as when valency constraints do not permit, a heteroatom does not include a halogen atom.

By "heterocyclyl" is meant a 5-, 6- or 7-membered ring, unless otherwise specified, containing one, two, three, or four non-carbon heteroatoms (e.g., independently selected from the group consisting of nitrogen, oxygen, phosphorous, sulfur, or halo). The 5-membered ring has zero to two double bonds and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include thiiranyl, thietanyl, tetrahydrothienyl, thianyl, thiepanyl, aziridinyl, azetidinyl, pyrrolidinyl, piperidinyl, azepanyl, pyrrolyl, pyrrolinyl, pyrazolyl, pyrazolinyl, pyrazolidinyl, imidazolyl, imidazolinyl, imidazolidinyl, pyridyl, homopiperidinyl, pyrazinyl, piperazinyl, pyrimidinyl, pyridazinyl, oxazolyl, oxazolidinyl, oxazolidonyl, isoxazolyl, isoxazolidiniyl, morpholinyl, thiomorpholinyl, thiazolyl, thiazolidinyl, isothiazolyl, isothiazolidinyl, indolyl, quinolinyl, isoquinolinyl, benzimidazolyl, benzothiazolyl, benzoxazolyl, furyl, thienyl, thiazolidinyl, isothiazolyl, isoindazoyl, triazolyl, tetrazolyl, oxadiazolyl, uricyl, thiadiazolyl, pyrimidyl, tetrahydrofuranyl, dihydrofuranyl, dihydrothienyl, dihydroindolyl, tetrahydroquinolyl, tetrahydroisoquinolyl, pyranyl, dihydropyranyl, tetrahydropyranyl, dithiazolyl, dioxanyl, dioxinyl, dithianyl, trithianyl, oxazinyl, thiazinyl, oxothiolanyl, triazinyl, benzofuranyl, benzothienyl, and the like.

By "heterocyclyloxy" is meant a heterocyclyl group, as defined herein, attached to the parent molecular group through an oxygen atom. In some embodiments, the heterocyclyloxy group is —O—R, in which R is a heterocyclyl group, as defined herein.

By "heterocyclyloyl" is meant a heterocyclyl group, as defined herein, attached to the parent molecular group through a carbonyl group. In some embodiments, the heterocyclyloyl group is —C(O)—R, in which R is a heterocyclyl group, as defined herein.

By "hydroxyl" is meant —OH.

By "hydroxyalkyl" is meant an alkyl group, as defined herein, substituted by one to three hydroxyl groups, with the proviso that no more than one hydroxyl group may be attached to a single carbon atom of the alkyl group and is exemplified by hydroxymethyl, dihydroxypropyl, and the like. In some embodiments, the hydroxyalkyl group is -L-OH, in which L is an alkyl group, as defined herein. In other embodiments, the hydroxyalkyl group is -L-C(OH)($R^1$)—$R^2$, in which L is a covalent bond or an alkyl group, as defined herein, and each of $R^1$ and $R^2$ is, independently, H or alkyl, as defined herein.

By "imido" is meant a =NR group, where R is selected from H, aliphatic, heteroaliphatic, aromatic, as defined herein, or any combination thereof.

By "ketone" is meant —C(O)R or a compound including such a group, where R is selected from aliphatic, heteroaliphatic, aromatic, as defined herein, or any combination thereof. An example of a ketone can include $R^1$C(O)R, in which each of R and $R^1$ is, independently, selected from aliphatic, haloaliphatic, haloheteroaliphatic, heteroaliphatic, aromatic, aliphatic-aromatic, heteroaliphatic-aromatic, as defined herein, or any combination thereof.

By "nitro" is meant an —$NO_2$ group.

By "nitroalkyl" is meant an alkyl group, as defined herein, substituted by one to three nitro groups. In some embodiments, the nitroalkyl group is -L-NO, in which L is an alkyl group, as defined herein. In other embodiments, the nitroalkyl group is -L-C(NO)($R^1$)—$R^2$, in which L is a covalent bond or an alkyl group, as defined herein, and each of $R^1$ and $R^2$ is, independently, H or alkyl, as defined herein.

By "oxo" or "oxide" is meant an =O group.

By "oxy" is meant —O—.

By "perfluoroalkyl" is meant an alkyl group, as defined herein, having each hydrogen atom substituted with a fluorine atom. Exemplary perfluoroalkyl groups include trifluoromethyl, pentafluoroethyl, etc. In some embodiments, the perfluoroalkyl group is —$(CF_2)_nCF_3$, in which n is an integer from 0 to 10.

By "perfluoroalkoxy" is meant an alkoxy group, as defined herein, having each hydrogen atom substituted with a fluorine atom. In some embodiments, the perfluoroalkoxy group is —O—R, in which R is a perfluoroalkyl group, as defined herein.

By "salt" is meant an ionic form of a compound or structure (e.g., any formulas, compounds, or compositions described herein), which includes a cation or anion compound to form an electrically neutral compound or structure. Salts are well known in the art. For example, non-toxic salts are described in Berge S. M. et al., "Pharmaceutical salts," *J. Pharm. Sci.* 1977 January; 66(1):1-19; and in "Handbook of Pharmaceutical Salts: Properties, Selection, and Use," Wiley-VCH, April 2011 (2nd rev. ed., eds. P. H. Stahl and C. G. Wermuth. The salts can be prepared in situ during the final isolation and purification of the compounds of the invention or separately by reacting the free base group with a suitable organic acid (thereby producing an anionic salt) or by reacting the acid group with a suitable metal or organic salt (thereby producing a cationic salt). Representative anionic salts include acetate, adipate, alginate, ascorbate, aspartate, benzenesulfonate, benzoate, bicarbonate, bisulfate, bitartrate, borate, bromide, butyrate, camphorate, camphorsulfonate, chloride, citrate, cyclopentanepropionate, digluconate, dihydrochloride, diphosphate, dodecylsulfate, edetate, ethanesulfonate, fumarate, glucoheptonate, gluconate, glutamate, glycerophosphate, hemisulfate, heptonate, hexanoate, hydrobromide, hydrochloride, hydroiodide, hydroxyethanesulfonate, hydroxynaphthoate, iodide, lactate, lactobionate, laurate, lauryl sulfate, malate, maleate, malonate, mandelate, mesylate, methanesulfonate, methylbromide, methylnitrate, methylsulfate, mucate, 2-naphthalenesulfonate, nicotinate, nitrate, oleate, oxalate, palmitate, pamoate, pectinate, persulfate, 3-phenylpropionate, phosphate, picrate, pivalate, polygalacturonate, propionate, salicylate, stearate, subacetate, succinate, sulfate, tannate, tartrate, theophyllinate, thiocyanate, triethiodide, toluenesulfonate, undecanoate, valerate salts, and the like. Representative cationic salts include metal salts, such as alkali or alkaline earth salts, e.g., barium, calcium (e.g., calcium edetate), lithium, magnesium, potassium, sodium, and the like; other metal salts, such as aluminum, bismuth, iron, and zinc; as well as nontoxic ammonium, quaternary ammonium, and amine cations, including, but not limited to ammonium, tetramethylammonium, tetraethylammonium, methylamine, dimethylamine, trimethylamine, triethylamine, ethylamine, pyridinium, and the like. Other cationic salts include organic salts, such as chloroprocaine, choline, dibenzylethylenediamine, diethanolamine, ethylenediamine, methylglucamine, and procaine. Yet other salts include ammonium, sulfonium, sulfoxonium, phosphonium, iminium, imidazolium, benzimidazolium, amidinium, guanidinium, phosphazinium, phosphazenium, pyridinium, etc., as well as other cationic groups described herein (e.g., optionally substituted isoxazolium, optionally substituted oxazolium, optionally substituted thiazolium, optionally substituted pyrrolium, optionally substituted furanium, optionally substituted thiophenium, optionally substituted imidazolium, optionally substituted pyrazolium, optionally substituted isothiazolium, optionally substituted triazolium, optionally substituted tetrazolium, optionally substituted furazanium, optionally substituted pyridinium, optionally substituted pyrimidinium, optionally substituted pyrazinium, optionally substituted triazinium, optionally substituted tetrazinium, optionally substituted pyridazinium, optionally substituted oxazinium, optionally substituted pyrrolidinium, optionally substituted pyrazolidinium, optionally substituted imidazolinium, optionally substituted isoxazolidinium, optionally substituted oxazolidinium, optionally substituted piperazinium, optionally substituted piperidinium, optionally substituted morpholinium, optionally substituted azepanium, optionally substituted azepinium, optionally substituted indolium, optionally substituted isoindolium, optionally substituted indolizinium, optionally substituted indazolium, optionally substituted benzimidazolium, optionally substituted isoquinolinum, optionally substituted quinolizinium, optionally substituted dehydroquinolizinium, optionally substituted quinolinium, optionally substituted isoindolinium, optionally substituted benzimidazolinium, and optionally substituted purinium).

By "silyl ether" is meant a functional group including a silicon atom covalently bound to an alkoxy group, as defined herein. In some embodiments, the silyl ether is —Si—O—R or Si—O—R, in which R is an alkyl group, as defined herein.

By "sulfinyl" is meant an —S(O)— group.

By "sulfo" is meant an $—S(O)_2OH$ group.

By "sulfonyl" or "sulfonate" is meant an $—S(O)_2—$ group or a $—SO_2R$, where R is selected from hydrogen, aliphatic, heteroaliphatic, haloaliphatic, haloheteroaliphatic, aromatic, as defined herein, or any combination thereof.

By "thioalkoxy" is meant an alkyl group, as defined herein, attached to the parent molecular group through a sulfur atom. Exemplary unsubstituted thioalkoxy groups include $C_{1-6}$ thioalkoxy. In some embodiments, the thioalkoxy group is —S—R, in which R is an alkyl group, as defined herein.

By "thioalkoxyalkyl" is meant an alkyl group, as defined herein, which is substituted with a thioalkoxy group, as defined herein. Exemplary unsubstituted thioalkoxyalkyl groups include between 2 to 12 carbons ($C_{2-12}$ thioalkoxyalkyl), as well as those having an alkyl group with 1 to 6 carbons and a thioalkoxy group with 1 to 6 carbons (i.e., $C_{1-6}$ thioalkoxy-$C_{1-6}$ alkyl).

In some embodiments, the thioalkoxyalkyl group is -L-S—R, in which each of L and R is, independently, an alkyl group, as defined herein.

By "thiol" is meant an —SH group.

Any of the functional groups or chemical moieties described herein can be employed within a ligand (e.g., for a Mo-containing precursor, a C-containing precursor, a Si-containing precursor, or a B-containing precursor).

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein or defined above can be substituted or unsubstituted, unless otherwise indicated therein.

Other features and advantages of the invention will be apparent from the following description and the claims.

BRIEF DESCRIPTION OF THE DRAWINGS

FIG. 3A-3B shows process flow diagrams depicting operations performed in accordance with certain disclosed embodiments. Provided are diagrams for (A) non-limiting operations for processing a substrate and (B) yet other non-limiting operations for processing a substrate.

DETAILED DESCRIPTION

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Particular technology nodes require advanced semiconductor processing that can provide more selective patterning or etching operations. The present disclosure relates, in part, to a Mo-containing layer that can provide enhanced selectivity. Such a layer can be useful for extending technology scaling, such as by providing a selective hardmask material. Thus, in certain embodiments, the Mo-containing layer exhibits certain characteristics (e.g., density, etch selectivity, hydrogen content, fluorine content, etc., as well as combinations thereof) that demonstrate desired film behavior for use as a hardmask.

Conventional deposition of molybdenum can involve the use of a fluorine-containing precursor, such as $MoF_6$. However, the use of $MoF_6$ can result in incorporation of a high amount of fluorine into the deposited Mo-containing film. The presence of fluorine can cause electromigration or fluorine diffusion into adjacent components and damages contacts, thereby reducing the performance of the device. As devices shrink, features become smaller and the detrimental effects electromigration as well as ion diffusion become more prominent, thereby causing device failure. Mo films containing increased amounts of fluorine can thereby pose integration and reliability issues, as well as device performance issues related to the underlying films or device structures, such as vias and gates. Described herein are processes having minimal fluorine content. In one instance, fluorine-free Mo-containing precursors can be employed. In another instance, fluorine-containing Mo-containing precursors are employed, but the deposition process can minimize fluorine content within the growing film.

Figure 1:
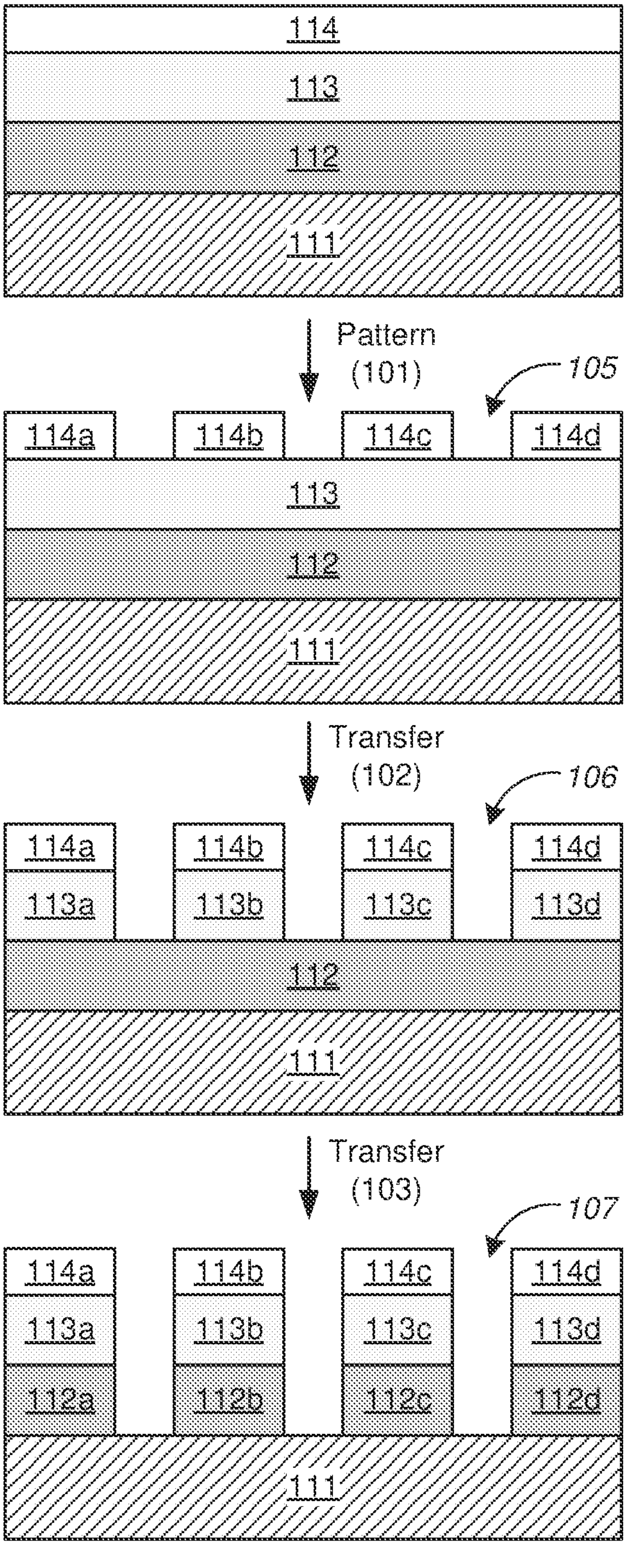
FIG. 1 provides schematic illustrations of a stack undergoing patterning and etching operations.

FIG. 1 provides a non-limiting use of a stack with a hardmask. For instance, the stack can include a resist layer 114, a Mo-containing layer 113, a material layer 112, and a substrate layer 111. In some instances, the term "substrate" is employed to be a general surface upon which the Mo-containing layer can be deposited. Thus, in FIG. 1, a substrate can include a material layer 112 and a substrate layer 111. Such a substrate can be considered, in some instances, as a stack.

As can be seen, the material layer 112 is disposed between the Mo-containing layer 113 and the substrate layer 111; and the resist layer 114 can be disposed on a top surface portion of the Mo-containing layer 113. A method of processing the stack (or the substrate, which can used interchangeably) can include patterning 101 the resist layer 114 to form a resist mask having a pattern. As can be seen, the resist mask can include patterned features 114*a/b/c/d* having openings 105 disposed therein.

Turning again to FIG. 1, the method can further include transferring 102 the pattern of the resist mask to the underlying Mo-containing layer 113. Upon transfer of the pattern from the resist mask to the Mo-containing layer, the Mo-containing layer itself possesses a defined pattern. In some embodiments, the Mo-containing layer acts as a hardmask including patterned features 113*a/b/c/d* and having one or more openings 106 disposed therein.

The defined pattern provided by the Mo-containing layer can then be transferred to a material layer. Turning to FIG. 1, the method can further include transferring 103 the defined pattern of the Mo-containing layer (acting as a hardmask) to the underlying material layer 112. After patterning, the material layer can possess patterned features 112*a/b/c/d* and having one or more openings 107 disposed therein.

In addition to use of the Mo-containing layer as a hardmask, the Mo-containing layer can serve other purposes. For instance, the Mo-containing layer can serve as an etch stop layer, a conformal layer, a planar layer, a step coverage layer, a barrier layer, an isolation layer, or any other useful layer within a stack.

Figure 2:
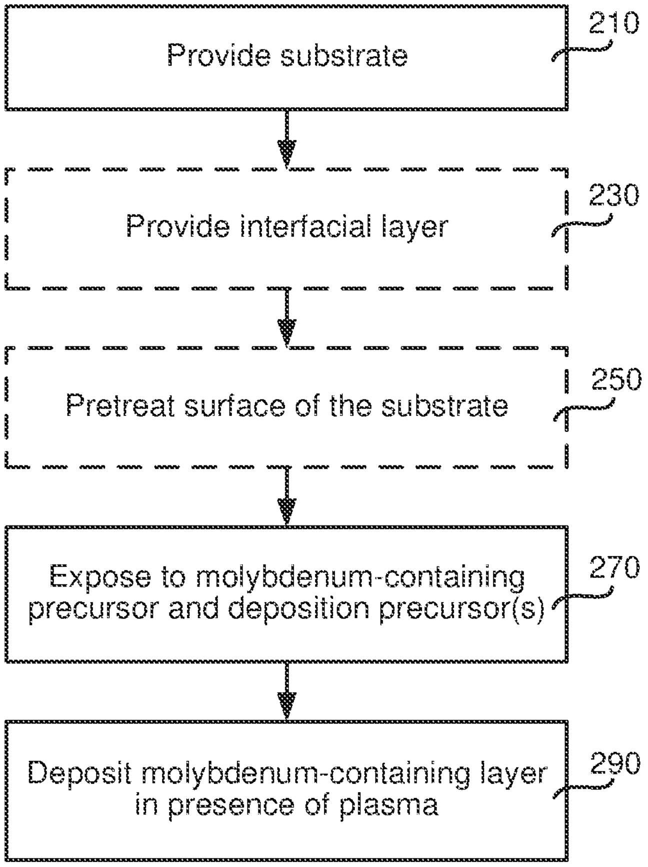
FIG. 2 is a process flow diagram depicting operations performed in accordance with certain disclosed embodiments for providing a Mo-containing layer.

The Mo-containing layer can be provided in any useful manner. As seen in FIG. 2, one non-limiting method can include providing 210 a substrate and exposing 270 a surface portion of the substrate to one or more Mo-containing precursors with one or more deposition precursors. Non-limiting Mo-containing precursors can be any described herein. The deposition precursor(s) can include any precursor that does not include Mo. Such non-limiting deposition precursors can include a C-containing precursor, a Si-containing precursor, or a B-containing precursor.

The providing and exposing operations can include use of a processing chamber having a substrate holder. The providing operation can include providing the substrate to a substrate holder, which can be a pedestal.

The exposing operation can include delivering the Mo-containing precursor(s) and the one or more deposition precursors either sequentially or simultaneously. Such delivery can include atomic layer deposition (ALD), chemical vapor deposition (CVD), as well as plasma-enhanced forms thereof.

Turning again to FIG. 2, the method can include depositing 290 the Mo-containing layer optionally in the presence of a plasma. In some embodiments, deposition can include a plasma enhanced chemical vapor deposition (PECVD) process. Processing conditions to provide a plasma are described herein.

The exposing or depositing operations can include use of another reagent, such as a reactant gas, a reducing agent, a carrier gas, or a combination thereof. Non-limiting reagents can include those in gas form, such as hydrogen ($H_2$), argon (Ar), nitrogen ($N_2$), helium (He), and combinations thereof.

Optionally, the stack can include an interfacial layer disposed between the Mo-containing layer and the substrate. The interfacial layer, in some instances, can provide an adhesion layer, an initiation layer, or a growth layer. As seen in FIG. 2, the method can include an optional operation 230 of providing an interfacial layer on a top surface portion of the substrate. Thus, exposing the substrate to the Mo-containing precursor will provide the Mo-containing layer on a top surface portion of the interfacial layer.

Furthermore, in other options, a top surface portion of the substrate can be pretreated. As seen in FIG. 2, the method can include an optional operation 250 of pretreating a top surface portion of the substrate. Thus, exposing the substrate to the Mo-containing precursor will provide the Mo-containing layer on a top surface portion of a pretreated surface. Without wishing to be limited by mechanism, such pretreatment can increase adhesion of the Mo-containing layer to the interfacial layer or to the top surface portion of the substrate. Non-limiting pretreatment condition can include use of helium (He), argon (Ar), nitrogen ($N_2$), or hydrogen ($H_2$), as well as combinations thereof, which can be used to pretreat the surface (e.g., prior to introducing Mo-containing precursors or other deposition precursors described herein.

Operations 230, 250 can be performed sequentially in any order. In one instance, the method includes providing an interfacial layer and then pretreating a top surface portion of the interfacial layer, thereby providing a pretreated surface upon the interfacial layer. In another instance, the method includes pretreating a top surface portion of the substrate, thereby providing the pretreated surface; and then providing an interfacial layer on the pretreated surface. In yet other instance, only one of operation 230 or operation 250 is performed.

The present disclosure also relates to methods for processing a substrate. Such processing can include transferring a pattern to a portion of the substrate. As employed herein, the term substrate can refer to a particular material or layer, to a combination of materials or layer, to a stack, or any other useful combination of materials and devices. Thus, a pattern can be transferred to any material, layer, stack, device, or a portion thereof.

Semiconductor fabrication processes involve fabrication of memory and logic devices. Examples include 3D NAND and dynamic random-access memory (DRAM) applications, as well as logic applications for mid end of line (MEOL) and back end of line (BEOL) processes. Fabrication of memory and logic devices often involve etching features, such as contact holes, on a substrate, which may include one material or multiple layers of material some of which may be semiconductor material. "Features" such as via or contact holes may be characterized by one or more of narrow or re-entrant openings, constrictions within the feature, and high aspect ratios. The term "feature" as described herein refers to negative features such as holes or vias. Etching features, in many cases, involves depositing and patterning a hardmask over the material to be etched, and etching the material using the hardmask as a pattern. The patterned hardmask may eventually be removed from the substrate. As described herein, the Mo-containing layer can be employed as a hardmask or an etch stop layer.

In other embodiments, the Mo-containing layer provided herein can be used as component within interconnect metallization (e.g., for filling recessed features to form contacts), in logic gate applications in FinFETs, as adhesion layers or diffusion barriers, and in 3D NAND fabrication. For instance, a Mo-containing layer can be employed as a liner for subsequent deposition of a different metal layer, a metallization layer, or a different metal-containing layer (e.g., a cobalt-containing layer or a pure molybdenum metal layer). Examples of applications include logic and memory contact fill, DRAM buried wordline fill, vertically integrated memory gate, and wordline fill, and 3-D integration using through-silicon vias (TSV). Without wishing to be limited by mechanism, the resistivity of molybdenum scales better than that of tungsten, and in some embodiments, molybdenum is particularly advantageous metal for filling narrow recessed features, e.g., features with widths of less than about 20 nm. In one exemplary application, molybdenum metal is used for manufacturing barrierless contacts. In this application, molybdenum metal is deposited directly into the recessed features (contact holes) having widths of about 5-100 nm, e.g., about 5-20 nm, where the recessed features are formed in the dielectric layer, and include exposed dielectric, such as silicon oxide, silicon nitride, or a low-k material such as silicon oxycarbide at the sidewalls and exposed silicon or silicon germanium at the bottom. In alternative embodiments, the contact hole prior to deposition may be lined with an interfacial layer (such as tungsten nitride, molybdenum nitride, molybdenum carbide, or titanium nitride) onto which the molybdenum metal is deposited.

Figure 3A:
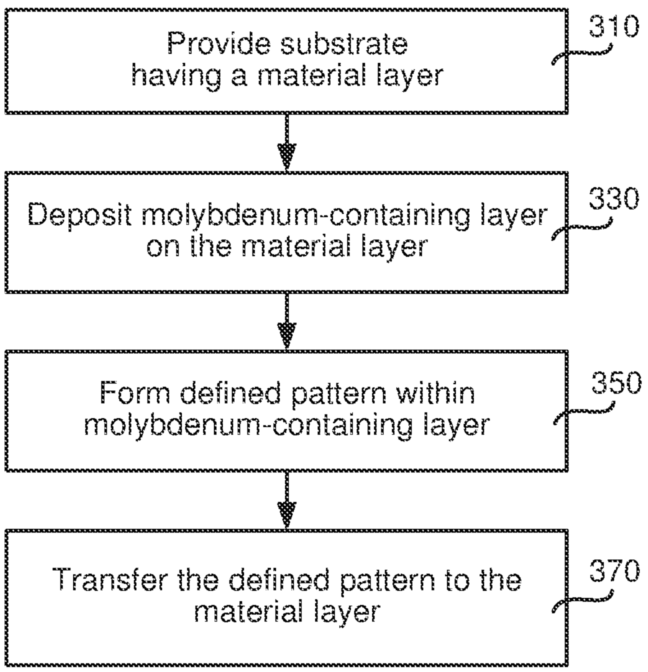

In particular embodiments, such processing can include use of the Mo-containing layer as a hardmask in order to pattern a material layer. As seen in FIG. 3A, a method can include providing 310 a substrate having a material layer, depositing 330 a Mo-containing layer on a top surface portion of the material layer, forming 350 a defined pattern within the Mo-containing layer, and transferring 370 the defined pattern to the material layer underlying the Mo-containing layer. Optionally, the method can include providing an interfacial layer or pretreating a surface of the substrate prior to depositing the Mo-containing layer. The process may also include other operations, e.g., removing the Mo-containing layer, the interfacial layer, or the pretreated surface.

Processing of the substrate can include further operations to transfer patterns. As seen in FIG. 3B, a method can include providing 310 a substrate having a material layer. Optional operations can include providing an interfacial layer on the top surface portion of the substrate, thereby disposing the interfacial layer between the substrate and the Mo-containing layer; or pretreating the surface to provide a pretreated surface 320. The process may also include other operations, e.g., removing the Mo-containing layer, the interfacial layer, or the pretreated surface.

The method can further include depositing 330 a Mo-containing layer on atop surface portion of the material layer, and depositing 351 a resist layer to form a resist mask having a pattern. The resist layer can be further patterned (e.g., photopatterned) to form the resist mask. In addition to a resist mask, any useful patterned mask may be employed and disposed over the Mo-containing layer.

The resist mask can be used to pattern the Mo-containing layer. For instance, the method can further include transferring 352 the pattern of the resist mask onto the Mo-containing layer. Upon transferring this pattern, the Mo-containing layer can be employed as a hardmask, which in turn possesses a defined pattern provided by the resist mask. The defined pattern can include one or more patterned features and one or more openings within the Mo-containing layer. Finally, the method can include transferring 371 the defined pattern of the Mo-containing layer (employed as a hardmask) to the material layer disposed beneath the Mo-containing layer.

Such transferring operations can include etching the resist layer, Mo-containing layer, interfacial layer, pretreated surface, or material layer. Etching can define the opening within a particular layer, as well as transfer a pattern by etching a material through an exposed opening. Non-limiting etch chemistry can include a halogen-containing gas, such as nitrogen trifluoride ($NF_3$), boron trifluoride ($BF_3$), sulfur hexafluoride ($SF_6$), chlorine gas ($Cl_2$), bromine gas ($Br_2$), a $C_xF_y$-based gas in which x is from 1 to 10 and y is from 2 to 20; and the like; an oxygen-containing gas, such as oxygen ($O_2$); or a fluorine-containing gas, such as a $C_xF_y$-based gas, including any described herein.

When an interfacial layer is present, transfer of a pattern can include etching the interfacial layer through the defined pattern (or openings) within the Mo-containing layer. When a pretreated surface is present, then transfer of a pattern can include etching the pretreated surface through the defined pattern within the Mo-containing layer.

Deposition Processes

Deposition can include delivering one or more precursors to the processing chamber. Such precursors can include a Mo-containing precursor, which is deposited in the presence of one or more deposition precursors to provide a Mo-containing layer. The precursors herein can be delivered in the presence of a gas (e.g., a reactant gas, a reducing agent, or a carrier gas, as well as combinations thereof) to the processing chamber. The carrier gas can be, for instance, an inert gas. Non-limiting gases include hydrogen ($H_2$), nitrogen ($N_2$), helium (He), neon (Ne), argon (Ar), krypton (Kr), xenon (Xe), and the like.

In particular embodiments, a reducing agent is employed during deposition. In one instance, a reducing agent is employed to reduce the metal atom (e.g., a Mo atom) within the film to a lower oxidation state. In another instance, the reducing agent is able to remove halides or other impurities within the growing film. Non-limiting reducing agents can include hydrogen ($H_2$), methane ($CH_4$), ammonia ($NH_3$), other nitrogen-containing gas or nitrogen-containing reducing agent such hydrazine ($N_2H_4$), carbon monoxide (CO), a boron-containing or silicon-containing reducing agent such as $B_2H_6$ or $SiH_4$, and the like. Yet other reducing agents include water, alcohol, $H_2S$, a hydrocarbon (e.g., any described herein, including methane ($CH_4$), acetylene ($C_2H_2$), ethylene ($C_2H_4$), propylene ($C_3H_6$), and the like), and a thiol, optionally using plasma activation.

In some embodiments, deposition includes use of a Mo-containing precursor, a deposition precursor, and a reducing agent. In particular embodiments, the deposition precursor is a C-containing precursor, a Si-containing precursor, or a B-containing precursor. The reducing agent can be any described herein, including but not limited to hydrogen ($H_2$) gas.

The Mo-containing layer can be disposed on a top surface portion of the substrate, on a top surface portion of an interfacial layer (which in turn is provided on a top of the substrate), or on a top surface portion of a pretreated surface. Use of the interfacial layer or pretreated surface can enhance adhesion of the Mo-containing layer to the substrate.

Prior to deposition of the Mo-containing layer, the surface can include an interfacial layer. The interfacial layer can be provided by way of ALD, CVD, or plasma-enhanced forms thereof. Non-limiting precursors and deposition conditions to provide the interlayer are described herein.

Prior to deposition of the Mo-containing layer, the surface can be pretreated. Such pretreatment can include treating a surface portion of the substrate or treating a surface portion of an interfacial layer, if present. In one instance, the surface can be pretreated with a soak gas. Non-limiting soak gases include an oxygen-containing gas, nitrogen-containing gas, or other suitable gas that is capable of changing the interface between the substrate and the later deposited material to reduce tunneling of electrons from the substrate. Examples of soak gases include oxygen ($O_2$), ammonia ($NH_3$), nitrogen ($N_2$), silane ($SiH_4$), disilane ($Si_2H_6$), trisilane ($Si_3H_8$), germane ($GeH_4$), argon (Ar), diborane ($B_2H_6$), hydrogen ($H_2$), nitrogen ($N_2$) gas, or combinations thereof.

In some embodiments, the substrate may be soaked using one or more gases. For example, in some embodiments, the substrate may be exposed to silane for a first duration, and then exposed to diborane for a second duration. Such operations may also be repeated in cycles. In any of the disclosed embodiments, a chamber housing the substrate may be purged between one or more cycles of soak operations. Purging may be performed by flowing an inert gas, such as argon, into the chamber.

Pretreating can optionally include modifying the substrate or the interfacial layer to provide a roughened surface. In some embodiments, said modifying can include sputtering by way of non-reactive ion bombardment of the surface to providing the roughened surface. Non-limiting non-reactive ions can include argon (Ar), helium (He), krypton (Kr), or other non-reactive species. In other embodiments, modifying can include exposing a surface to an oxygen-containing plasma to provide an oxygen-containing surface. Non-limiting oxygen-containing plasma can include carbon dioxide ($CO_2$), oxygen ($O_2$), or water (as $H_2O$ or as mixtures of $H_2$ and $O_2$).

In other embodiments, pretreating can optionally include exposing the substrate of the interfacial layer to ultraviolet radiation. Ultraviolet radiation may be emitted at a wavelength between about 180-600 nm for a duration between about 60-600 seconds.

Deposition of the Mo-containing layer can include ALD processes. CVD processes, as well as plasma-enhanced forms thereof. In some embodiments, deposition includes exposure of the precursors to plasma. Deposition can also include various types of plasma processes, such as use of inductively coupled plasma, capacitively coupled plasma, microwave plasma CVD, remote plasma enhanced CVD, and other similar processes.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a deposition cycle may include the following operations: (i) delivery/adsorption of a Mo-containing precursor, (ii) purging of the Mo-containing precursor from the chamber, (iii) delivery of the deposition precursor (e.g., a C-containing precursor, a Si-containing precursor, a B-containing precursor, in the optional presence of a reactant gas, reducing agent, carrier gas), and (iv) purging of the deposition precursor from the chamber.

In an ALD process, the substrate may be exposed in cycles. For instance, the substrate can be first exposed to a pulse of the Mo-containing precursor, then the precursor is optionally purged, then the substrate is exposed to a pulse of another reagent (e.g., a reducing agent or a deposition precursor), and then the reagent is optionally purged. Such cycles may be repeated until a desired thickness of the layer is formed on the substrate. It will be appreciated that the order of Mo-containing precursor, deposition precursor, and reducing agent may be in any useful order. Purging may be performed by flowing an inert gas, such as argon. In some embodiments, inert gases may also be used as a carrier gas to deliver one or more gases, including but not limited to soak gases, precursor gases, reactant gases, reducing agents, and carrier gases, to the substrate. While ALD is described herein as an example, it will be understood that films deposited by ALD herein may also be deposited by CVD or other techniques.

During any of the above described exposures, the gases may be pulsed or flowed continuously. Likewise, in some embodiments, during a purge, an inert gas may be pulsed during one or more times during a single purge operation. During deposition, one or more changes to one or more parameters such as pressure, flow rate, and temperature, may be used. In some embodiments, the pedestal may be moved during deposition, such that the gap between the substrate and a showerhead over the pedestal may be modulated. Moving the pedestal may be used in combination with altering one or more parameters such as pressure, temperature, or flow rate. Modulating the gap between the substrate and the showerhead can affect the pressure, temperature, or flow rate that may be used in accordance with certain disclosed embodiments.

The flow rate of the Mo-containing precursor, deposition precursor, and other optional gas (e.g., a reactant gas, a reducing agent, or a carrier gas) can be modified to provide the desired Mo-containing layer. Typical gas pressures and flow rates can include any described herein. In other embodiments, flow rates of Mo-containing precursor may be between about 20-1000 sccm, and flow rates of optional deposition precursor(s) may be between about 100-5000 sccm. The flow rate of carrier gas(es) can be about 1500-15000 sccm. If present, a reducing agent can be provided at a flow rate between about 100-1000 sccm. During deposition, one or more of the gases at the flow rates herein can be provided to a processing chamber. Optionally, plasma can be used, such as by remote delivery to the processing chamber or generating within the chamber, to deposit the Mo-containing layer. Exposure time can vary (e.g., from about 1-5000 sec) depending on the desired thickness of the layer or the desired thickness during each cycle of depositing the Mo-containing precursor and the other deposition precursor(s).

Plasma may be employed during deposition, pattern formation, pattern transfer, or etching. Various types of plasma sources may be used including RF, direct current (DC), and microwave based plasma sources. In some embodiments, an RF plasma source is used. Typically, the RF plasma power for a 300 mm wafer ranges between about 500-10000 Watts (W), or between about 3000-10000 W. In some embodiments, the power is about 7000 W per station. Depending on the process chamber being used, in some embodiments, each station has a dedicated power source. In various embodiments, the plasma is generated as an inductively coupled plasma upstream of the showerhead.

Generation of the plasma can include use of one or more radiofrequency (RF) power sources. In one instance, the RF power source provides a power of about 100-5000 W at a frequency of about 50 kHz to 100 MHz (e.g., from 50 kHz to 13.6 MHz, 50 kHz to 27 MHz, 13.6 MHz to 100 MHz, and ranges therebetween). In another instance, the RF power source provides a power of about 500-5000 W at a frequency of about 50 kHz to about 100 MHz (e.g., from 50 kHz to 13.6 MHz, 50 kHz to 27 MHz, 13.6 MHz to 100 MHz, and ranges therebetween). Generally, the plasma may be generated directly in the processing chamber housing the substrate (direct plasma or in situ plasma) or remotely in a separate compartment with the resulting plasma-activated species being fed to the processing chamber (remote plasma).

The power used to generate the plasma may be between about 10-3000 W per station (e.g., 100-1000 W, 200-1000 W, 200-800 W, 200-500 W, 500-3000 W, or 800-3000 W). The RF frequency used to generate the plasma can be between about 0.3-600 MHz (e.g., 13.56 MHz, 60 MHz, 27 MHz, 2 MHz, 40 MHz, 100 MHz, 400 kHz, or combinations thereof). The RF bias power may be between about 0-1000 W using a pulsed plasma or a continuous wave plasma.

The processing chamber can be an inductively coupled plasma (ICP) chamber or a capacitively coupled plasma (CCP) chamber. In some embodiments of the ICP chamber, the frequency of both the top ICP generator and the bias generator is 13.5 MHz. Depending on the underlayer, in some embodiments, the pressure can be about 10-400 mTorr, and the transformer coupled plasma (TCP) power can be about 200-500 W.

The RF frequency used to generate the plasma may be between about 0.3-600 MHz (e.g., 13.56 MHz, 60 MHz, 27 MHz, 2 MHz, 400 kHz, or combinations thereof). The RF bias power may be between about 10-1000 W using a pulsed plasma with a DC between 1-100%, in which 100% indicated CW (e.g., 1-99%). In some instance, the pulse duration of the plasma is between about 0.02-5 ms. The RF bias power can be pulsed below 5000 Hz, such as a frequency from about 5-2000 Hz (e.g., between about 5-100 Hz). The TCCT parameter can be from 0.1 to 1.5. In some non-limiting process, plasma exposure can include a high frequency (HF) RF component (e.g., generally between about 1-100 MHz, such as about 13.56 MHz) and a low frequency (LF) RF component (e.g., less than about 1 MHz or generally from about 100 kHz-2 MHz, such as about 100 kHz). Such HF and LF RF components can be provided at any useful plasma condition, such as any useful power ranges (e.g., from 100-1000 W or 100-5000 W) or frequency ranges (e.g., from 50 kHz to 100 MHz).

In particular embodiments, deposition involves a PECVD process. This process can include a transformer coupled plasma (TCP), an inductively coupled plasma (ICP), or capacitively coupled plasma (CCP). In particular embodiments, a TCP or ICP power is about 100-1000 W with no bias. In certain embodiments, generation of plasma (e.g., TCP or ICP) can be controlled by power, which is in a continuous wave (CW) mode.

In various embodiments, a bias is not applied to the pedestal during deposition or etching of the Mo-containing layer. However, in some embodiments, an RF bias is used. An RF bias may be used in some embodiments. Various types of RF biases may be used; for example, RF bias may be generated at a frequency of 13.56 MHz, or lower, including but not limited to 400 MHz, 2 MHz, and 1 MHz.

High bias may be employed in some instances. For example, etching may be performed using a high bias in pulses to effectively remove the Mo-containing layer. An example of a high bias is a bias having a power of at least about 1000 V applied to the pedestal during etch. The use of a bias depends on the chemistry and whether directional etching is used in the application of using certain disclosed embodiments. If a bias is applied, the power applied to the bias may be between about 10-3000 V, such as about 10 V. It will be understood that the terms “bias power” and “bias voltage” are used interchangeably herein to describe the voltage for which a pedestal is set when a bias is applied to the pedestal. Bias power or bias voltage as described herein is measured in watts for the power applied to the pedestal.

Bias can be applied using an applied pulsed bias (e.g., a power of about 10-1000 W) or an applied continuous wave bias (e.g., a power of about 10-500 W). In further embodiments, deposition (e.g., with TCP or ICP power in CW mode) can include an applied bias (regardless of frequency) that is pulsed (e.g., in the range of about 1 Hz to about 10 kHz, such as 10-2000 Hz) with a duty cycle between about 1-99%. Additional pulsing frequencies and duty cycles are described herein. In some embodiments, the applied pulsed bias can be provided to control ion energy. Non-limiting applied pulsed bias power can be from about 10-1000 W, as well as other ranges described herein.

For instance, a pulsed plasma may be pulsed between a low and high bias, or between a bias in the ON state and a bias in the OFF state (0 V) state. Pulsing between a low bias and a high bias involves pulsing between a low bias between about 100-300 V and a high bias between about 1000-2500 V.

Pulsing may be performed using a duty cycle (DC) between about 3% and about 40%, or about 3% to about 99%, or 100% (continuous bias). Duty cycle refers to the duration the pulse is on during a period. It will be understood that bias pulsing may involve repetitions of periods, each of which may last a duration T. The duration T includes the duration for pulse ON time (the duration for which the bias is in an ON state) and the duration for bias OFF time (the duration from which the bias is in an OFF state) during a given period. The pulse frequency will be understood as 1/T. For example, for a bias pulsing period T=100 μs, frequency is 1/T=1/100 μs, or 10 kHz. The duty cycle or duty ratio is the fraction or percentage in a period T during which the bias is in the ON state such that duty cycle or duty ratio is pulse ON time divided by T. For example, for a bias pulsing period T=100 μs, if a pulse ON time is 70 μs (such that the duration for which the bias is in an ON state in a period is 70 μs) and a pulse OFF time is 30 μs (such that the duration for which the bias is in an OFF state in a period is 30 μs), the duty cycle is 70%.

Pulsed or continuous bias can be employed to fine tune properties of the film. In one embodiment, pulsed bias can provide a higher density film, as compared to a low density film prepared with 0 W of bias power. Such higher density films can, in some instances, provide increased etch resistance, as compared to the low density film. In other instances, such higher density films can provide reduced undercut, as compared to a low density film prepared with 0 W of bias power.

In other embodiments, deposition can include an applied CW bias. CW bias may also be used to control ion energy. In some embodiments, the applied CW bias power can be from 10-1000 W (e.g., 10-500 W, 10-400 W, as well as other ranges described herein).

Other non-limiting process conditions include a pressure of >1 milliTorr (mTorr) (e.g., from about 5-1000 mTorr or 1 to 10 Torr), a power level of <5000 W (e.g., from about 10-3000 W), or a temperature of <200° C. (e.g., from about 0-100° C.) or >200° C. (e.g., from about 200-700° C.). Plasma can be generated with a power between about 10-3000 W with a RF source operating at 0.3-600 MHz.

Other processing conditions can include those to provide a useful Mo-containing layer. The substrate temperature for deposition may range, for example, from about 20-700° C. (e.g., from 300-650° C., from 250-650° C., from 250-550° C., or from 150-350° C.). In some embodiments, lower temperatures may be used. Such temperatures may be less than 500° C., less than 550° C., less than 450° C., less than 400° C., or less than 350° C. Low temperatures may be used for improved step coverage. In addition, low temperatures may increase the amount of impurities in the deposited layer, increasing the amorphous character, which in turn may increase grain size of the subsequently deposited layer. In various embodiments, it may be advantageous to deposit the layer at low temperatures. The chamber pressure may be between about 0.2-90 Torr, or between about 5-50 Torr, or between about 20-40 Torr, or about 30 Torr.

Yet other non-limiting deposition conditions include control of precursor flow rate(s), gas flow rate(s), process pressure, temperature (e.g., electrostatic chuck (ESC) temperature), plasma (e.g., TCP) power, bias power, and duty cycle (DC) within the processing chamber. The flow rate of precursor(s) may be between about 1-2500 standard cubic centimeter per minute (sccm) (e.g., about 20-5000 sccm, 100-5000 sccm, 20-1000 sccm, or 100-1000 sccm). The flow rate of carrier gas(es) may be between about 0-20000 sccm (e.g., 0-15000 sccm, 1000-2000 sccm, or 1000-15000 scmm). The chamber pressure may be between about 5-1000 mTorr (e.g., 5-800 mTorr, 10-500 mTorr, 10-400 mTorr, 30-500 mTorr, 10-1000 mTorr, or 30-1000 mTorr) or between about 0.2-20 Torr. The ESC temperature may be between about 20-700° C.; and the processing chamber may be between 200-650° C.

After deposition, the Mo-containing layer can be optionally annealed. Annealing can be performed by increasing the temperature. For example, if the reaction is conducted at a relatively low temperature, e.g., at a temperature of less than about 450° C., such as less than about 400° C., during the anneal the temperature can be increased e.g., by 50-200° C. In some embodiments, annealing is performed at a temperature of between about 300-500° C.

Pattern Formation and Transfer Processes

Within a semiconductor stack, patterning can be achieved by using masks. In one instance, a resist mask is employed by using a resist layer, which can be fabricated using a lithography process to optically instill a pattern within the photoresist and then to develop the photoresist to remove portions, thereby creating openings within the resist. Non-limiting resist can include a positive tone photoresist, a negative tone photoresist, an ultraviolet (UV) photoresist, an i-line photoresist, an electron-beam (e-beam) photoresist, and others. Non-limiting materials for patterning the Mo-containing layer can include, e.g., silicon dioxide, amorphous carbon, a silicon-containing precursor, a carbon-containing precursor, as well as materials including or formed from any of these.

The resist mask can be formed by depositing a layer of a resist material (e.g., by spin-coating) on a surface to a desired thickness. A pattern can be introduced into the resist material by exposing the resist to a patterning radiation (e.g., UV radiation) and then developing the resist material. After development, a pattern having openings is provided within the resist layer to produce the resist mask.

In turn, a resist mask can be used to provide a defined pattern within the Mo-containing layer. The Mo-containing layer, in some instances, can be used as a hardmask. The hardmask can optionally include feature openings with a width between about 16-120 nm. In use, the defined pattern within the Mo-containing layer can be transferred to a material layer disposed beneath the Mo-containing layer.

Transfer of a pattern can include providing a mask having openings and then etching the underlying material layer by using the mask. Etching can include aligning the mask above the material layer, in which openings within the mask define exposed portions of the material layer. Next, etching can include exposing the opened regions of the material layer to an etchant chemistry, which resulting in removal of the material layer through the opened region. Etching can include wet or dry processes, as well as combinations thereof.

Non-limiting etchant chemistry can include use of an etchant gas in the presence or absence of plasma. The etchant gas can include a fluorine-containing gas (e.g., a fluorocarbon gas or a perfluorocarbon gas), an oxygen-containing gas, a nitrogen-containing gas, a chlorine-containing gas, a carbon-containing gas, a halogen-containing gas, as well as mixtures thereof. The etchant gas can optionally include an inert gas, such as helium (He), neon (Ne), argon (Ar), krypton (Kr), xenon (Xe), and the like.

Non-limiting etchant gases are as follows. The fluorine-containing gas can be tetrafluoromethane ($CF_4$), perfluoroethane ($C_2F_6$), hexafluorocyclopropane or hexafluoropropene ($C_3F_6$), perfluoropropane ($C_3F_8$), hexafluoro-1,3-butadiene or hexafluorocyclobutene ($C_4F_6$), perfluoroisobutene or octafluorocyclobutane ($C_4F_8$), octafluorocyclopentene ($C_5F_8$), decafluorocyclopentane or perfluoropent-1-ene ($C_5F_{10}$), or 1,2,3,3,4,5,6,6-octafluorocyclohexa-1,4-diene or 3-(trifluorovinyl)pentafluorocyclobutene ($C_6F_8$), or a combination thereof. The oxygen-containing gas can include oxygen ($O_2$), carbon dioxide ($CO_2$), carbon monoxide (CO), nitrous oxide ($N_2O$), nitrogen dioxide ($NO_2$), ozone ($O_3$), water ($H_2O$), and the like. The nitrogen-containing gas can include nitrogen ($N_2$), ammonia ($NH_3$), $N_2O$, $NO_2$, and the like. The chlorine-containing gas can include hydrogen chloride (HCl), chlorine gas ($Cl_2$), tetrachloromethane ($CCl_4$), trichloromethane ($CHCl_3$), dichloromethane ($CH_2Cl_2$), chloromethane ($CH_3Cl$), and the like. The carbon-containing gas can be a hydrocarbon or any C-containing precursor herein, as well as methane ($CH_4$), ethane ($C_2H_6$), ethylene ($C_2H_4$), and the like. The halogen-containing gas can be nitrogen trifluoride ($NF_3$), boron trifluoride ($BF_3$), sulfur hexafluoride ($SF_6$), chlorine gas ($Cl_2$), bromine gas ($Br_2$), hydrogen chloride (HCl), tetrafluoromethane ($CF_4$), or the like.

After transferring the defined pattern to the material layer, the Mo-containing layer can be optionally stripped. Methods of stripping the Mo-containing layer can include any etchant chemistry described herein. Stripping chemistry can include use of hydrogen peroxide, sulfuric acid, as well as combinations of oxygen-containing and halogen-containing gases.

In any of the processes herein, a purge operation may be employed between deposition, pattern formation, and pattern transfer processes. The purge operation can include use of a purge gas (e.g., any inert gas herein) to remove gas or byproducts from the processing chamber. Each purge may be performed for a duration between about 0.25-30 seconds.

Molybdenum-Containing Precursors

Use of dopants can, in some instances, improve etch resistance. Thus, the processes, layer, and films herein can include the use of a Mo-containing precursor to provide a Mo-containing layer. Any of the process regimes herein can be modified to incorporate Mo into the Mo-containing layer. For instance, deposition can include use of a Mo-containing precursor alone or with another deposition precursor (e.g., a C-containing, Si-containing, or B-containing precursor) within the process regimes described herein (e.g., any flow rate, pressure, temperature, plasma power, bias power, pulse frequency, duty cycle, TCCT, etc., described herein).

Non-limiting Mo-containing precursors can include an organomolybdenum compound (e.g., having one or more organic ligands), a molybdenum halide compound (e.g., having one or more halo), a molybdenum oxyhalide compound (e.g., having oxide and halo), an inorganic molybdenum compound, and the like.

In one embodiment, the Mo-containing precursor includes a structure having formula (I):

$$MoL_n \quad (I),$$

wherein each L is, independently, selected from the group of hydrogen (H), halo, oxide (=O), imido (=$NR^1$), carbonyl (CO), amine ($NR^1R^2$), an organic ligand, a monodentate ligand, or a bidentate ligand; and n is selected from 2-6. Each of $R^1$ and $R^2$ can be any functional group described herein, such as aliphatic, haloaliphatic, haloheteroaliphatic, heteroaliphatic, aromatic, aliphatic-aromatic, heteroaliphatic-aromatic, as defined herein, or any combination thereof. Each L can be any ligand described herein.

In some embodiments, one or more L can be aliphatic, haloaliphatic, haloheteroaliphatic, heteroaliphatic, aromatic, aliphatic-aromatic, heteroaliphatic-aromatic, as defined herein, or any combination thereof. In other embodiments, one or more L can be alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heteroaryl, alkyl-aryl, alkenyl-aryl, alkynyl-aryl, alkyl-heteroaryl, alkenyl-heteroaryl, alkynyl-heteroaryl, heteroalkyl-aryl, heteroalkenyl-aryl, heteroalkynyl-aryl, heteroalkyl-heteroaryl, heteroalkenyl-heteroaryl, heteroalkynyl-heteroaryl, or any combinations thereof. In particular disclosed embodiments, L may further be substituted with one or more substituents, such as alkoxy, amide, amine, thioether, hydroxyl, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl, wherein the nitrogen atom is functionalized with an aliphatic or aryl group), alkyl halide, or any combinations thereof.

In another embodiment, the Mo-containing precursor includes a structure having formula (II):

$$Mo(X)_m(L)_n \quad (II),$$

wherein each X is, independently, a halo (e.g., F, Cl, Br, and I), oxide (=O), imido (=$NR^1$), or carbonyl (CO); each L is an organic ligand (e.g., any described herein); m is selected from 0-6; and n is selected from 0-6, in which at least one of m and n is not zero. In particular embodiments, L further includes an element selected from the group consisting of N, O, and S.

In some embodiments, the organic ligand(s) are independently selected from aliphatics, haloaliphatics, haloheteroaliphatics, heteroaliphatics, aromatics, aliphatic-aromatics, heteroaliphatic-aromatics, esters, amines, amidinates, amidates, iminopyrrolidinates, diazabutadienes, β-imino amides, α-imino alkoxides, β-diketiminates, β-ketoiminates, β-diketonates, pyrazolates, β-amino alkoxides, guanidinates, amides, imides, thioethers, thiolates, dithiolenes, α-iminothiolenes, α-dithiolates, and β-dithiolates, where each may be substituted or unsubstituted.

In another embodiment, the Mo-containing precursor includes a structure having formula (III):

$$Mo_2L_n \quad (III),$$

wherein each L is a bidentate ligand; and n is selected from 2-5. In particular embodiments, the Mo-containing precursor includes a multiple Mo—Mo bond. The bidentate ligand can be any described herein, e.g., an amidinate, an amidate, or a guanidinate ligand.

In yet another embodiment, the Mo-containing precursor includes a structure having formula (IV):

$$Mo(L1)_m(L2)_n(X)_p \quad (IV),$$

wherein each L1 is, independently, a bidentate ligand; each L2 is, independently, a neutral ligand; each X is, independently, an anionic ligand; m is selected from 1-3; n is selected from 0-4; and p is selected from 0-4. In some embodiments, n and p are not simultaneously zero. Examples of bidentate ligands, neutral ligands, and anionic ligands are described herein.

Non-limiting bidentate ligands include an amidinate, an amidate, an iminopyrrolidinate, a diazobutadiene, a β-imino amide, an α-imino alkoxide, a β-diketiminate, a β-ketoiminate, a β-diketonate, a pyrazolate, a β-amino alkoxide, a guanidinate, a dithiolene, an α-iminothiolene, an α-dithiolate, and a β-dithiolate. The bidentate ligand can be neutral or anionic. Yet other bidentate ligands can include $NR^1$-Ak-$NR^2$, $NR^1$-Ak-O, $NR^1$-Ak-S, S-Ak-O, O-Ak-O, and S-Ak-S, in which Ak is an optionally substituted alkylene or an optionally substituted heteroalkylene. The Ak group can be unsubstituted or substituted, such as with alkyl, amine, hydroxyl, halo, aminoalkyl, hydroxyalkyl, haloalkyl, or other substitutions described herein for alkyl. The Ak group can be saturated or unsaturated (e.g., having one or more double or triple bonds).

Ligands can be neutral or anionic (e.g., monoanionic or dianionic), and molybdenum can be in a variety of oxidation states, such as +1, +2, +3, +4, +5, and +6. In some embodiments, the ligand can be a neutral ligand. Non-limiting neutral ligands can include CO, an amine, a phosphine, a nitrile, an isonitrile, and a thioether. In other embodiments, the ligand can be an anionic ligand. Non-limiting anionic ligands include a halide, an alkyl, an allyl, a cyclopentadienyl, an alkoxide, an amide, and an imide.

Further examples include heteroleptic molybdenum halide compounds (i.e., compounds having different types of ligands). Particular examples of such precursors are compounds that include molybdenum, at least one halide forming a bond with molybdenum, and at least one organic ligand (e.g., in which the organic ligand has any of the N, O, and S elements, where an atom of any of these elements forms a bond with molybdenum). In one embodiment, the Mo-containing precursor includes a structure having formula (V):

$$Mo(X)_m(L)_n \quad (V),$$

wherein each X is, independently, a halo; each L is an organic ligand; m is selected from 1-6; and n is selected from 1-4. In particular embodiments, L includes an element selected from the group consisting of N, O, and S.

In any embodiment herein, the ligand is an organic ligand having any of the N, O, and S elements, where an atom of any of these elements forms a bond with molybdenum. In any embodiment herein, the ligand can be amines, amidinates, amidates, iminopyrrolidinates, diazabutadienes, β-imino amides, α-imino alkoxides, β-diketiminates, β-ketoiminates, β-diketonates, pyrazolates, β-amino alkoxides, guanidinates, amides, and imides. Non-limiting N- and O-containing ligands include those in Scheme I.

Scheme I amine (i):

$NR^1R^2R^3$

-continued amidinate (ii):

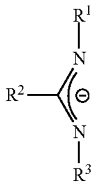

amidate (iii):

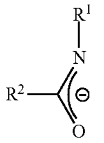

iminopyrrolidinate (iv):

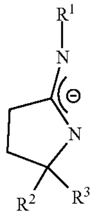

diazabutadiene:

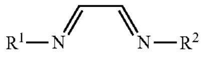

(v)

(vi)

(vii)

β-imino amide (viii):

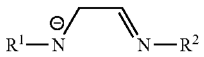

α-imino alkoxide (ix):

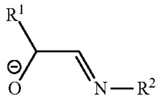

β-diketiminate (x):

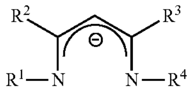

β-ketoiminate (xi):

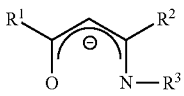

β-diketonate (xii):

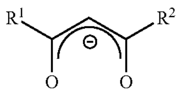

pyrazolate (xiii):

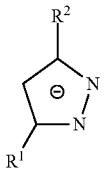

-continued

β-amino alkoxide (xiv):

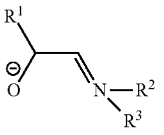

guanidinate (xv):

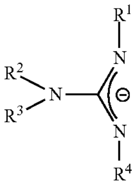

amide (xvi):

$\ominus$
$NR^1R^2$ imide (xvii):

$NR^{1\ 2-}$

In some embodiments, the ligand can be thioethers, thiolates, dithiolenes, α-iminothiolenes, α-dithiolates, and β-thiolates. A thioether can include both unidentate and multidentate (e.g., bidentate or tridentate) thioethers, as well as ligands that contain both thioether and thiolate (or other) moieties. An example of a unidentate thioether is dialkylsulfide $SR^1R^2$, where each of $R^1$ and $R^2$ is, independently, an alkyl, such as in dimethylsulfide, diethylsulfide, diisobutyl sulfide, and the like. An example of a multidentate thioether ligand that also includes thiolate moieties is $(SCH_2CH_2SCH_2CH_2S)^{2-}$. Further non-limiting S-containing ligands include those in Scheme II.

Scheme II thioether (xviii):

$SR^1R^2$ thiolate (xix):

$\ominus$
$SR^1$ dithiolene:

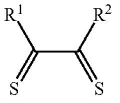

(xx)

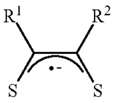

(xxi)

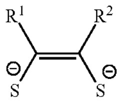

(xxii)

α-iminothiolene (xxiii):

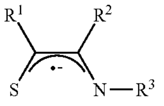

α-dithiolate (xxiv):

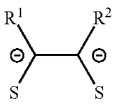

β-dithiolate (xxv):

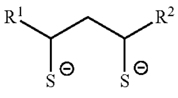

-continued thiocarbamate (xxvi):

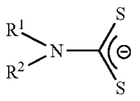

In Scheme I and Scheme II, each of $R^1$, $R^2$, and $R^3$ is, independently, hydrogen (H), aliphatic, haloaliphatic, haloheteroaliphatic, heteroaliphatic, aromatic, aliphatic-aromatic, heteroaliphatic-aromatic, or any combinations thereof. In other embodiments, each of $R^1$, $R^2$ and $R^3$ is, independently, alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heteroaryl, alkyl-aryl, alkenyl-aryl, alkynyl-aryl, alkyl-heteroaryl, alkenyl-heteroaryl, alkynyl-heteroaryl, heteroalkyl-aryl, heteroalkenyl-aryl, heteroalkynyl-aryl, heteroalkyl-heteroaryl, heteroalkenyl-heteroaryl, heteroalkynyl-heteroaryl, or any combinations thereof. In particular disclosed embodiments, each of $R^1$, $R^2$, and $R^3$ may further be substituted with one or more substituents such as, alkoxy, amide, amine, thioether, hydroxyl, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl, wherein the nitrogen atom is functionalized with an aliphatic or aryl group), alkyl halide, or any combinations thereof.

In yet other embodiments of ligands in Scheme I or Scheme II, each of $R^1$, $R^2$, and $R^3$ is, independently, H, alkyl, amine, haloalkyl, alkylsilyl, alkylamino, and alkoxy. In some embodiments, each of $R^1$, $R^2$, and $R^3$ is, independently, H, methyl, ethyl, n-propyl, isopropyl, isobutyl, n-butyl, sec-butyl, t-butyl, pentyl, hexyl, cyclopropyl, cyclobutyl, cyclopentyl, cyclohexyl, cyclopropylmethyl, cyclopropylethyl, cyclopropylpropyl, cyclobutylmethyl, and cyclobutylethyl. In other embodiments, each of $R^1$, $R^2$, and $R^3$ is, independently, an optionally substituted alkyl. In yet other embodiments, ligands with branched alkyl substituents (e.g., $C_{3-6}$ branched alkyl, such as isopropyl and isobutyl) are employed because such ligands could provide more volatile molybdenum precursors.

Any of the ligands herein may be substituted or unsubstituted. In some embodiments, these ligands include one or more substituents independently selected from the group consisting of H, alkyl, halo, hydroxyl, amine, haloalkyl, alkylsilyl, alkylamino, and alkoxy substituents.

In particular embodiments, the organomolybdenum compound can include molybdenum carbonyl ($Mo[CO]_6$), molybdenum acetate ($Mo_2[O_2CCH_3]_4$), pentamethylmolybdenum ($MoMe_5$), molybdocene dihydride ($MoCp_2H_2$, in which Cp is cyclopentadienyl), bis(cyclopentadienyl)molybdenum(IV) dichloride ($MoCp_2Cl_2$ or $C_{10}H_{10}Cl_2Mo$), cyclopentadienylmolybdenum(II) tricarbonyl dimer ($Cp_2Mo_2[CO]_6$ or $C_{16}H_{10}Mo_2O_6$), bis(ethylbenzene)molybdenum ($[(Et_xC_6H_{6-x}]_2Mo$, in which x is 0, 1, 2, 3, or 4), cycloheptatriene molybdenum tricarbonyl ($C_7H_8Mo[CO]_3$), molybdenum bis(2,2,6,6-tetramethyl-3,5-heptanedionate) ($Mo[thd]_3$, in which thd is 2,2,6,6-tetramethylheptane-3,5-dionato), molybdenum(VI) dioxide bis(2,2,6,6-tetramethyl-3,5-heptanedionate) ($MoO_2[thd]_2$), molybdenum(VI) dioxide bis(acetylacetonate) ($MoO_2[acac]_2$, in which acac is acetylacetonate), (bicyclo[2.2.1]hepta-2,5-diene)tetracarbonylmolybdenum ($[nbd]Mo[CO]_4$), (mesitylene)molybdenum tricarbonyl ($[Me_3C_6H_3]Mo[CO]_3$), (trimethylsilylcyclopentadienyl) molybdenum dicarbonyl 2-methylallyl ($[CpSiMe_3]Mo[CO]_2[\eta^3$-2-methylallyl]), and the like.

The organomolybdenum compound can include an amine group. Such compounds can include bis(t-butylimido)bis(dimethylamino)molvbdenum (VI) ($[tBuN]_2Mo[NMe_2]_2$), bis(t-butylimido)bis(N,N-di(i-propyl)acetamidinato)molybdenum (VI) ($[tBuN]_2Mo[iPr_2AMD]_2$, in which AMD is acetamido), bis(N,N-di(cyclohexyl)acetamidinato)dioxide molybdenum ($MoO_2[(CyN)_2CMe]_2$, in which $C_y$ is cyclohexyl), bis(N,N-di(i-propyl)acetamidinato)dioxide molybdenum ($MoO_2[iPr_2AMD]_2$ or $MoO_2[(iPrN)_2CMe]_2$), bis(N,N-di(t-butyl)acetamidinato)dioxide molybdenum ($MoO_2[tBu_2AMD]_2$ or $MoO_2[(tBuN)_2CMe]_2$), and the like.

The molybdenum halide compound can be molybdenum fluoride (e.g., $MoF_6$ or $MoF_5$ or $MoF_4$), molybdenum chloride (e.g., $[MoCl_5]_2$ or $MoCl_5$ or $MoCl_4$ or $MoCl_3$ or $MoCl_2$), molybdenum bromide (e.g., $MoBr_4$ or $MoBr_3$ or $MoBr_2$), or molybdenum iodide (e.g., $MoI_3$).

In some embodiments, the molybdenum halide is a molybdenum oxyhalide compound, such as molybdenum dichloride dioxide (e.g., $MoO_2Cl_2$), molybdenum dibromide dioxide (e.g., $MoO_2Br_2$), molybdenum diiodide dioxide (e.g., $MoO_2I_2$), molybdenum oxytetrachloride ($MoOCl_4$), molybdenum oxytetrafluoride ($MoOF_4$), molybdenum oxyiodide (e.g., $Mo_4O_{11}I$), and the like.

Yet other Mo-containing precursors can include molybdic oxide ($MoO_3$), ammonium molybdate ($MoO_4[NH_4]_2$), and the like. In some embodiments, the Mo-containing precursors provided herein have a vaporization temperature of 200° C. or less.

Carbon-Containing Precursors

In combination with a Mo-containing precursor, one or more C-containing precursors can be used to provide a molybdenum carbide-containing material. Such a material may include ternary or quaternary materials, such as molybdenum silicide carbide, molybdenum boride carbide, and others. Non-limiting C-containing precursors can include a hydrocarbon compound, a halocarbon compound, and the like. In some instance, the C-containing precursor is employed with a reducing agent (e.g., $H_2$), an inert gas, or a combination thereof.

Hydrocarbon precursors generally include carbon-containing precursors. In some instances, the hydrocarbon precursor includes only C and H atoms. The hydrocarbon compound can be $C_xH_y$, wherein x is an integer from 1 to 10 and wherein y is an integer from 2 to 24. Yet other non-limiting hydrocarbons can include methane ($CH_4$), acetylene ($C_2H_2$), ethylene ($C_2H_4$), propylene ($C_3H_6$), propyne ($C_3H_4$), allene ($C_3H_4$), cyclopropene ($C_3H_4$), butane ($C_4H_{10}$), cyclohexane ($C_6H_{12}$), benzene ($C_6H_6$), toluene ($C_7H_8$), and the like. Yet other hydrocarbon compounds include alkenes, alkynes, aromatics, and cyclic hydrocarbons.

The hydrocarbon precursor can be an aliphatic compound (e.g., a $C_{1-10}$ alkane, $C_{2-10}$ alkene, $C_{2-10}$ alkyne, including linear or cyclic forms thereof), a cycloaliphatic compound (e.g., a $C_{3-12}$ cycloalkane, $C_{3-12}$ cycloalkene, or $C_{3-12}$ cycloalkyne) or an aromatic compound (e.g., benzene, toluene, naphthalene, phenanthrene, as well as other polycyclic forms thereof). The hydrocarbon precursor can include saturated bonds (single bonds, e.g., C—C bonds or C—H bonds), unsaturated bonds (double or triple bonds, e.g., C═C, C≡C, or C≡N bonds), or combinations thereof. The aliphatic compound, cyclic compound, or aromatic compound can be substituted with one or more functional groups, such as halo, alkyl, alkenyl, alkynyl, alkoxy, cyano, hydroxyl, and others.

Of the hydrocarbon precursors, various compounds can be employed. For instance, the hydrocarbon precursor can include aliphatic and aromatic compounds (e.g., alkanes, alkenes, alkynes, benzene, etc.), including substituted forms thereof. By using different hydrocarbon precursors, the type and amount of certain chemical bonds within the Mo-containing layer can be modified. For instance, using unsaturated hydrocarbon precursors can provide a layer having increased unsaturated bond content (e.g., increased C═C or C≡C bond content), increased $sp^2$ carbon content, increased sp carbon content, decreased saturated bond content (e.g., decreased C—C bond content), decreased $sp^3$ carbon content, or decreased C—H bond content (e.g., as compared to a film formed with an increased amount saturated hydrocarbon precursors or a decreased amount of unsaturated hydrocarbon precursors).

The selection of the hydrocarbon precursor can depend on various factors. In one non-limiting instance, a hydrocarbon precursor includes a saturated precursor (e.g., having increased C—H bond content, as compared to C—C, C═C, or C≡C content), which can provide sufficient H atoms. Yet, in other non-limiting instances, a hydrocarbon precursor includes an unsaturated precursor (e.g., having increased C—C, C═C, or C≡C content, as compared to C—H bond content). Without wishing to be limited by mechanism, selection of such a precursor can provide enhanced etch resistance.

Non-limiting halocarbon compounds can include a haloalkane, a haloalkene, or a haloaromatic. In yet other embodiments, the halocarbon compound is carbon tetrabromide ($CBr_4$) or carbon tetrachloride ($CCl_4$).

In some embodiments, the hydrocarbon compound may fluorine-containing, halogen-containing, oxygen-containing, silicon-containing, hydroxyl group-containing, and boron-containing derivatives of hydrocarbon compounds.

In another embodiment, the hydrocarbon compound can be cyclic hydrocarbons (e.g., methylcyclohexane); substituted aromatic hydrocarbons (e.g., halo-substituted benzene, amine-substituted benzene, $C_{2-8}$ alkyl-substituted benzene, or halo- and alkyl-substituted benzene, such as cumene, aniline, N,N-dimethylaniline, etc.); and halocarbons (e.g., a $C_{2-12}$ alkyl having one or more halos). In some instances, the hydrocarbon is an unsubstituted benzene or a $C_1$ alkyl-substituted benzene (e.g., toluene, o-xylene, m-xylene, p-xylene). In other instances, the hydrocarbon is a halo-substituted $C_1$ hydrocarbon (e.g., chloroform, methylene chloride). In yet other instances, the hydrocarbon is acetonitrile.

In some embodiments, the hydrocarbon is an unsaturated hydrocarbon having one or more double bonds or triple bonds. In other embodiments, the hydrocarbon is an unsaturated, cyclic hydrocarbon (e.g., cyclopentene, cyclohexene, cycloheptene, fluorene, etc.). In particular embodiments, the hydrocarbon is an alkene having one or more double bonds or an alkyne having one or more triple bonds, in which the alkene or the alkyne can be linear or cyclic. Exemplary alkenes include ethene, propene, 1-butene, 1-pentene, 1-hexene, 1-heptene, 1-octene, and 1-nonene, as well as dienes of any of these and positional isomers if available, in which the location of the double bond is changed (e.g., a positional isomer of 1-butene could be 2-butene, etc.). Exemplary alkynes include ethyne, propyne, 1-butyne, 1-pentyne, 1-hexyne, 1-heptyne, 1-octyne, and 1-nonyne, as well as positional isomers if available, in which the location of the triple bond is changed (e.g., a positional isomer of 1-butyne could be 2-butyne, etc.).

Silicon-Containing Precursors

In addition, one or more Si-containing precursors can be used to provide a molybdenum silicide-containing material. Such a material may include ternary or quaternary materials, such as molybdenum silicide carbide, molybdenum boride silicide, and others. Non-limiting Si-containing precursors can include a silane compound, an organosilane compound, an alkyl silane compound, an alkoxy silane compound, a silanol compound, a siloxane compound, an aminosilane compound, a cyclic azasilane compound, a halosilane compound, an inorganic silane compound, and the like. In particular embodiments, the Si-containing precursor can be employed as a reducing agent. In some instances, the Si-containing precursor is employed with a reducing agent, an inert gas, or a combination thereof.

A general Si-containing precursor can have a formula of $SiR^1R^2R^3R^4$, wherein each of $R^1$, $R^2$, $R^3$, and $R^4$ is, independently, hydrogen (H), hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof.

In certain embodiments, each of $R^1$, $R^2$, $R^3$, and $R^4$ is, independently, alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heteroaryl, alkyl-aryl, alkenyl-aryl, alkynyl-aryl, alkyl-heteroaryl, alkenyl-heteroaryl, alkynyl-heteroaryl, heteroalkyl-aryl, heteroalkenyl-aryl, heteroalkynyl-aryl, heteroalkyl-heteroaryl, heteroalkenyl-heteroaryl, heteroalkynyl-heteroaryl, or any combinations thereof. In particular disclosed embodiments, each of $R^1$, $R^2$, $R^3$, and $R^4$ may further be substituted with one or more substituents such as, alkoxy, amide, amine, thioether, hydroxyl, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl, wherein the nitrogen atom is functionalized with an aliphatic or aryl group), alkyl halide, or any combinations thereof.

In one instance, non-limiting Si-containing precursors include polysilanes ($H_3Si—(SiH_2)_n—SiH_3$), where $n \geq 0$. Examples of silanes are silane ($SiH_4$), disilane ($Si_2H_6$), trisilane ($Si_3H_8$), tetrasilane ($Si_4H_{10}$).

An organosilane can have a formula of $SiR^1R^2R^3R^4$, wherein each of $R^1$, $R^2$, $R^3$, and $R^4$ is, independently, hydrogen (H), hydroxyl, halo, amine, aminoalkyl, alkoxy, ester, aliphatic, haloaliphatic, haloheteroaliphatic, heteroaliphatic, aromatic, heteroaromatic, aliphatic-aromatic, heteroaliphatic-aromatic, or any combinations thereof; and at least one of $R^1$, $R^2$, $R^3$, and $R^4$ is an organic ligand. Non-limiting organic ligands can include aliphatic, haloaliphatic, haloheteroaliphatic, heteroaliphatic, aromatic, heteroaromatic, aliphatic-aromatic, heteroaliphatic-aromatic, or any combinations thereof. In other embodiments, the organic ligand includes alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heteroaryl, alkyl-aryl, alkenyl-aryl, alkynyl-aryl, alkyl-heteroaryl, alkenyl-heteroaryl, alkynyl-heteroaryl, heteroalkyl-aryl, heteroalkenyl-aryl, heteroalkynyl-aryl, heteroalkyl-heteroaryl, heteroalkenyl-heteroaryl, or heteroalkynyl-heteroaryl.

Non-limiting organosilanes include methylsilane, ethylsilane, isopropylsilane, t-butylsilane, dimethylsilane ($SiMe_2H_2$), trimethylsilane ($SiMe_3H$), tetramethylsilane ($SiMe_4$), diethylsilane ($SiEt_2H_2$), triethylsilane ($SiEt_3H$), tetraethylsilane ($SiEt_4$), di-t-butylsilane, tributylsilane ($SiBu_3H$), allylsilane, tetraallyl silane ($Si[CH_2CH=CH_2]_4$), sec-butylsilane, thexylsilane, isoamylsilane, t-butyldisilane, di-t-butyldisilane, cyclopentadienyltrimethylsilane ($SiCpMe_3$), hexamethyldisilane ($Si_2Me_6$), silicon acetate ($Si[OAc]_4$, in which Ac is acetyl), and the like.

An alkoxysilane includes at least one 0 atom bonded to a Si atom, but may also contain H, N, halogen, or C atoms. A non-limiting alkoxysilane can have a formula of $R^1OSiR^2R^3R^4$, in which $R^1$ is an optionally substituted aliphatic or optionally substituted alkyl; and each of $R^2$, $R^3$, and $R^4$ is, independently, hydrogen (H), hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof.

Examples of alkoxysilanes are mono-, di-, tri- and tetra-alkoxysilanes ($H_3Si[OR]$, $H_2Si[OR]_2$, $HSi[OR]_3$ and $Si[OR]_4$, respectively, in which each R can be, independently, optionally substituted alkyl or aryl), as well as substituted mono-, di-, tri- and tetra-alkoxysilanes, for example, trimethoxymethylsilane ($MeSi[OMe]_3$), (3-aminopropyl) trimethoxysilane ($NH_2(CH_2)_3Si[OMe]_3$), (3-aminopropyl)triethoxysilane ($NH_2(CH_2)_3Si[OEt]_3$), triethoxyvinylsilane ($CH_2{=}CHSi[OEt]_3$), triethoxyethylsilane ($EtSi[OEt]_3$), trimethoxyphenylsilane ($PhSi[OMe]_3$), isobutyltriethoxysilane ($i\text{-}BuSi(OCH_2CH_3)_3$), diacetoxydimethylsilane ($Me_2Si(OCOMe)_2$), and the like. Yet other examples include trimethoxysilane ($HSi[OMe]_3$), tetramethoxysilane ($Si[OMe]_4$), triethoxysilane ($HSi[OEt]_3$), tetraethoxysilane (TEOS or $Si[OEt]_4$), and tetrabutoxysilane ($Si[OBu]_4$).

A non-limiting silanol can have a formula of $HOSiR^2R^3R^4$, in which each of $R^2$, $R^3$, and $R^4$ is, independently, hydrogen (H), hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof. Non-limiting silanol compounds includes tri-t-butoxysilanol ($[tBuO]_3SiOH$), tri-t-pentoxysilanol ($[EtMe_2CO]_3SiOH$), and the like.

A non-limiting siloxane can have a formula of $R^1R^2R^3Si{-}O{-}SiR^4R^5R^6$, in which each of $R^1$, $R^2$, $R^3$, $R^4$, $R^5$, and $R^6$ is, independently, hydrogen (H), hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof. Non-limiting siloxane compounds include hexachlorodisiloxane ($Cl_3SiOSiCl_3$), hexamethyldisiloxane ($Me_3SiOSiMe_3$), 1,1,3,3-tetramethyldisiloxane ($HMe_2SiOSiMe_2H$), and the like.

An aminosilane includes at least one N atom bonded to a Si atom, but may also contain H, O, halogen, or C atoms. A non-limiting aminosilane can have a formula of $R^1R^2NSiR^3R^4R^5$, in which each of $R^1$ and $R^2$ is H, optionally substituted aliphatic, optionally substituted alkyl, optionally substituted aromatic, or optionally substituted aryl; and each of $R^3$, $R^4$, and $R^5$ is, independently, H, hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof.

Examples of aminosilanes are mono-, di-, tri- and tetra-aminosilane ($H_3Si[NH_2]$, $H_2Si[NH_2]_2$, $HSi[NH_2]_3$ and $Si[NH_2]_4$, respectively), as well as substituted mono-, di-, tri- and tetra-aminosilanes, for example, t-butylaminosilane, methylaminosilane, di-sec-butylaminosilane (DSBAS or $[(s\text{-}Bu)_2N]SiH_3$), $H_2Si(NRR')_2$ (in which R is tBu or Et and R' is H or Et), bis(t-butylamino)silane ($[H(tBu)N]_2SiH_2$ or BTBAS), bis(diethylamino)silane ($[Et_2N]_2SiH_2$), bis(dimethylamino)dimethylsilane ($[Me_2N]_2SiMe_2$), hexakis(ethylamino)disilane ($[HEtN]_6Si_2$), tris(dimethylamino)silane ($[Me_2N]_3SiH$), tetrakis(ethylmethylamino)silane ($[MeEtN]_4Si$), 2,2,4,4,6,6-hexamethylcyclotrisilazane ($Me_6H_3N_3Si_3$), t-butyl silylcarbamate, $SiHMe\text{-}(NMe_2)_2$, $SiHCl{-}(NMe_2)_2$, $(SiMe_2NH)_3$, and the like. A further example of an aminosilane is trisilylamine ($N[SiH_3]$).

A halosilane includes at least one halogen group and may or may not include H or C atoms. A non-limiting halosilane can have a formula of $XSiR^1R^2R^3$, in which X is halo; and each of $R^1$, $R^2$, and $R^3$ is, independently, H, hydroxyl, halo, amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof.

Examples of halosilanes are iodosilanes, bromosilanes, chlorosilanes, and fluorosilanes. Specific chlorosilanes are tetrachlorosilane ($SiCl_4$), trichlorosilane ($SiHCl_3$), dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, hexyldimethylchlorosilane, hexachlorosilane ($Si_2Cl_6$), benzyl trichlorosilane ($SiBzCl_3$), and the like. Specific bromosilanes include tetrabromosilane ($SiBr_4$) and the like. Specific iodosilanes are tetraiodosilane, triiodosilane, diiodosilane, monoiodosilane, trimethylsilyl iodide, and the like.

Boron-Containing Precursors

One or more B-containing precursors can be used to provide a molybdenum boride-containing material. Such a material may include ternary or quaternary materials, such as molybdenum boride carbide, molybdenum boride silicide, and others. Non-limiting B-containing precursors can include an organoborane compound, a boron halide compound, a borate compound, an inorganic boron compound, and the like. In particular embodiments, the B-containing precursor can be employed as a reducing agent.

A non-limiting organoborane can have a formula of $BR^1R^2R^3$, in which each of $R^1$, $R^2$, and $R^3$ is, independently, H, hydroxyl, halo, amine, aminoalkyl, alkylamino, alkoxy, ester, amino, aliphatic, haloaliphatic, haloheteroaliphatic, heteroaliphatic, aromatic, heteroaromatic, aliphatic-aromatic, heteroaliphatic-aromatic, or any combinations thereof; and at least one of $R^1$, $R^2$, and $R^3$ is an organic ligand (e.g., any described herein). In particular embodiments, the organic ligand is an optionally substituted alkyl, optionally substituted aliphatic, optionally substituted aryl, or optionally substituted aromatic.

The organoborane compound can be trimethylborane ($BMe_3$), 1,2-dimethyldiborane ($(BH_2Me)_2$), triethylborane ($BEt_3$), triphenylborane ($BPh_3$, in which Ph is phenyl), tris(pentafluorophenyl)borane, tetrakis(dimethylamino)diboron ($B_2[NMe_2]_4$), and the like.

A non-limiting boron halide compound can have a formula of $XBR^1R^2$, in which X is halo; and each of $R^1$ and $R^2$ is, independently, H, hydroxyl, halo, oxide (=O), amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof. The boron halide compound can be boron bromide (e.g., $BBr_3$), boron chloride (e.g., $BCl_3$ or $B_2Cl_4$), boron fluoride (e.g., BF or $BF_3$ or $B_2F_4$), boron iodide (e.g., $BI_3$), boron monofluoride monoxide (BFO), and the like.

A non-limiting borate compound can have a formula of $R^1OBR^2R^3$, in which $R^1$ is H, optionally substituted aliphatic, or optionally substituted aromatic; and each of $R^2$ and $R^3$ is, independently, H, hydroxyl, halo, oxide (=O), amine, aminoalkyl, alkoxy, aliphatic, haloaliphatic, haloheteroaliphatic, heteroaliphatic, aromatic, heteroaromatic, aliphatic-aromatic, heteroaliphatic-aromatic, or any combinations thereof. The borate compound can be trimethylborate ($B[OMe]_3$), triethylborate ($B[OEt]_3$), triisopropyl borate ($B[OiPr]_3$), and the like.

A non-limiting inorganic boron compound can have a formula of $BR^1R^2R^3$, in each of $R^1$, $R^2$, and $R^3$ is, independently, H, hydroxyl, halo, oxide (=O), $NH_2$, NH, and the like. The inorganic boron compound can be borane ($BH_3$), diborane (e.g., $B_2H_6$ or $B_2H_4$), borazine ($H_3NBH_3$), and others.

Molybdenum-Containing Layers

The Mo-containing layer can include one or more other heteroatoms (e.g., carbon, nitrogen, silicon, boron, oxygen, and others). In particular embodiments, the layer is a Mo-containing carbon layer, a Mo-containing silicon layer, a Mo-containing boron layer, a Mo-containing carbon and silicon layer, a Mo-containing carbon and boron layer, or a Mo-containing silicon and boron layer, as well as doped forms of any of these. Such Mo-containing layers can include alloys or hybrid forms thereof. Furthermore, the Mo-containing layers can include binary materials (e.g., including Mo and one of C, Si, or B) or ternary materials (e.g., including Mo and two of C, Si, or B). In some embodiments, the Mo-containing layer is amorphous. In other embodiments, the Mo-containing layer is crystalline with a grain size between about 1-3 nm.

Yet other Mo-containing layers can include molybdenum carbide (e.g., $MoC_y$, $Mo_2C$, MoC, or $Mo_xC_y$), molybdenum silicide (e.g., $MoSi_y$, $MoSi_2$, $Mo_5Si_3$, $Mo_3Si$, or $Mo_xSi_y$), molybdenum boride (e.g., $MoB_y$, $MoB_2$, $Mo_2B_4$, or $Mo_xB_y$), molybdenum oxycarbide (e.g., $Mo_2C_yO_z$ or $Mo_xC_yO_z$), molybdenum boride silicide (e.g., $Mo_5SiB_2$, $MOSi_2B$, or $Mo_xSi_yB_z$), molybdenum carbonitride (e.g., $MoC_yN_z$ or $Mo_xC_yN_z$), molybdenum silicide carbide (e.g., $MoSi_yC_z$ or $Mo_xSi_yC_z$), molybdenum boride carbide (e.g., $MoB_yC_z$ or $Mo_xB_yC_z$), molybdenum nitride ($MoN_y$ or $Mo_xN_y$), molybdenum oxynitride (e.g., $Mo_xO_yN_z$), and the like, where x, y, and z indicate that the stoichiometry of these compounds may vary. In some embodiments, each of x, y, and z can be from 0.1 to 10, including integers and decimals therebetween.

The Mo-containing layer can employed as a hardmask, an etch stop layer, a conformal layer, or a step coverage layer. The hardmask can include use in various applications, such as deep oxide contact etches, DRAM capacitor mold etches, and line or space etches, including etches to form shallow trench isolation structures, gates, and bit-lines.

In particular embodiments, the Mo-containing layer provides a hardmask film, in which increased doping with Mo atoms provides increased cross-linking. The cross-linked film, in turn, can provide a harder or denser film that provides enhanced etch selectivity, while remaining removable for semiconductor hardmask applications.

In other embodiments, the Mo-containing layer provide a conformal film. The extent of conformality of films may be measured by the step coverage. In one embodiments, step coverage is calculated by dividing the average thickness of the deposited film on a sidewall by the average thickness of the deposited film at the top of the feature and multiplying it by 100 to obtain a percentage.

The Mo-containing layer can also possess other useful characteristics. For instance, the Mo-containing layer can be characterized as having a low fluorine content (e.g., about 0-2 at. %).

In another instance, the Mo-containing layer can be characterized as having a Mo content of about 5-60 at. %. In yet another instance, the Mo-containing layer can be characterized as having a low hydrogen content (e.g., about 5-12 at. %).

The Mo-containing layer can has a reduced compressive film stress. In one instance, the stress can be about 10-20 MPa. In particular embodiments, the overall tensile stress of a Mo-containing layer may be less than about 1 GPa.

The Mo-containing layer can have any useful thickness, such as about 10 Å to 10 μm. In other embodiments, the thickness is about 10-30 Å. In other embodiments, the thickness is about 200 Å to 10 μm. In yet other embodiments, the thickness is about 100 Å to 2 μm. In various embodiments, the Mo-containing layer is between about 150-300 Å thick.

The Mo-containing layer can be characterized by a high etch selectivity. For instance, high etch selectivity can allow for thinner masks with improved etch margins.

Interfacial Layers

The interfacial layer can include any useful material. Non-limiting materials include pure boron (B), pure carbon (C), titanium (Ti), titanium nitride (TiN), titanium aluminide (TiAl), titanium silicide (TiSi), titanium carbide (TiC), tungsten (W), tungsten nitride (WN), tungsten carbonitride (WCN), tantalum nitride (TaN), nickel (Ni), nickel silicide (NiSi), nickel nitride (NiN), molybdenum carbide (MoC), molybdenum nitride ($MoN_x$), molybdenum oxynitride layer ($MoO_xN_y$), and the like, as well as combinations thereof. Yet other materials can include dielectric layers and conducting layers, e.g., silicon oxides, silicon nitrides, silicon carbides, metal oxides, metal nitrides, metal carbides, and metal layers.

The interfacial layer can include any useful thickness, such as about 10 Å to 100 nm. In use, the interfacial layer can be employed as a diffusion barrier, an adhesion layer, a barrier layer, a nucleation layer, or combinations thereof.

Methods of providing an interfacial layer include gas-phase deposition of precursors to provide the interfacial layer. The interfacial layer can be deposited on a surface portion of a substrate or on a pretreated surface. In one instance, the interfacial layer includes a metal nitride, in which deposition includes use of an appropriate metal (M)-containing precursor with an appropriate nitrogen (N)-containing precursor. For other compositions within the interfacial layer, other precursors can be employed, such as: a C-containing precursor with an M-containing precursor for a metal carbide, an O-containing precursor with an M-containing precursor for a metal oxide, an O-containing precursor and an N-containing precursor with an M-containing precursor for a metal oxynitride, an O-containing precursor with an Si-containing precursor for a silicon oxide, etc. In other embodiments, the pure boron layer includes deposition of any B-containing precursor described herein; and the pure carbon layer includes deposition of any C-containing precursor described herein.

Non-limiting M-containing precursors include a metal halide, such as $MX_n$, in which M is a metal; each X is, independently, halo; and n is selected from 2-6. Yet other non-limiting metal-containing precursors include an organometal precursor, such as $ML_n$, in which M is a metal; each L is, independently, hydrogen (H), halo, oxide (=O), imido (=$NR^1$), carbonyl (CO), amine ($NR^1R^2$), an organic ligand, a monodentate ligand, or a bidentate ligand (e.g., any described herein); and n is selected from 2-6. M can be any metal atom within the interfacial layer, such as titanium (Ti), tungsten (W), tantalum (Ta), nickel (Ni), and molybdenum (Mo).

Non-limiting Si-containing precursors include any described herein, such as tetraethoxysilane ($Si(OEt)_4$ or TEOS). Non-limiting C-containing precursors include any described herein, including acetylene ($C_2H_2$).

Non-limiting N-containing precursors include any described herein, including ammonia ($NH_3$), nitrogen ($N_2$), hydrazine ($N_2H_4$), amines, and aminosilanes. Non-limiting amines include methylamine, dimethylamine, ethylmethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Yet other N-containing precursors can include nitrile (e.g., acetonitrile), amides, N-containing heterocyclic compound, or amino alcohols (e.g., ethanolamine). Amines may be primary, secondary, tertiary, or quaternary (for example, tetraalkylammonium compounds). An N-containing precursor can contain heteroatoms other than N, for example, hydroxylamine, t-butyloxycarbonyl amine, and N-t-butyl hydroxylamine are N-containing precursors.

Non-limiting O-containing precursors include any described herein, including oxygen ($O_2$), ozone ($O_3$), carbon monoxide (CO), carbon dioxide ($CO_2$), water ($H_2O$), hydrogen peroxide ($H_2O_2$), alcohol (e.g., t-amyl alcohol, ethanol, propanol, etc.), polyol (e.g., a diol, such as ethylene glycol), ketone, aldehyde, ether, ester, carboxylic acid, alkoxysilane, oxolane, or furan.

Material Layer and Substrates, Including Stacks Thereof

The material layer can include any useful material. Such materials can include oxide materials, nitride materials, dielectric materials, metal layers, semiconductor materials, and combinations thereof that can be used in forming semiconductor devices (e.g., metal contacts, trench isolations, gates, bit-lines, or any other interconnect features).

Non-limiting materials may include a dielectric material, such as silicon oxide (e.g., $SiO_2$), silicon nitride (e.g., $Si_3N_4$), silicon oxynitride, silicon carbide, silicon oxycarbide, titanium nitride, hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), platinum zirconium titanium (PZT), as well as composites thereof, alloys thereof, or doped forms thereof. In other embodiments, the material is a high-k material, e.g., having a dielectric constant greater than 4.

Yet other non-limiting materials include a conductive material, such as a material including silicon (e.g., polysilicon, doped silicon, such as n-type or p-type doped silicon, tungsten silicide (WSi), tungsten polysilicon (W/poly), and the like). Other materials include those having titanium (Ti), hafnium (Hf), vanadium (V), tantalum (Ta), chromium (Cr), molybdenum (Mo), tungsten (W), manganese (Mn), iron (Fe), ruthenium (Ru), cobalt (Co), nickel (Ni), palladium (Pd), platinum (Pt), copper (Cu), gold (Ag), silver (Au), aluminum (Al), alloys thereof, nitride compounds thereof, combinations thereof, and others.

The methods and layers herein can be employed for any useful stack. In one embodiment, the stack includes stair-like structures within three dimensional (3D) stacks. In another embodiment, the stack include one or more high aspect ratio (HAR) features, e.g., greater than 20:1, disposed on a substrate. Other features may be present within the stack, such as trenches, vias, and the like. In some instances, the features are formed by use of the Mo-containing layer described herein.

The Mo-containing layers herein can be employed to provide any useful stack, film, or device. For instance, etch selectivity can be critical for patterning new generation NAND and dynamic random access memory (DRAM) devices, and the present disclosure encompasses use of Mo-containing layers to form such devices. Yet other devices can include those for VNAND or vertically integrated memory (VIM) applications, as well as magnetic random access memory (MRAM) and phase change random access memory (PCRAM) applications.

The material layer can have any useful thickness. In some embodiments, the material layer can include a single type of material or two of more different types of material. In particular embodiments, the material layer can include alternating sublayers. The material layer or material sublayer can have any useful thickness, such as from 10 Å to 2000 Å for each layer or sublayer or for the total thickness of all layers/sublayers.

In various embodiments, the material layer is between about 50-500 nm thick for 3D NAND applications. The critical dimension of features to be etched in the material layer depends on the application. In some embodiments, the features have a critical dimension between about 50-120 nm for 3D NAND applications. In some embodiments, the features have a critical dimension between about 16-22 nm for DRAM applications. In other embodiments, the features include constrictions, pillars, trenches, voids, and the like, which can optionally be filled at a later time (e.g., such as to provide a word line).

The substrate can include any useful material. In various embodiments, the substrate has a dielectric layer comprising an oxide surface thereon. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of layers include dielectric layers and conducting layers, e.g., silicon oxides, silicon nitrides, silicon carbides, metal oxides, metal nitrides, metal carbides, and metal layers.

In various embodiments, the substrate is patterned. A patterned substrate may have "features" such as pillars, poles, trenches, via or contact holes, which may be characterized by one or more of narrow or re-entrant openings, constrictions within the feature, and high aspect ratios. The feature(s) may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, at least about 25:1, or higher. One example of a feature is a hole or via in a semiconductor substrate or a layer on the substrate.

In some embodiments, a feature may be formed on one or more of the top most layers of a substrate such that the bottom of the feature is an exposed underlayer. One example of a feature is a pillar or pole in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

Apparatuses

The methods and layers herein can be formed, deposited, and processes by using an apparatus. In one instance, the apparatus for providing a Mo-containing layer includes a processing chamber including a substrate holder; a process gas source connected with the processing chamber and associated flow control hardware; and a substrate handling hardware connected with the process chamber.

The processing chamber and substrate holder can be configured for any useful deposition process. Such deposition processes can include ALD, CVD, and plasma-enhanced forms thereof. Optionally, the processing chamber can be an ICP chamber or a CCP chamber. The substrate holder can be, e.g., an electrostatic chuck (ESC) having at least one clamping electrode for retaining the substrate below a showerhead assembly within a processing chamber. The ESC can be configured for use as a cathode. The substrate holder can optionally be heated.

Furthermore, the process gas source can be configured to provide any precursor herein as a gas, such as a Mo-containing precursor, a C-containing precursor, a Si-containing precursor, a B-containing precursor, or a combination thereof. The gas source can optionally be connected with the processing chamber by wah of a showerhead assembly.

The apparatus can further include a plasma source, which can be connected to the processing chamber and/or associated flow control hardware. The plasma source can be configured to supply a plasma to the processing chamber. The plasma can optionally be a remote plasma source coupled to the processing chamber or a showerhead assembly by way of a matching network.

In particular embodiments, the apparatus further includes a controller having a processor and a memory, wherein the processer and the memory are communicatively connected with one another, the processor is at least operatively connected with the flow-control and substrate handling hardware, and the memory stores computer-executable instructions for conducting the operations recited in any methods described herein. For instance, the controller can be configured to control the flow control hardware and the plasma source, in which the control provides instructions to: cause exposure of a substrate to a Mo-containing precursor and one or more deposition precursors within the processing chamber, thereby exposing the substrate to the precursors; supplying a plasma to the processing chamber; and cause deposition of a Mo-containing layer on a top surface portion of the substrate.

Figure 4:
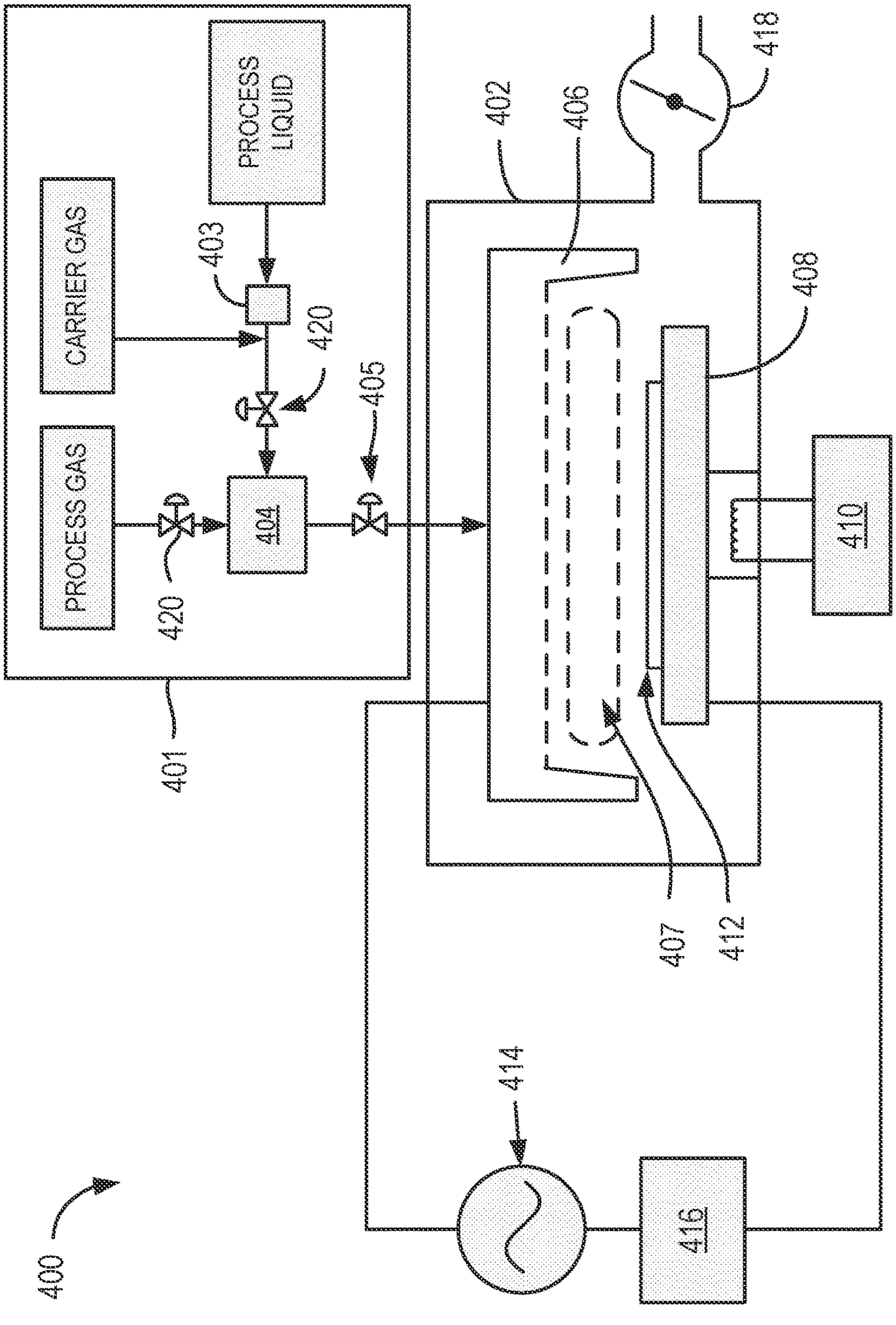
FIG. 4 is a schematic diagram of an example process chamber for performing certain disclosed embodiments.

FIG. 4 schematically shows an embodiment of a process station 400 that may be used to deposit material using ALD and/or CVD, either of which may be plasma enhanced. For simplicity, the process station 400 is depicted as a standalone process station having a process chamber body 402 for maintaining a low-pressure environment. However, it will be appreciated that a plurality of process stations 400 may be included in a common process tool environment. Further, it will be appreciated that, in some embodiments, one or more hardware parameters of process station 400, including those discussed in detail below, may be adjusted programmatically by one or more computer controllers.

Process station 400 fluidly communicates with reactant delivery system 401 for delivering process gases to a distribution showerhead 406. Reactant delivery system 401 includes a mixing vessel 404 for blending and/or conditioning process gases for delivery to showerhead 406. One or more mixing vessel inlet valves 420 may control introduction of process gases to mixing vessel 404. Similarly, a showerhead inlet valve 405 may control introduction of process gasses to the showerhead 406.

Some reactants, like BTBAS, may be stored in liquid form prior to vaporization at and subsequent delivery to the process station. For example, the embodiment of FIG. 4 includes a vaporization point 403 for vaporizing liquid reactant to be supplied to mixing vessel 404. In some embodiments, vaporization point 403 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller upstream of vaporization point 403 may be provided for controlling a mass flow of liquid for vaporization and delivery to process station 400. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 406 distributes process gases toward substrate 412. In the embodiment shown in FIG. 4, substrate 412 is located beneath showerhead 406, and is shown resting on a pedestal 408. It will be appreciated that showerhead 406 may have any suitable shape, and may have any suitable number and arrangement of ports for distributing processes gases to substrate 412.

In some embodiments, a microvolume 407 is located beneath showerhead 406. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, a substrate holder (e.g., a pedestal 408) may be raised or lowered to expose substrate 412 to microvolume 407 and/or to vary a volume of microvolume 407. For example, in a substrate transfer phase, pedestal 408 may be lowered to allow substrate 412 to be loaded onto pedestal 408. During a deposition process phase, pedestal 408 may be raised to position substrate 412 within microvolume 407. In some embodiments, microvolume 407 may completely enclose substrate 412 as well as a portion of pedestal 408 to create a region of high flow impedance during a deposition process.

Optionally, pedestal 408 may be lowered and/or raised during portions the deposition process to modulate process pressure, reactant concentration, etc., within microvolume 407. In one scenario where process chamber body 402 remains at a base pressure during the deposition process, lowering pedestal 408 may allow microvolume 407 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 408 may allow a plasma density to be varied during plasma activation and/or treatment cycles included in the deposition process. At the conclusion of the deposition process phase, pedestal 408 may be lowered during another substrate transfer phase to allow removal of substrate 412 from pedestal 408.

While the example microvolume variations described herein refer to a height-adjustable pedestal, it will be appreciated that, in some embodiments, a position of showerhead 406 may be adjusted relative to pedestal 408 to vary a volume of microvolume 407. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers.

Returning to the embodiment shown in FIG. 4, showerhead 406 and pedestal 408 electrically communicate with RF power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 50 kHz and 1000 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20-80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 408 may be temperature controlled via heater 410. Further, in some embodiments, pressure control for deposition process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to process station 400.

Figure 5:
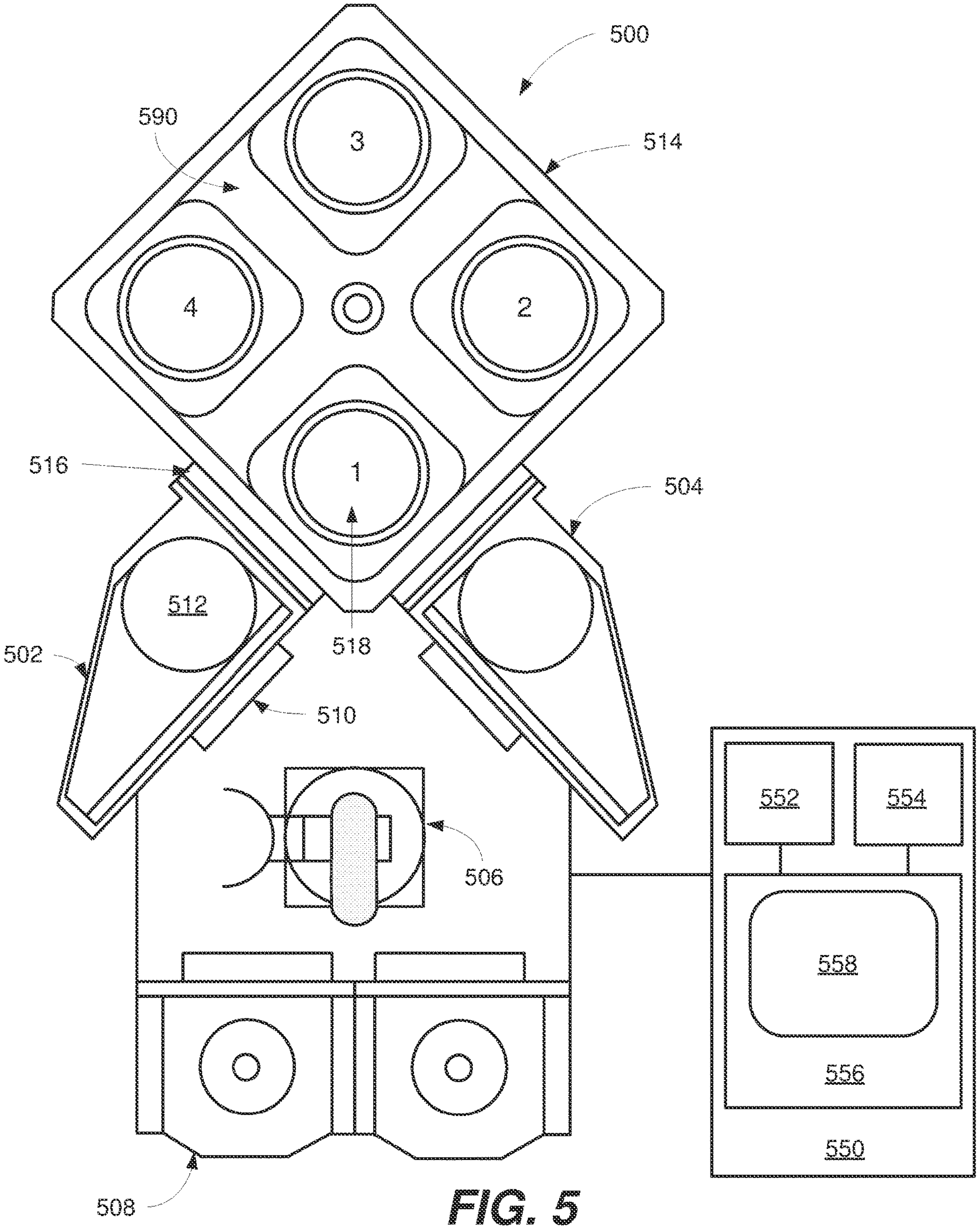
FIG. 5 is a schematic diagram of an example process apparatus for performing certain disclosed embodiments.

FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. While the depicted processing chamber 514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. System control software 558 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 500. System control software 558 may be configured in any suitable way. For example, various process tool component subroutines or control objects may be written to control operation of the process tool components necessary to carry out various process tool processes in accordance with the disclosed methods. System control software 558 may be coded in any suitable computer readable programming language.

In some embodiments, system control software 558 may include input/output control (IOC) sequencing instructions for controlling the various parameters described above. For example, each phase of a plasma-enhanced process (e.g., a plasma-enhanced atomic layer deposition (PEALD) process) may include one or more instructions for execution by system controller 550. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 6:
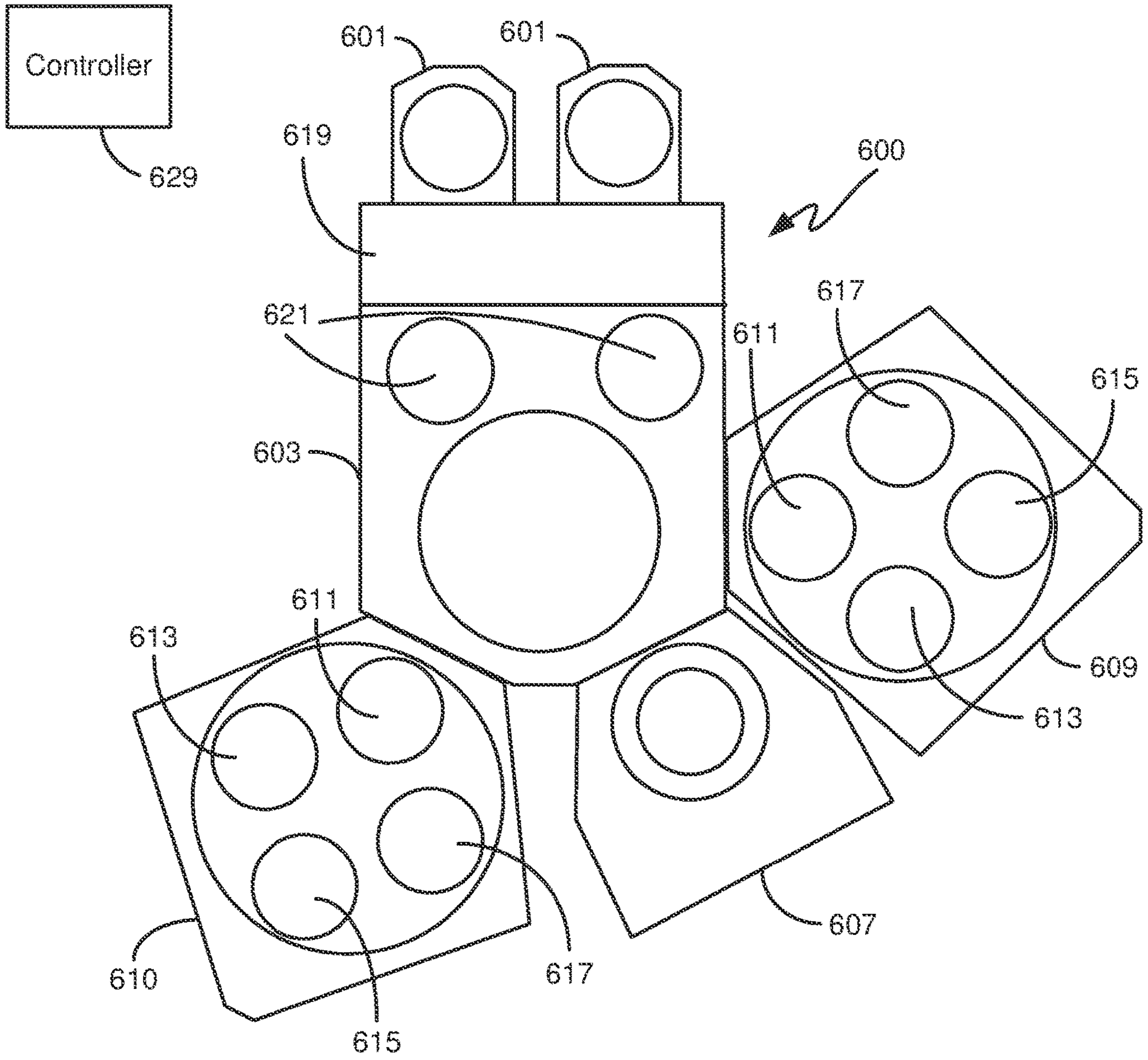
FIG. 6 is a block diagram of a processing system suitable for conducting thin film deposition processes in accordance with certain embodiments.

FIG. 6 is a block diagram of a processing system suitable for conducting thin film deposition processes in accordance with certain embodiments. The system 600 includes a transfer module 603. The transfer module 603 provides a clean, pressurized environment to minimize risk of contamination of substrates being processed as they are moved between various reactor modules. Mounted on the transfer module 603 are two multi-station reactors 609 and 610, each capable of performing atomic layer deposition (ALD) and/or chemical vapor deposition (CVD) according to certain embodiments. Reactors 609 and 610 may include multiple stations 611, 613, 615, and 617 that may sequentially or non-sequentially perform operations in accordance with disclosed embodiments. The stations may include a heated pedestal or substrate support, one or more gas inlets or showerhead or dispersion plate.

Also mounted on the transfer module 603 may be one or more single or multi-station modules 607 capable of performing plasma or chemical (non-plasma) pre-cleans, or any other processes described in relation to the disclosed methods. The module 607 may in some cases be used for various treatments to, for example, prepare a substrate for a deposition process. The module 607 may also be designed/configured to perform various other processes such as etching or polishing. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a central processing unit (CPU) or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the Mo-containing precursor flow, deposition precursor(s) flow, reactant gas flow, reducing agent flow, carrier gas flow, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for providing a molybdenum-containing layer, the method comprising:

providing a substrate on a substrate holder in a processing chamber;

exposing a top surface portion of the substrate to a molybdenum-containing precursor and one or more optional deposition precursors; and depositing a molybdenum-containing layer on the top surface portion of the substrate in a presence or an absence of a plasma within the processing chamber, wherein the molybdenum-containing layer comprises less than about 2 atomic % fluorine.

2. The method of claim 1, wherein the metal containing molybdenum-containing layer is doped or undoped.

3. The method of claim 1, wherein the processing chamber comprises a plasma-enhanced chemical vapor deposition (PECVD) chamber.

4. The method of claim 1, wherein said exposing comprises delivering the molybdenum-containing precursor and the one or more optional deposition precursors either sequentially or simultaneously.

5. The method of claim 1, wherein said exposing further comprises delivering a reactant gas, a reducing agent, or a carrier gas to the processing chamber.

6. The method of claim 5, wherein the reducing agent comprises water, alcohol, $H_2S$, a hydrocarbon, a thiol, or a combination thereof.

7. The method of claim 1, further comprising, before said depositing:

providing an interfacial layer on the top surface portion of the substrate, thereby disposing the interfacial layer between the substrate and the metal containing molybdenum-containing layer after said depositing.

8. The method of claim 7, wherein the interfacial layer comprises an adhesion layer, an initiation layer, or a growth layer.

9. The method of claim 7, wherein the interfacial layer comprises boron (B), carbon (C), titanium (Ti), tungsten (W), tantalum (Ta), nickel (Ni), molybdenum (Mo), a nitride thereof, a silicide thereof, an oxynitride thereof, a carbide thereof, or a carbonitride thereof.

10. The method of claim 1, further comprising, before said depositing:

pretreating the top surface portion of the substrate, thereby providing a pretreated surface being disposed between the substrate and the molybdenum-containing layer after said depositing.

11. An apparatus for processing a substrate, the apparatus comprising:

a processing chamber comprising a substrate holder;

a process gas source connected with the processing chamber and associated flow-control hardware;

substrate handling hardware connected with the process chamber; and a controller having a processor and a memory, wherein the processor and the memory are communicatively connected with one another, the processor is at least operatively connected with the flow-control hardware and substrate handling hardware, and the memory stores computer-executable instructions for conducting the operations recited in the method of claim 1.

12. The apparatus of claim 11, wherein the computer-executable instructions comprises instructions configured to:

cause exposure of a top surface portion of a substrate to a molybdenum-containing precursor and one or more deposition precursors within the processing chamber; and cause deposition of a molybdenum-containing layer on the top surface portion of the substrate.

13. The apparatus of claim 11, further comprising:

a plasma source connected with the processing chamber.

14. The apparatus of claim 13, wherein the computer-executable instructions comprises instructions configured to:

cause exposure of a top surface portion of a substrate to a molybdenum-containing precursor and one or more deposition precursors within the processing chamber;

cause supply of a plasma to the processing chamber; and cause deposition of a molybdenum-containing layer on the top surface portion of the substrate.

15. A method for processing a substrate, the method comprising:

providing a substrate having a material layer disposed on a top surface portion of the substrate;

depositing a molybdenum-containing layer on a top surface portion of the material layer, wherein said depositing comprises delivering a molybdenum-containing precursor and one or more optional deposition precursors, and wherein the molybdenum-containing layer comprises less than about 2 atomic % fluorine;

forming a patterned mask over the molybdenum-containing layer;

transferring a pattern of the patterned mask to the molybdenum-containing layer, thereby forming a defined pattern within the molybdenum-containing layer; and transferring the defined pattern to the material layer.

16. The method of claim 15, wherein each optional deposition precursor of the one or more optional deposition precursors is selected from the group consisting of a carbon-containing precursor, a silicon-containing precursor, and a boron-containing precursor.

17. The method of claim 16, wherein the carbon-containing precursor comprises at least one of a hydrocarbon, methane ($CH_4$), acetylene ($C_2H_2$), ethylene ($C_2H_4$), propylene ($C_3H_6$), propyne ($C_3H_4$), allene ($C_3H_4$), cyclopropene ($C_3H_4$), butane ($C_4H_{10}$), cyclohexane ($C_6H_{12}$), benzene ($C_6H_6$), or toluene ($C_7H_8$).

18. The method of claim 16, wherein the silicon-containing precursor comprises a silane compound, an organosilane compound, an alkyl silane compound, an alkoxy silane compound, a silanol compound, a siloxane compound, an aminosilane compound, a cyclic azasilane compound, a halosilane compound, or an inorganic silane compound.

19. The method of claim 16, wherein the boron-containing precursor comprises an organoborane compound, a boron halide compound, a borate compound, or an inorganic boron compound.

20. The method of claim 15, wherein the molybdenum-containing precursor comprises an organomolybdenum compound, a molybdenum halide compound, a molybdenum oxyhalide compound, an inorganic molybdenum compound, or a compound comprising a structure having one of formulas (I)-(V):

$$MoL_n \quad (I),$$

wherein each L is independently hydrogen (H), halo, oxide (=O), imido (=$NR^1$), carbonyl (CO), amine ($NR^1R^2$), an organic ligand, a monodentate ligand, or a bidentate ligand;

n is selected from 2-6; and $R^1$ and $R^2$ are each independently aliphatic, haloaliphatic, haloheteroaliphatic, heteroaliphatic, aromatic, aliphatic-aromatic, or heteroaliphatic-aromatic;

$$Mo(X)_m(L)_n \quad (II),$$

wherein each X is independently a halo, oxide (=O), imido (=$NR^1$), or carbonyl (CO);

each L is an organic ligand;

$R^1$ is aliphatic, haloaliphatic, haloheteroaliphatic, heteroaliphatic, aromatic, aliphatic-aromatic, or heteroaliphatic-aromatic;

m is selected from 0-6; and n is selected from 0-6, wherein at least one of m and n is not zero;

$$Mo_2L_n \quad (III),$$

wherein each L is a bidentate ligand; and n is selected from 2-5;

$$Mo(L1)_m(L2)_n(X)_p \quad (IV),$$

wherein each L1 is, independently, a bidentate ligand;

each L2 is independently a neutral ligand;

each X is independently an anionic ligand;

m is selected from 1-3;
n is selected from 0-4; and
p is selected from 0-4; or $$Mo(X)_m(L)_n \quad (V),$$

wherein each X is independently a halo;
each L is an organic ligand;
m is selected from 1-6; and
n is selected from 1-4;
or a salt thereof.

* * * * *